United States Patent [19]
Zuta et al.

[11] Patent Number: 6,016,080
[45] Date of Patent: Jan. 18, 2000

[54] COMPUTER BASED FAST PHASE DIFFERENCE MEASURING UNIT AND PLL USING SAME

[76] Inventors: Marc Zuta; Idan Zuta, both of 19 Ben Yehuda Street, Petah Tikva, Israel, 49373

[21] Appl. No.: 09/313,175

[22] Filed: May 18, 1999

Related U.S. Application Data

[63] Continuation-in-part of application No. 09/201,165, Nov. 30, 1998, which is a continuation of application No. PCT/IL98/00152, Mar. 30, 1998.

[30] Foreign Application Priority Data

Mar. 30, 1997 [IL] Israel ......................................... 120552

[51] Int. Cl.$^7$ ............................ G01R 25/00; H03L 7/085
[52] U.S. Cl. ............................. 331/25; 327/7; 324/76.82; 702/72
[58] Field of Search ................................. 331/25; 327/3, 327/7; 324/76.77, 76.82; 702/72

[56] References Cited

U.S. PATENT DOCUMENTS 5,343,404  8/1994  Girgis ........................................ 702/72
5,574,408  11/1996  Zwack ...................................... 331/176

*Primary Examiner*—Siegfried H. Grimm

[57] ABSTRACT

A system for measuring a phase difference between two input signals, including a computer performing computations in the complex domain and operating on two complex signals indicative of the two input signals respectively to compute the phase difference. Alternately, the system for measuring the phase difference includes a computer operating on two input buses indicative of the two input signals respectively to generate a signal indicative of the phase difference, and wherein: A. each input bus includes at least two digital bits; B. the two input buses are indicative of the phase of each of the two input signals; C. the two input buses each has a different range of possible values and wherein the computer further includes a device for normalizing at least one of the buses so as to bring the two buses to the same range. A phase-lock loop includes the system for measuring the phase difference, a VCO and digital devices.

20 Claims, 26 Drawing Sheets

Prior Art

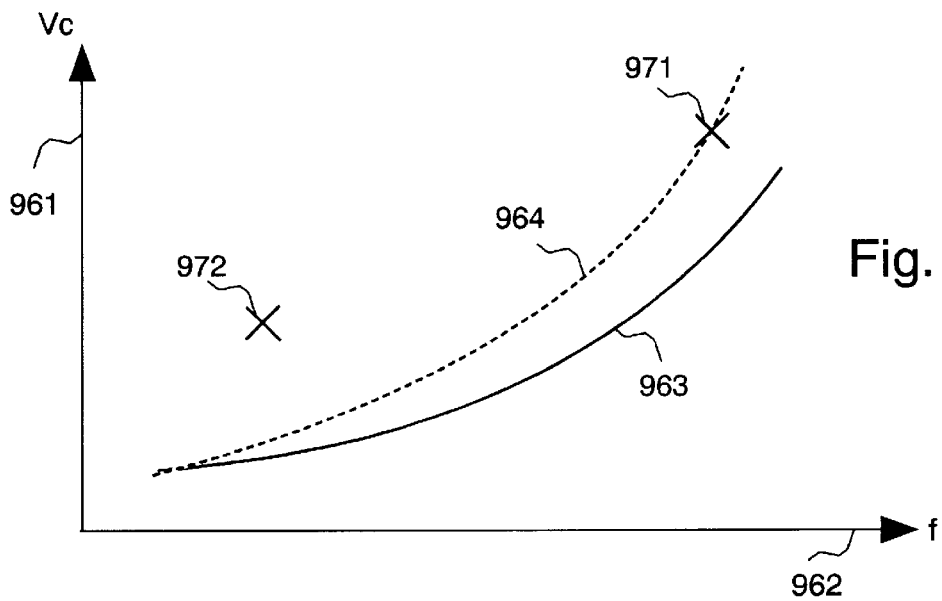
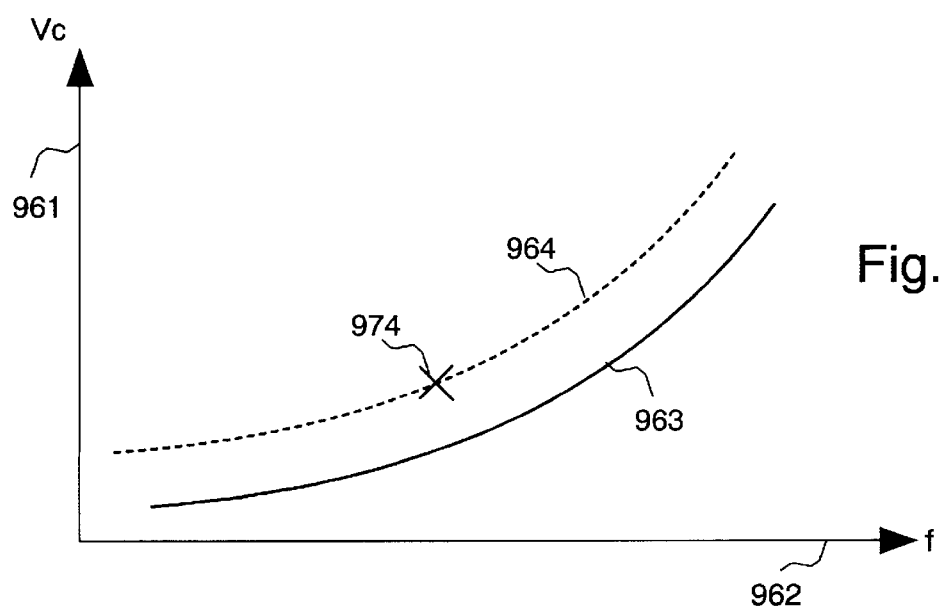

COMPUTER BASED FAST PHASE DIFFERENCE MEASURING UNIT AND PLL USING SAME

The present application is a continuation in part from U.S. patent application Ser. No. 09/201,165 filed on Nov. 30, 1998. The application Ser. No. 09/201,165 is a continuation from PCT application No. PCT/IL98/00152 filed on Mar. 30, 1998. The PCT application is based on Israel patent application No. 120552 filed on Mar. 30, 1997, with the PCT application being filed within one year from the Israeli application and claiming the filing date of that application. All the above applications have been filed by the inventor, Marc Zuta.

FIELD OF THE INVENTION

The present invention relates to a phase-lock loop PLL using a fast phase difference measuring unit and its uses in frequency synthesizers and other communication system functions.

BACKGROUND OF THE INVENTION

PLLs are now widely used in communication systems, for example in the local oscillator LO for transmit and receive, signal detection in modems and receivers that use the PLL capability to track weak signals in noise, carrier recovery in signals with suppressed carrier modulation, and frequency modulators in RF transmitters.

1. The frequency synthesizer generates the high frequency signal at a controlled frequency, that is used in wireless communications and a wide variety of other applications. One widely used implementation of the synthesizer is the Phase-Lock Loop (PLL) system.

Another type of synthesizer implements a frequency loop using counters pair/computer system, uses a pair of counters to concurrently count a reference signal and the oscillator (VCO) signal, to compute the frequency deviation and correct it in a closed loop.

Of paramount importance in wireless is the effective use of the frequency spectrum. It is difficult to accommodate the growing number of users of wireless, while the frequency spectrum remains fixed and limited. An effective answer would be to better utilize the available spectrum, by transmitting more information (at higher bits/second rates) in the available spectrum (per each Hertz of bandwidth).

Frequency synthesizers are used as the LO, both for transmission and reception, and influence the achievable rate of communication (bits/second). The lower the phase noise of the synthesizer, the lower is the Bit Error Rate (BER) of the communication channel.

When there are errors in a communication, this requires the retransmission of messages and more overhead, resulting in an effective communication rate that is slower than the rated speed of a channel.

Thus, the phase noise limits the actual, effective communication speed. A low phase noise is required of a synthesizer for wireless communications.

The BER can also be reduced by increasing the signal to noise ratio, that is by transmitting at a higher power. This has other disadvantages, like shorter battery lifetime and possible damage to user from radio frequency radiation. Moreover, the cost for the transmitter is higher. Accordingly, for a given transmission rate and BER, by lowering the phase noise of the synthesizer it is possible to use a lower transmitted power, thus the battery lasts longer and the possible damage from radiation is reduced.

PLL devices have a finite, distinctive phase noise which influences the wireless system performance. Counter pair/computer devices have higher phase noise, because of the quantization error and other effects.

Frequency settling time is another important parameter in frequency synthesizers. Spread spectrum by frequency hopping is a proven method for effective spectrum utilization. The method requires that the synthesizer change the output frequency at predefined times. It takes time for the synthesizer to switch to a new frequency, with the time lost in the process limiting the performance of the communication channel.

Counter pair/computer devices have fast settling times, but their use in communication systems is limited because of phase noise and other limitations.

PLL devices have a long settling time. These devices are usually described as linear, closed loop systems. But the linear model holds only for the PLL in locked state. Prior to lock-on (during the transition to a new frequency for example) the device is nonlinear, with a complex process that presents difficulties in predicting its settling time.

Long-term frequency precision is another important requirement of frequency synthesizers. PLL devices have a definite advantage, since the oscillator phase is locked to the reference, and thus the output frequency is a precise multiple or submultiple of that reference. Counter pair/computer devices usually have a limited frequency precision, because of the truncation error and other limitations.

In a previous disclosure, as detailed in Israeli Patent No. 096351 and U.S. Pat. No. 5,182,528, the present applicant described a digital frequency synthesizer using a smart, computer-controlled closed loop to generate a precisely controlled frequency. The closed loop comprises the oscillator, the digital frequency measurement means, and a computer which is connected back to the oscillator.

This prior art synthesizer has a fast frequency switching, but requires a complex computation to find the frequency ratio, since the accumulated count may achieve large values. The ratio computation may take time to perform. Moreover, there are no provisions to achieve low phase noise, an important consideration in communication systems. There are no provisions to achieve phase coherency between the reference signal and the oscillator signal, another desired property in precise signal generators.

In a previous disclosure, as detailed in Israeli patent application No. 120552, the present applicant disclosed a PLL using a fast phase measurement unit which uses several bits of the reference and VCO counters.

A description of a frequency synthesizer using digital bus correction/normalization was published by the present inventor in the June 1998 issue of the "Microwave Journal" magazine, pp. 94–108, titled "A New PLL with Fast Settling Time and Low Phase Noise".

Subsequent research and design, together with a new approach to PLLs, resulted in a PLL with improved structure and method of operation with better performance, which are detailed in the present disclosure. Moreover, it was found that a phase-lock loop PLL using a fast phase difference measuring unit can be advantageously used to improve various communication system functions, as detailed below.

2. PLLs are now used for signal detection in modems and receivers. The PLL has very good performance in tracking weak signals in noise, relative to other detectors. At present, however, the PLL uses a slow phase detector, that takes at least one cycle of the input signal to measure the phase difference. Usually the low pass filter LPF in the loop is set to a slower time constant, so that the loop can only respond to phase errors that develop during several cycles of the input signal.

In practical applications, however, the PLL is required to respond faster. Fast phase changes occur because of multipath, Doppler and other factors. If the PLL cannot respond fast enough, then it may break lock-on, that is the communication is stopped for some time, until the PLL locks again. Cycle slipping or loss of lock result in errors in the communication. Where the transmitted signals have a fast modulation, that may preclude altogether the use of a PLL in the receiver, if a PLL cannot track these fast changing signals. PLLs can detect a signal in noise and their use is highly desirable in receivers or modems, provided their dynamic performance (ability to track a fast changing carrier) is satisfactory.

Thus, the slow response time limitations of prior art PLLs prevent their use in advanced communication applications.

3. Carrier recovery is now a problem in signals with suppressed carrier modulation. These signals are now widely used since, by eliminating the carrier signal, all the transmitted power is dedicated to the actual information. Thus, communication links achieve improved performance. Examples of this modulation are the biphase phase shift keying BPSK and the quadriphase phase shift keying QPSK.

The problem with carrier recovery is that a regular PLL cannot be used, since there is no carrier to lock on. The precise center frequency is required to demodulate the received signal. The center frequency is the frequency of the carrier that was phase modulated to begin with. Since there may be fluctuations in frequency or phase of the received signal because of propagation effects, it is necessary to track the center frequency in the receiver.

For BPSK, a squaring loop or a Costas loop may be used. Both systems perform in effect a squaring of the signal, to achieve a signal with the phase modulation removed. A PLL can then lock on that signal. More complex circuits are required for multiphase modulation.

The Costas loop is a modified PLL, and has the disadvantages of PLLs as detailed above. The squaring loop also uses a PLL to lock on to the carrier. A squaring loop has various disadvantages, for example there is the problem of implementing a precise square law transfer function that would not be affected by voltage, temperature etc. Moreover, a squaring loop performs a nonlinear processing of the signal together with interfering signals and noise, to generate new harmonics. These new harmonics may interfere with the operation of the PLL used for carrier recovery.

4. Clock recovery (or clock synchronization) is now a problem in digital signals transmission. The baseband signal contains both the data and the clock, and it is required to separate them to reconstruct the digital transmitted information. A modified PLL may be used for clock recovery, however PLLs at present have a limited performance that limits the performance of the clock recovery circuit.

5. Frequency modulation FM in RF transmitters. Various standards define a FM system, for example GSM or DECT. FM is simple to implement if a low performance is sufficient. In that case, a voltage controlled oscillator VCO can be simply modulated with the information to send. With the presently crowded spectrum, however, a higher performance is required.

Thus, an unstabilized VCO has drift problems, so that the signal from that VCO may not reach its corresponding receiver, but it may interfere with another channel. If a closed loop PLL is used, then it is difficult to modulate the frequency of the VCO, since the loop opposes these changes.

At present, one implementation uses a PLL that is alternately closed loop (to stabilize the VCO) and open loop (to enable frequency modulation of the VCO). This may achieve a low performance in both accounts: good VCO stabilization cannot be achieved since the loop is not closed all the time, and the phase of the VCO changes unexpectedly (because of FM and drift) between the lock-on time intervals. At the same time, modulation is only possible part of the time, so that part of the time the link is not usable for information transfer.

It is an objective of the present invention to provide for a PLL with improved performance, that can be used to address some of the problems in frequency synthesizers and other communication system functions.

SUMMARY OF THE INVENTION

According to the present invention, there is provided a PLL using a fast phase difference measuring unit, that can be advantageously used in frequency synthesizers and other communication system functions.

The invention is described at three levels: (1) a novel phase difference measuring unit capable of precise and fast phase measurement; (2) a phase-locked loop PLL using the novel phase error measuring unit and other novel means; and (3) a communication system using the novel PLL and additional features.

According to one aspect of the present invention, the PLL uses a novel phase measurement unit. Whereas existing PLLs use only the most significant bit MSB of the reference- and VCO counters, the new phase detector uses several bits of these counters. Signal processing means are required to normalize the output of the counters so as to allow a direct phase difference computation, based on the instantaneous values in the counters.

The novel PLL uses additional information which has always been available in the PLL, but which was not hitherto used, that is the additional bits of the counters.

According to a second aspect of the present invention, the phase detector achieves an infinite resolution, that is the control voltage to VCO has no quantization error, although each counter has a finite precision. This is achieved by using an asynchronous phase difference measuring unit together with two digital blocks each having its own independent clock, which is unrelated to the clock of the other block, with an asynchronous phase difference measuring unit. This novel structure achieves lower phase noise with a precise PLL.

According to a third aspect of the present invention, the PLL further includes overflow prevention means. Overflow results from the finite length of the counters. The novel PLL includes means to detect the occurrence of this counters overflow and means to correct or neutralize the possible error induced by it.

Yet another aspect of the novel phase error measuring unit is the structure of the phase measuring unit. In one embodiment several bits of each bus are used to compute the phase difference, whereas in another embodiment only one bit of each bus is used, that is a bit lower than the MSB. In the second case, that one bit is derived from several bits of a bus, thus the phase comparison still relates to several bits in each bus. Various embodiments may use digital buses or analog signals to compute the phase difference.

In another embodiment, the phase detector uses an adder to replace the counter and bus normalization means. A counter and multiplier add specific increment for each clock at the counter input. An adder can perform a similar function, by adding a constant with its present value to generate the next value, for each clock at its input.

In yet another embodiment, the phase detector uses computer means in the complex domain (Real, Imaginary) to compute the phase difference between two complex buses. A digital bus may generate in a counter or an analog to digital converter ADC. For example, one bus may generate in the local VCO with a counter, whereas the other bus may generate in a pair of ADCs connected to the I and Q components of an input signal. This structure achieves a fast PLL, with a faster rate of phase difference measurement and a higher cutoff frequency of the LPF. A higher performance PLL may be thus achieved for receiver or modem applications.

At the second or PLL level, one aspect of the invention relates to a PLL capable of hopping to another frequency without loss of phase lock. It is known in the art that a PLL which is phase-locked at one frequency will take a long time to lock to another frequency. When a PLL needs to switch to another frequency, the phase lock is broken, the PLL ceases to act as a linear system and a nonlinear process occurs where the PLL moves in a random and erratic way toward the new desired frequency.

After extensive research, and using an innovative point of view, a new PLL structure was devised to prevent this effect. A PLL that remains phase-locked during a frequency hop is achieved, which can move faster to a new frequency.

Another aspect of the PLL refers to a loop that is closed with zero phase error, that is there is no steady-state phase error between the reference and the VCO signals. This was not practical with existing PLLs since an integrator in the loop slows down the response of the PLL and this could not be tolerated in existing PLLs that were already too slow. The PLL in the present invention is much faster since it uses the novel phase detector that is much faster, this allowing the introduction of an integrator to achieve the zero phase error, while keeping the loop response time at tolerably fast levels.

This zero phase error in the steady state is essential for a coherent frequency hopping COFH system where, for each chosen output frequency, the output frequency is phase coherent with the reference.

The new PLL can achieve a lower phase noise with a lower cost VCO, since the faster PLL may be used with a low pass filter having a higher cutoff frequency Fc. As a result, the output signal has a phase noise defined by the crystal reference up to that higher cutoff frequency, even though the VCO may have higher noise at lower frequencies. The phase noise of the VCO at the lower frequencies will not influence the output phase noise.

A still faster frequency synthesizer uses several VCOs in a staggered operation, where each VCO has enough time to settle to a new frequency while the whole set operates at a much higher hopping rate.

A novel phase detector is disclosed, that operates on complex signals using computations in the complex domain. It can compute the instantaneous phase difference between two signals at rates higher than the frequency of those signals.

The new phase detector may be used in frequency synthesizers as well as in PLLs for tracking the input signal in a receiver or modem. Other uses include a precise FM modulator or demodulator.

The novel phase detector may be used in Costas loops for carrier recovery in suppressed carrier transmissions. The superior performance of the phase detector helps achieve a superior carrier recovery performance. Carrier tracking poses a serious challenge today, with fast phase changes that may cause lock loss in present PLLs.

The novel phase detector may also be used in clock recovery/synchronization in data transmission with a common channel for data and clock.

The novel phase detector may be use for pure frequency translation to generate the sum frequency (F1+F2) or the difference (F1−F2) of two input signals at F1, F2, without other harmonics (except at the computing rate and its harmonics, and the quantization error).

At the third or wireless system level, the new PLL allows to implement a coherent frequency hopping system.

Wireless systems in the art use either a PN/CDMA or a FH/CDMA scheme. PN/CDMA is coherent, but all channels use the same carrier frequency and only the different codes allow to distinguish between users. FH/CDMA uses a plurality of frequencies, but the code bits from these frequencies are added non-coherently since there is a random phase difference between these bits.

Thus, the new PLLs allow more degrees of freedom, that is both frequency hopping and phase coding, since it uses frequency hopping/coherent phase. This bi-dimensional coding may be used advantageously to decrease the interference between users so as to allow better wireless communications between a larger number of users.

A new structure of the cellular base station (cell site) is disclosed, that utilizes the information available to provide additional services to a customer. The additional services may include focused advertising and/or advice to user. That is, each user in that cell may receive advice or advertising information that are adapted to that user.

A base station with the new PLL can measure additional information for each mobile unit in that cell, with the additional information being used to improve the quality of the enhanced services being offered.

Further objects, advantages and other features of the present invention will become obvious to those skilled in the art upon reading the disclosure set forth hereinafter.

BRIEF DESCRIPTION OF THE DRAWINGS

FIGS. 3A–3C detail signals generated in the counters of the PLL, with

FIG. 3A illustrating signals in prior art PLL, FIG. 3B illustrating signals in new system, and FIG. 3C detailing the actual signals in prior art PLLs.

FIGS. 9A and 9B illustrate a dynamic correction of VCO characteristic in a table.

DESCRIPTION OF THE PREFERRED EMBODIMENTS

A preferred embodiment of the present invention will now be described by way of example and with reference to the accompanying drawings.

The invention is described at three levels: (1) a novel phase error measuring unit capable of precise and fast phase measurement; (2) a phase-locked loop PLL using the novel phase error measuring unit and other novel means to achieve, among others, a faster frequency switching and lower phase noise; and (3) a wireless communication system using the novel PLL and additional features to achieve superior performance.

1. A Novel Phase Error Measuring Unit

Figure 1:
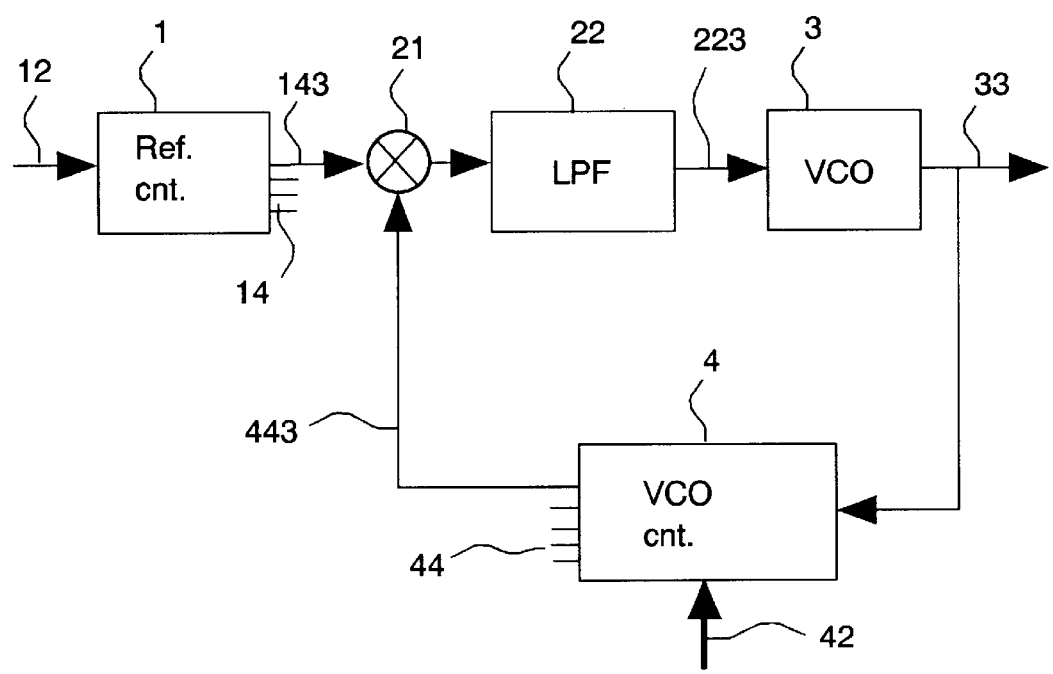
FIG. 1 describes a prior art PLL.

The various aspects of the present invention can be better explained with reference to the presently used PLL. FIG. 1 details a prior art Phase-Lock Loop (PLL) system. Reference counter 1 divides the frequency of the clock input 12, to generate the reference signal 143, at the reference frequency Fref. Usually, input 12 is derived from a crystal oscillator at a fixed frequency. Actually, counter 1 generates the reference counter output 14, a bus of several bits in parallel from MSB to LSB (Last Significant Bit). Of bus 14, only the Most Significant Bit (MSB) is used, and it is designated as signal 143. The rest of the bits of counter 1 are not used.

The operation of the PLL is such as to keep a fixed relationship between the frequency at the output of voltage controlled oscillator 3 (VCO) and the reference frequency Fref.

While the PLL is locked, or phase locked, then the output signal 33 is at frequency Fout, where Fout=V*Fref V is the modulo of counter 4. With the PLL locked, the output signal 33 has a frequency V*Fref. The frequency of signal 443, that is after division by V, is Fref again.

Thus, one-bit phase detector 21 compares the relative phase of two signals 143 and 443, at the same frequency. If a phase difference is detected, then control signal 223 to VCO 3 changes accordingly, so as to correct that error. This is a closed loop, operating so as to keep the frequency of signal 33 at V times the frequency Fref of signal 143.

The frequency of signal 33 can be easily changed by changing the modulo count V of counter 4. Thus, Fout is a multiple of the reference frequency Fref. The frequency Fref thus defines the difference between adjacent achievable values of Fout.

The prior art phase detector also includes the low pass filter 22, which transfers the desired phase error signal at a low frequency, and attenuates undesired signals at frequency Fref and harmonics thereof. The cutoff frequency Fc of the filter 22 has to be lower than Fref. These undesired signals are generated in phase detector 21 and should be prevented from reaching the VCO 3, lest they modulate the frequency of the VCO to include undesired harmonics.

Set frequency bus 42 defines the parameter V, that is the modulo of counting, and thus the frequency Fout. Of the VCO counter output 44 (a bus, several bits in parallel from MSB to LSB ), only the Most Significant Bit (MSB) is used, which is the signal 443. The rest of the bus, that is the lower bits of VCO counter 4 are not used.

One disadvantage of this prior art PLL is the slow settling time to a new frequency, resulting from the low cutoff frequency of low pass filter 22 (LPF), and the nonlinear lock-on process.

The PLL is linear only while locked. Prior to lock-on, a nonlinear process takes place, with the frequency of VCO 3 changing and the control voltage 223 changing in "beats" until lock is achieved. LPF 22 slows down the process, by limiting the rate of change of signal 223. Filter 22 is slow because of the low cutoff frequency. The cutoff frequency has to be lower than the reference frequency Fref.

Fref itself is derived from the required frequency increments at the output.

For example, assuming that the output frequency Fout is to change in 30 KHz increments, this sets Fref=30 KHz. The LPF 22 should have a lower cutoff frequency Fc, for example Fc=5 KHz. The performance of LPF 22 in the frequency domain defines its performance in the time domain. The expected risetime and fall time are about Tr=2/Fc=400 microsecond. The PLL frequency settling time is about several times Tr, thus in the millisecond range.

The phase noise is affected as well by the low Fc. Suppose there is an undesired deviation in the frequency of VCO 3. The closed loop is supposed to correct that, however an indication of that deviation will be arrived at only after a time delay. The best the loop can do is to correct the VCO after that, but in the meantime a large error occurs. Since the VCO frequency tends to deviate all the time in a random nonstationary fashion, there is a measure of phase noise in the PLL.

The abovementioned time delay results, inter alia, from the slow response of the same filter 22.

The fastest rate the phase measurement can be performed, as known in the art, is at the reference frequency Fref, that is one measurement per reference period Tref, with Tref=1/Fref This is still only 33 microseconds, in the present example. Additional sources of phase noise in prior art PLLs will be detailed below.

1.1 The fast phase error measurement unit

Figure 2:
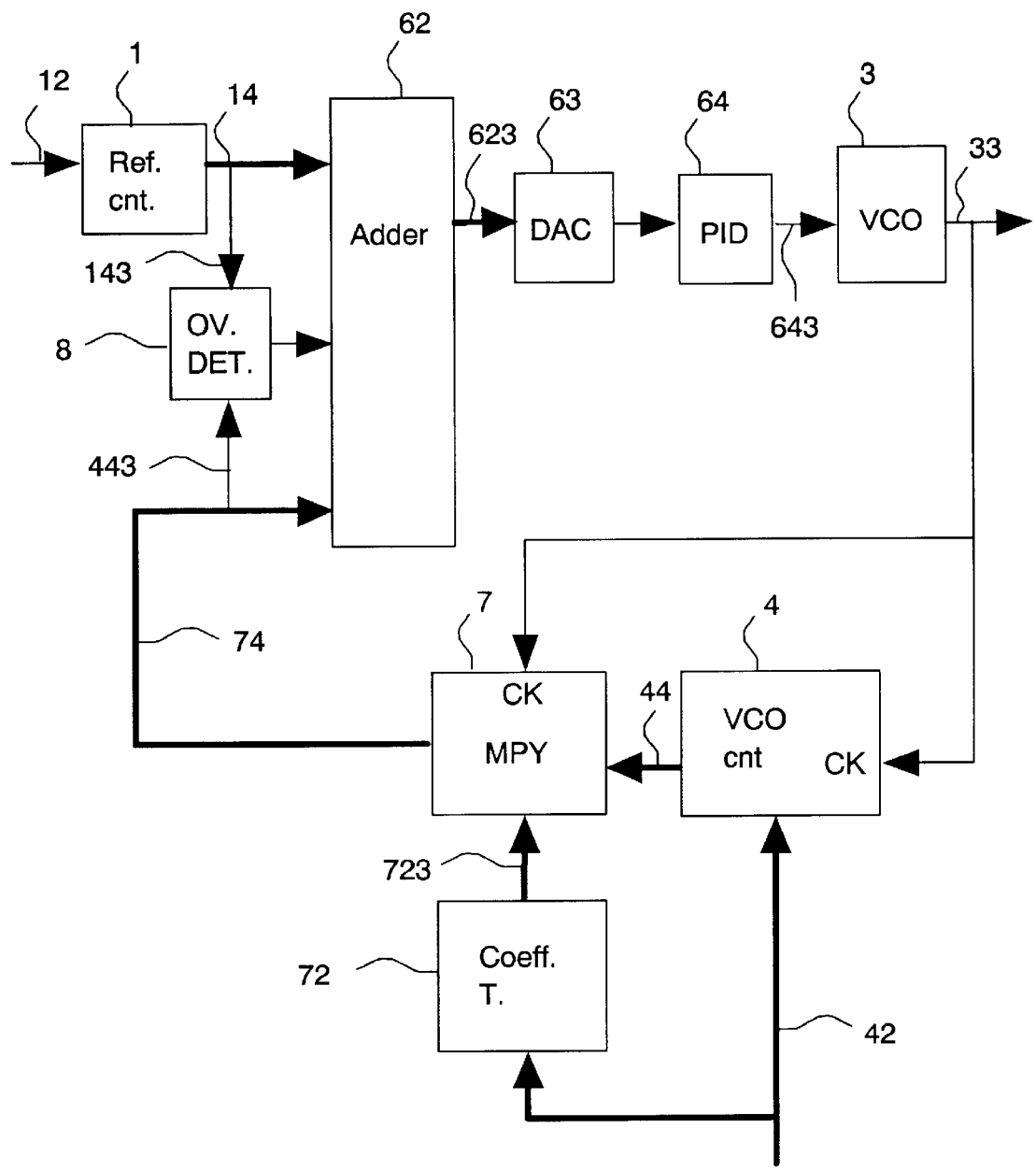
FIG. 2 describes the new PLL system structure, simplified

FIG. 2 illustrates a simplified embodiment of the new system. According to the present invention, a multi-bit phase detector replaces the prior art one-bit phase detector in the PLL. The multi-bit phase detector uses more of the available bus bits at the output of each of the counters 1 and 4. By using more of the available information instead of the MSB alone, a faster and more precise phase measurement is achieved.

The reference counter 1 divides the clock input 12 to generate the reference counter output bus 14. For example, if a 8 bit counter is used which counts to 256, then a full count of 256 corresponds to 360 degrees of phase of Tref, the reference period. Using the whole of bus 14, a phase resolution of 360/256=1.4063 degrees is achieved.

To close the phase locked loop PLL, the corresponding phase of the VCO counter 4 should be subtracted from the above reference phase, and the resulting phase error applied to the VCO 3, as in prior art PLLs. Here there is a problem, however. Whereas counter 1 counts to 256, counter 4 counts to a final value V derived from the desired output frequency Fout. Continuing the previous example, to generate a signal at Fout=15 MHz with a reference Fref=30 KHz, a value V=500 is required. Thus, counter 4 counts in phase increments of 360/500=0.72 degrees.

Since counters 1 and 4 count to different final values, with each bit corresponding to a different phase value, it is meaningless to subtract the values of the counters from each other. Moreover, the modulo V of counter 4 may be changed during the operation of the synthesizer, to set it to another frequency. Thus, the problem is further aggravated by the fact that a bit at bus 44 does not correspond to some specific phase.

To address this hitherto unsolved problem, the reading of counter 4 as available on bus 44 undergoes a digital correction or normalization.

For example, a digital multiplier 7 may be used. Assuming counter 1 is full binary, that is it counts to a power of 2 like $2^A$, then bus 44 is multiplied by a digital coefficient K applied through bus 723, such that bus 74=(bus 44)*K with $V*K=2^B$ that is, the modulo of counter 4 is corrected by multiplier 7 to also become full binary, or a power of 2.

Bus 723 is generated in this example using a coefficients table generating means 72 that accepts as input the bus 42 indicative of the desired frequency, and generates a suitable multiplication coefficient on bus 723. Table generating means 72 may be implemented as (not shown) a ROM or EPROM or other nonvolatile memory means or a device capable of computing the desired coefficient from the desired frequency, i.e. a microcomputer.

The powers of 2 of the two counters, A and B, may be equal. The powers of 2 of the two counters, A and B, need not be equal. If the adequate number of bits of the two buses 14 and 74 is taken, then the values therein approach the same final full binary value. In other words, a dissimilarity between buses 14 and 74 because of a power of 2 is easily corrected by taking only part of the bits of the two buses which correspond to the same values, thus performing a bits shift in hardware which corresponds to multiplication or division by a power of 2.

For each desired value of parameter V, a corresponding correction coefficient K is applied, to correct to a full binary value at bus 74.

Table 1 is an example of the values for correction coefficient K, for several consecutive values of V, that is from 500 to 511. The coefficients in the table are the computed values, truncated to 2 places after the decimal point. The parameter aa corresponds to the range of the result on bus 74, which is $2^{aa}$.

TABLE 1

| Coefficient for multiplication K, as a function of V | | | | | | |
|---|---|---|---|---|---|---|
| V | aa = 15 | aa = 16 | aa = 18 | aa = 20 | aa = 22 | aa = 24 |
| 500 | 65.53 | 131.07 | 524.28 | 2097.1 | 8388.6 | 33554.4 |
| 501 | 65.40 | 130.81 | 523.24 | 2092.9 | 8371.8 | 33487.4 |
| 502 | 65.27 | 130.54 | 522.19 | 2088.7 | 8355.1 | 33420.7 |
| 503 | 65.14 | 130.29 | 521.16 | 2084.6 | 8338.5 | 33354.3 |
| 504 | 65.01 | 130.03 | 520.12 | 2080.5 | 8322.0 | 33288.1 |
| 505 | 64.88 | 129.77 | 519.09 | 2076.3 | 8305.5 | 33222.2 |
| 506 | 64.75 | 129.51 | 518.07 | 2072.2 | 8289.1 | 33156.5 |
| ... | | | | | | |

Thus, for example, the correction coefficient for V=500 and range $2^{15}$ is K=65.53

This would result, for counter 4 value of 500, to a value at bus 74:

500*65.53=32,765

This corresponds (almost) to $2^{15}$=32,768 The error stems from the truncation in the value of the coefficient, which should be 63,536. Implementing only the integer part of the coefficient (K=65) requires 7 bits and achieves a still larger error. Using more bits can achieve a sufficiently precise correction of the bus.

Note: For a counter modulo 500, the final value of the counter is 499, as known in the art. We use the value 500, which is never actually issued at the counter's output, to indicate the theoretical value at the end of the reference period Tref. The sale holds for a full binary counter, like modulo 256, which counts to 255. This is to be understood to apply throughout the present disclosure.

To set the PLL to a desired output frequency Fout= Fref*V, the value V is applied to the VCO counter 4 through bus 42, so that counter 4 will count modulo V. Additionally, a normalization coefficient K is applied to multiplier 7 through bus 723, with the value of K corresponding to that of V for the desired frequency according to the formula K=M/V, where M is a constant. The loop will then close to correct any phase errors and to keep the VCO at the desired frequency after lock-on.

M may be equal to the modulo count of counter 1, so t hat the two buses 14 and 74, count to the same modulo M. Thus each bit of the two buses now have the same phase value, and it is now possible to directly subtract the two buses to directly compute the instantaneous phase difference in the phase lock loop.

A method for controlling a VCO to implement a PLL according to the present invention comprises the steps of:

A. concurrently counting cycles of a fixed frequency clock signal and a Voltage Controlled Oscillator (VCO), to generate a reference bus and a VCO bus respectively. Each of the two buses usually has a different counting range.

B. normalizing one of the buses using digital signal processing, to bring the two buses to the same counting range (modulo count). One normalization method may include multiplication by a digital coefficient which is proportional to the modulo count of the other bus and to the reciprocal of the modulo count of that bus.

C. computing a phase error by subtracting the value of the VCO bus from that of the reference bus, wherein one of the buses has been normalized according to step (B).

D. (optional) performing a low pass filter or an integrator operation on the phase error signal generated in step (C), if there is a ripple or noise associated with that signal which requires such a filtering.

E. generating a correction signal proportional to the phase error found in step (D), and applying the correction signal to the control input of the VCO, to close the phase lock loop.

It is possible to normalize either the reference bus or the VCO bus. It is also possible to normalize both of the above buses.

Referring again to the operation of the phase detector in the PLL, the phase difference can now be computed in subtractor 62, since buses 14 and 74 both have the same final value, thus each bit represents the same phase increment.

A precise computation of the phase difference is achieved. A plurality of phase readings can be performed during the reference period Tref. This may achieve a faster PLL with lower error or noise.

To illustrate, Table 3 details the progression of the counters 1 and 4, the accumulated phase indicated on bus 14 and 74, and the phase difference at the phase difference bus 623, all during one time period Tref. Only the start and the end of the period Tref are illustrated.

TABLE 3

Progression of PLL counters, phase and phase error

| bus 14 | bus 44 | phase 14 | phase 44 | ph.diff 623 | average diff. |
|---|---|---|---|---|---|
| 0 | 1 | 0.0 | 0.7 | 0.720 | 0.180 |
| 1 | 2 | 1.4 | 1.4 | 0.034 | 0.188 |
| 1 | 3 | 1.4 | 2.1 | 0.754 | 0.377 |
| 2 | 4 | 2.8 | 2.8 | 0.068 | 0.394 |
| 2 | 5 | 2.8 | 3.6 | 0.788 | 0.411 |
| ... | | ... | | | ... |
| ... | | ... | | | ... |
| 255 | 498 | 358.5 | 358.5 | −0.034 | 0.481 |
| 255 | 499 | 358.5 | 359.2 | 0.686 | 0.669 |
| 256 | 500 | 360.0 | 360.0 | 0.000 | 0.506 |

Thus, bus 4 advances from 0 to the value 256 (which equals 0, the start of a new period Tref). During the same time period, bus 44 advances from 0 to 500, which is the modulo count for counter 4. The phase represented on bus 44 (and also on bus 74) increments by 360/256 degrees. The phase on bus 44 increments by 360/500 degrees. The phase on both busses increases from 0 to 360 degrees, as expected.

The phase difference is obtained in digital form at bus 623. For better performance an infinite resolution of the phase error can be achieved using two separately clocked blocks and an asynchronous phase detector 62, as detailed below. In this embodiment, the phase difference in bus 623 is represented not only by the digital words on bus 623. Rather, the phase difference is represented by the digital words together with the exact timing of the change from one bus value to the next value.

A digital to analog converter DAC 63 converts the phase difference to an analog signal that represents the phase error in the loop. The low pass filter 64 is used to attenuate the quantization error in the signal. Filter 64 has different properties than those in prior art PLLs, as detailed below.

The phase error signal is then applied to the voltage controlled oscillator 3 (VCO), like in prior art PLLs, to close the phase control loop. The VCO generates the output signal 33, which is divided in counter 4 to generate the (digital) reference signal.

The filter 64 in the present invention differs from the prior art filter 22 in several issues. For one, the cutoff frequency Fc of filter 64 is much higher. Assuming again the reference frequency Fref of 30 KHz and 256 phase readings per reference period, now the sampling rate is 30* 256=7.68 MHz. A cutoff frequency Fc=1 MHz is reasonable, thus the time response is about 200 times faster (1 MHz/5 KHz), to about 33 times faster (1 MHz/30 KHz). Thus, unlike prior art, the low pass filter 64 can now have a cutoff frequency Fc which is higher than the reference frequency Fref.

The faster response time achieves that much faster settling time to a new frequency. Moreover, a faster correction of VCO errors is achieved during lock-on. Fast detection of phase deviations is a prerequisite to efficient correction of these deviations, that is correction while these errors are still small. This lowers the phase noise at the output 33.

Another difference is that filter 64 may include an integrator to achieve a zero phase error between reference and output, as detailed below. In a preferred embodiment, filter 64 has a proportional/integral/differential PID response, to achieve both good transient and final values response.

The fast phase error measurement unit may further include overflow prevention means, as detailed below.

Figure 3A:
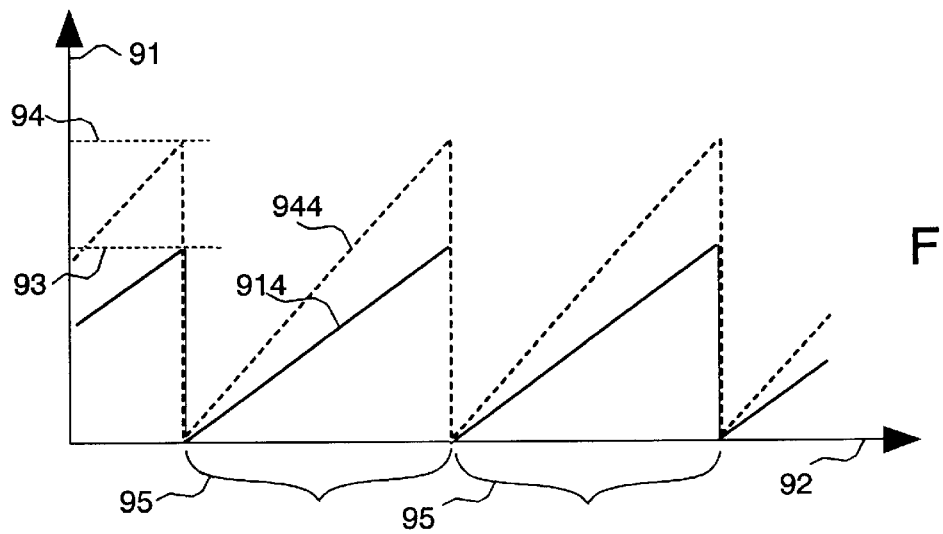
Figure 3B:
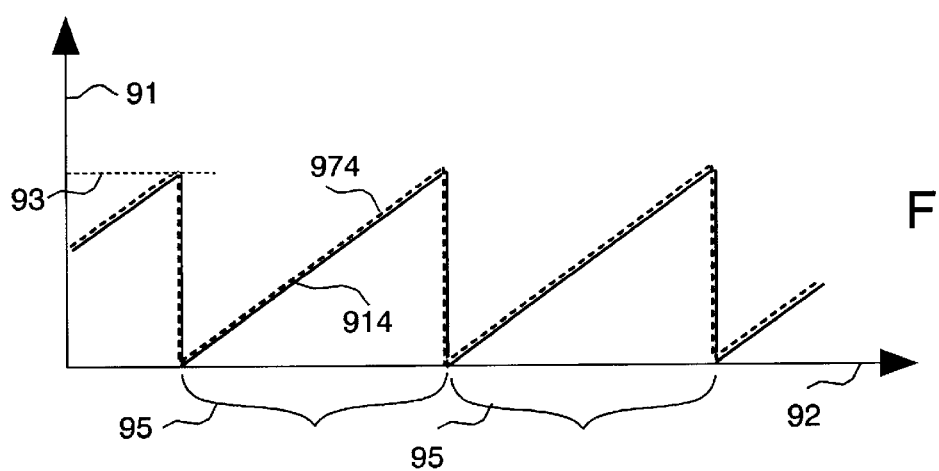
Figure 3C:
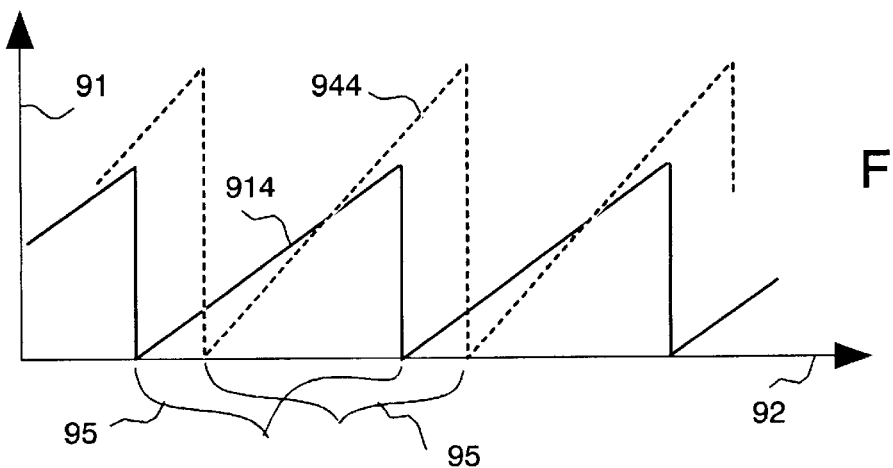

FIGS. 3A–3C detail the signals generated in the PLL counters. FIG. 3A illustrates signals in previous art PLL, as detailed in FIG. 1: the value 914 of reference counter output 14 changes from 0 to the maximum value 93, which is 256 in the example as illustrated, while the value 944 of VCO counter output 44 changes from 0 to the maximum value 94, which is 500 in the example. The vertical axis 91 represents the value of the bus in digital form, and the horizontal axis 92 represents time.

The counting time period 95 is the time for both counters 1 and 4 to start and finish a whole count, and then restart a new period 95. Time period 95 is the reference period Tref, equal to the reciprocal of the reference frequency Fref, thus Tref=1/Fref.

FIG. 3B details signals in new system structure, as detailed in FIG. 2: here the value of reference counter output 914 and the value of normalized VCO counter bus 974 both reach the same maximum value 93, of both reference counter 1 and normalized bus 74.

Again, the vertical axis 91 represents the value of the bus in digital form, and the horizontal axis 92 represents time.

There is another difference between the old system cf. FIG. 1 and the new, cf. FIG. 2. Whereas in FIG. 1 the counters 1 and 4 count at a 90 degrees phase difference therebetween, in the new system cf. FIG. 2 the counters 1 and 4 count in phase, that is they start concurrently.

The reason is the basic operation of the phase detector: In the prior art PLL described in FIG. 1, analog phase detector 21 gives a "zero" indication (zero output voltage) while the input signals are at 90 degrees phase difference. A lower or higher phase difference results in a positive or negative output signal, respectively. The same holds for PLL systems known in the art, for either an analog implementation of the phase detector (like a mixer) or digital (like a XOR gate). The MSB of counters 1 and 4 thus have to be in quadrature, that is at a 90 degrees phase difference.

In the new PLL as detailed in FIG. 2 however, the phase detector actually compares the phase in both counters 1 and 4, thus while the loop is locked, the counters 1 and 4 count in phase. That is, both counters start counting (value 0) and end counting (final value) concurrently.

The present invention corrects a problem found in prior art PLLs, where counters 1 and 4 counted at a relative phase difference of 90 degrees, while using a phase detector on MSB alone. It was not possible to use the phase detector 21 of FIG. 1 with the digital phase detector 62 of FIG. 2, since the former required the counters 1 and 4 to count in quadrature, whereas the latter requires these counters to count in phase.

FIG. 3A ignored this effect, to illustrate the logical advancement of the counters, as is apparent to the phase detector, and so as not to obscure the principle of operation with details.

FIG. 3C details the actual signals in previous art PLLs, as detailed in FIG. 1. The value 914 of reference counter output 14 is in quadrature with value 944 of VCO counter output 44. That is, signals 914 and 944 are at a 90 degrees phase difference.

In other words, the time difference between the start of signals 914 and 944 is a quarter of the time period 95. Since period 95 corresponds to 360 degrees, a quarter of that is 90 degrees.

The vertical axis 91 represents the value of the bus in digital form, and the horizontal axis 92 represents time.

Prior art PLLs could at most perform one phase measurement during the reference period 95, for several reasons: each counter counts to a different end value, and each increment has a different angle equivalent, thus counter readings cannot be compared directly except the MSB. Moreover, the counters counted in quadrature, so that there is always a phase difference between them, while the loop is locked. Therefore, no more than one phase reading per reference period could be performed in prior art PLLs, this limiting the rate of phase readings.

There is another advantage stemming from the counters starting concurrently, in that frequency hopping without losing lock may be achieved and the lock-on process is faster, as detailed below.

The above disclosure relates to one embodiment of a structure to achieve two buses 14 and 74 that span the same range, one bus derived from the reference clock and the other bus from the VCO output respectively. Other means may be used to implement this aspect of the invention. For example, an adder 48 (see FIG. 17) may be used in lieu of counter 4 and multiplier 7. The adder 48 will add a predefined digital value 741 to the bus 74 for each activation of clock 33, so that after N cycles of clock 33, bus 74 will complete a 360 degrees change like bus 14. An adder with many bits may be implemented in a relatively simple structure and may include lookahead logic for fast operation.

If the adder is asynchronous, its output stage may include a latch clocked with signal 33 so that the bus 74 will change synchronously with the VCO clock 33. To change the modulo count and the output frequency, a different value will be set up to be added to bus 74 each time the clock 33 is activated.

In another implementation, the counter 1 may be replaced with such an adder. It is also possible to replace both counters and normalizing means with one adder 79, see FIG. 18.

Figure 20:
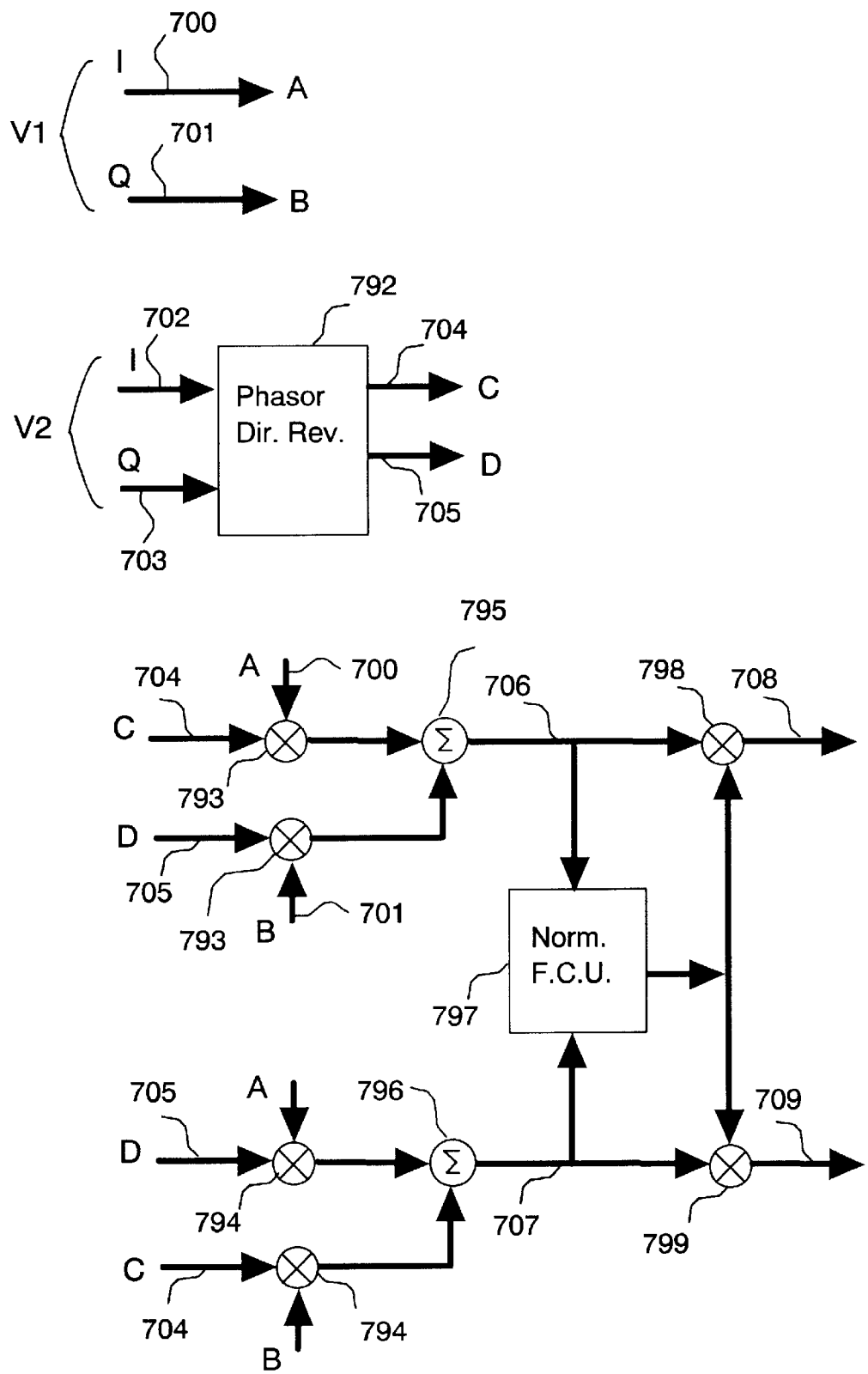
FIG. 20 details the phase detector structure and operation.

In yet another implementation, computations in the complex plane (Real, Imaginary) may be used to compute the phase difference between two signals, as illustrated in FIG. 20.

Logic design techniques allow for various implementations of the above detailed invention, as will become apparent to a person skilled in the art upon reading the present disclosure.

Throughout the present disclosure, it is to be understood that the invention may be either implemented in hardware or software. Hardware embodiments may include TTL components (like FAST), ECL, SiGe, GaAs or other technologies. Software embodiments may include a programmable digital signal processor DSP, a microcontroller or a microcomputer or other means. A 16 bit fixed point DSP may be used, or a floating point DSP for increased precision. For example, the SHARC DSP manufactured by Analog Devices Inc. may perform 32 bit, fixed or floating point computations, to achieve a very good precision of the digital computations.

1.2 Infinite resolution of the phase error measurement

The phase error signal 643 to the VCO (FIG. 2) is not just the difference in the digital words in buses 14 and 74. Rather, signal 643 is the result of a continuous-time processing of that difference, taking into account the precise timing of each change in buses 14 and 74. Such a processing may be implemented for example using a low pass filter or an integrator. A continuously variable, infinite resolution phase error is achieved even when using a few bits of buses 14 and 74 and a DAC with just a few bits.

In one embodiment, the novel structure to achieve this infinite resolution includes two blocks, each with its own clock and synchronization independent of the other, and a phase detector 62 which is not clocked, that is it responds asynchronously to any change in any of the two blocks. One block is the reference counter 1, and the second block includes the VCO counter 4 and the multiplier 7. In another embodiment, it is the reference counter 1 which gets normalized, in which case the first block also includes the normalizing means there.

The reference counter 1 and the optional normalizing means there are synchronous with the reference clock 12, whereas the VCO counter 4 and the multiplier 7 are synchronous with the signal 33 out of the VCO 1. The net result is that the phase difference subtractor 62 receives a first bus 14 which is synchronized to reference clock 12 of the first block, and second bus 74 which is synchronized to the VCO output 33. The clocks 12 and 33 can take any relative time delay over a continuum, that is with infinite resolution, this resulting in a corresponding time delay with infinite resolution between the reference counter output 914 and the normalized VCO counter bus 974 (see FIGS. 3A–3C). This results in an average phase difference that may take any value on a continuous scale, resulting in a control voltage 643 to VCO 3 that can take any analogous value, without any quantization error.

In a preferred embodiment, each of the counters 1 and 4 is synchronous, and the counter with the multiplier and other optional components in each of the two blocks form a pipeline structure, with all the components in the pipeline being controlled by the clock governing that block, that is either clock 12 or 33.

A phase detector 62 to achieve the infinite resolution is required not to be clocked, but to respond asynchronously to any change in any of the two blocks, that is to any change in its inputs (bus 14 or 74). A possible embodiment of phase detector 62 uses the TTL component 7483, which is a 4-bit full adder using only digital gates like AND, NOT, XOR without any clocked component. Since the output is not gated by any input clock, the output changes responsive to any change in the input, after a specific time delay.

Several 7483 units may be stacked to implement a full adder of any desired length (number of bits). Any other asynchronous adder may be used, preferably including carry lookahead logic to achieve a fast computation time.

If the specific embodiment requires a digital subtraction whereas the 7483 is an adder, one of the digital words may be converted to a negative value, like its 2's complement. Otherwise, the digital multiplication factor 723 in the multiplier 7 may have a negative value, this resulting in a negative value of the bus 74 that forms one input to the adder 62.

Another embodiment of unit 62 may use the 74181 4-bit Arithmetic Logic Unit, which is set to perform either an addition or subtraction. Where there is a possibility that the output of the adder will undergo some incorrect transitional states until it settles to the correct value, and if the time of that effect is long enough to cause an error in the analog phase error signal, it is possible to generate a short masking pulse each time one of the buses 14 or 74 changes, to block that state.

In another embodiment, there need not be two blocks, each with its own clock and synchronization independent of the other. Rather, only the components that supply the two buses to the phase detector 62 have to supply these buses each with its independent clock. This embodiment allows to implement all the processing in one unit, like a microcontroller or DSP, and yet to supply two buses to the phase detector, where each bus is synchronized to a different clock. Various other means to achieve this effect may be used.

Figure 16:
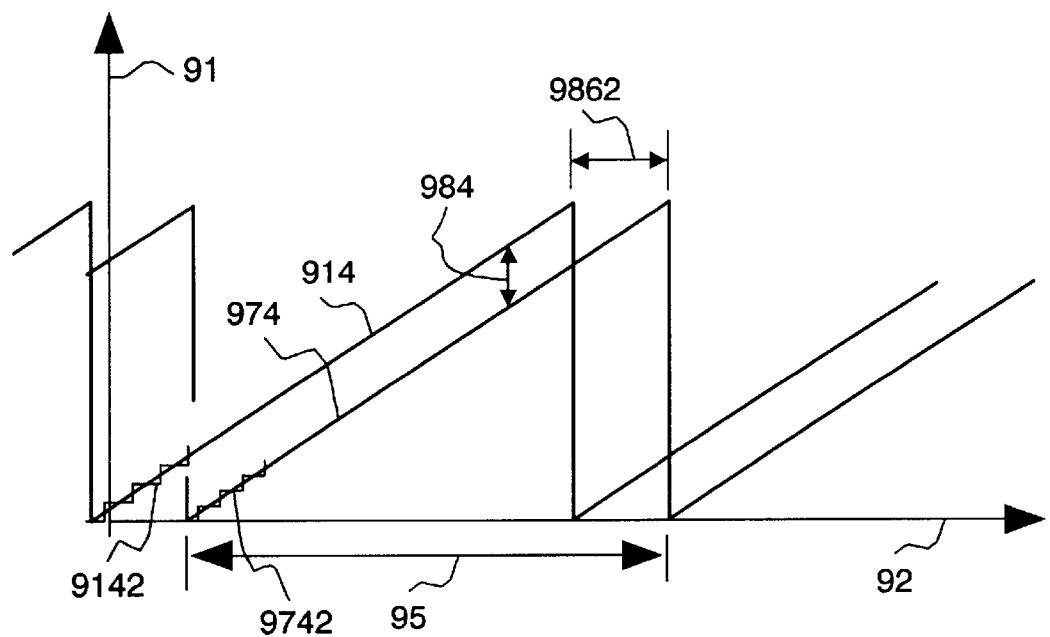
FIG. 16 details signals in phase measurement with continuous resolution.

FIG. 16 details the signals resulting from the above structure, that achieves a phase measurement with infinite (continuous) resolution. The vertical axis 91 is the value of each bus, and the horizontal axis 92 is time. Graph 9142 details the value of the reference counter output 914, with its quantization error, and graph 9742 details the value of the normalized VCO counter bus 974, also with its quantization error. Graphs 914 and 974 detail the average value of the reference counter output and the value of normalized VCO counter bus, respectively. The value of phase difference 984, equals reference 914 minus normalized VCO counter bus 974 (averages).

The averaging may be either performed on each signal 9142 and 9742, or on the difference thereof.

Since the time difference 9862 between waveforms 914 and 974 can take any value over a continuum (infinite resolution), this results in an infinite resolution for the difference 984. The counting time period 95 Tr is the reference period, Tr=1/Fref Another benefit of the abovedetailed structure is that there cannot be a critical race between the reference and the VCO blocks. In my prior art application there could be a critical race, and specific means to prevent it were disclosed. In the novel structure the danger of a critical race is completely eliminated with the two blocks and the asynchronous adder.

1.3 Overflow prevention means

When one counter overflows (returns to its first or initial value) and before the other returns as well—there is overflow or underflow of the difference. In normal operation of the PLL, a time difference between the counters is expected, this resulting in time intervals where there is an overflow of the phase difference. This overflow time interval starts when one counter returns to its first value and ends when the other counter returns as well. If the overflow is not corrected, it may result in a phase difference error.

Figure 4:
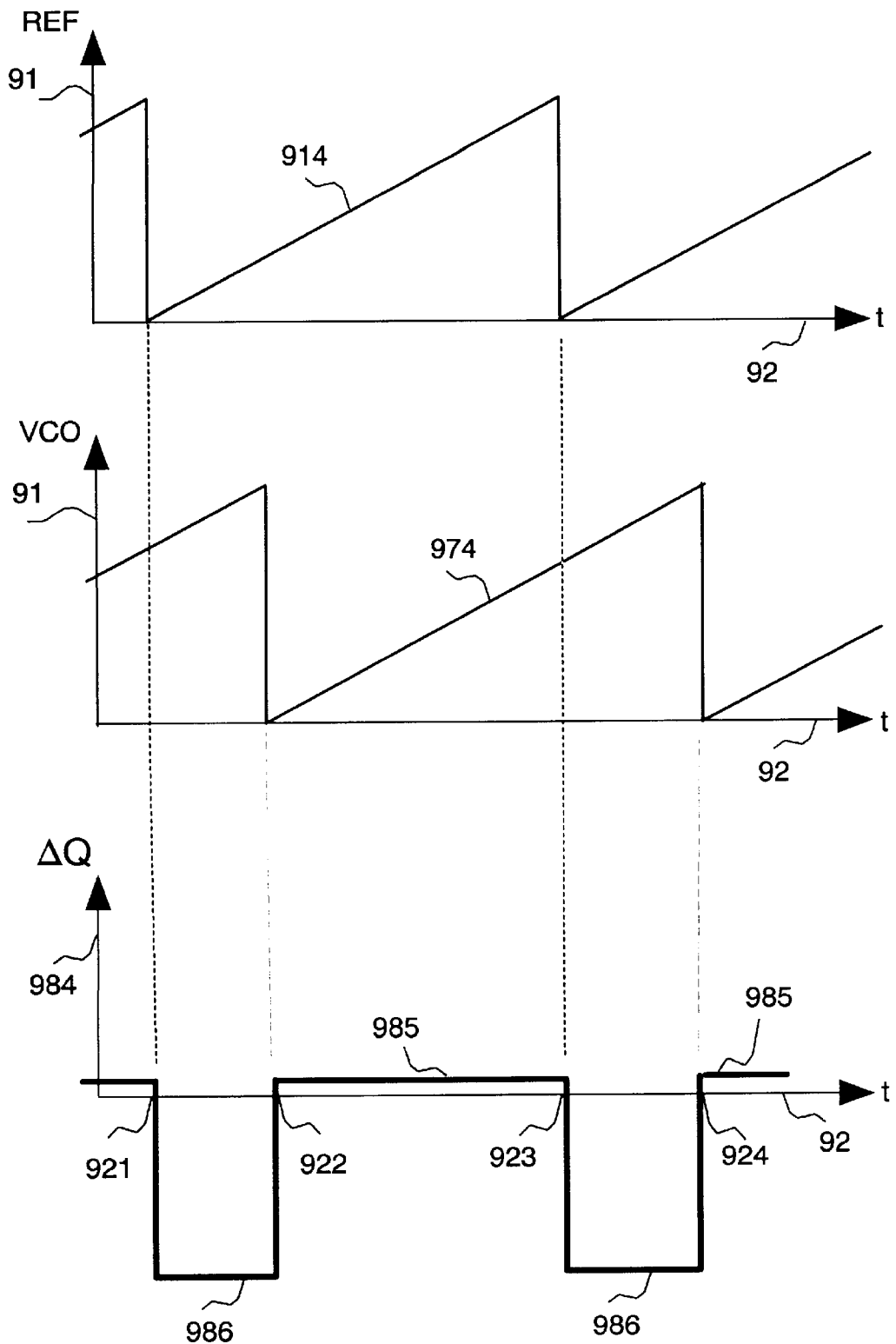
FIG. 4 illustrates waveforms pertaining to the overflow in counters.

FIG. 4 details the waveforms relating to the overflow in counters, where the vertical axis 91 is the value of the bus and the horizontal axis 92 is time. The three graphs detail signal variations which occur concurrently. The value of reference counter output 914 increases monotonously to its maximal value then returns to the initial value and increases again. The value of normalized VCO counter bus 974 undergoes the same process, possibly with a time delay between signals 914 and 974. The value of phase difference 984 equals the reference 914 minus the normalized VCO counter bus 974.

The phase difference 984 comprises correct value sectors like sector 985, from time 922 to 923 and from time 924 to the next overflow (not shown), and overflow value sectors like sector 986 from time 921 to 922 and time 923 to 924.

Thus, one counter will reach the final value and jump to the first value at time 921 for example, while the second counter is still advancing. This creates a sudden jump in the difference bus 984. At a later moment 922, the second counter will go to the first value and the difference will be correct again. In the overflow region 986, however, erroneous values will be generated unless correction means are used.

Sometimes it is not clear which is the "true" zone and which is the "false" zone, especially when they are about the same width. In those instances it does not matter which one is chosen as the "true" one, since the loop will close so as to lock in that time zone.

Figure 5:
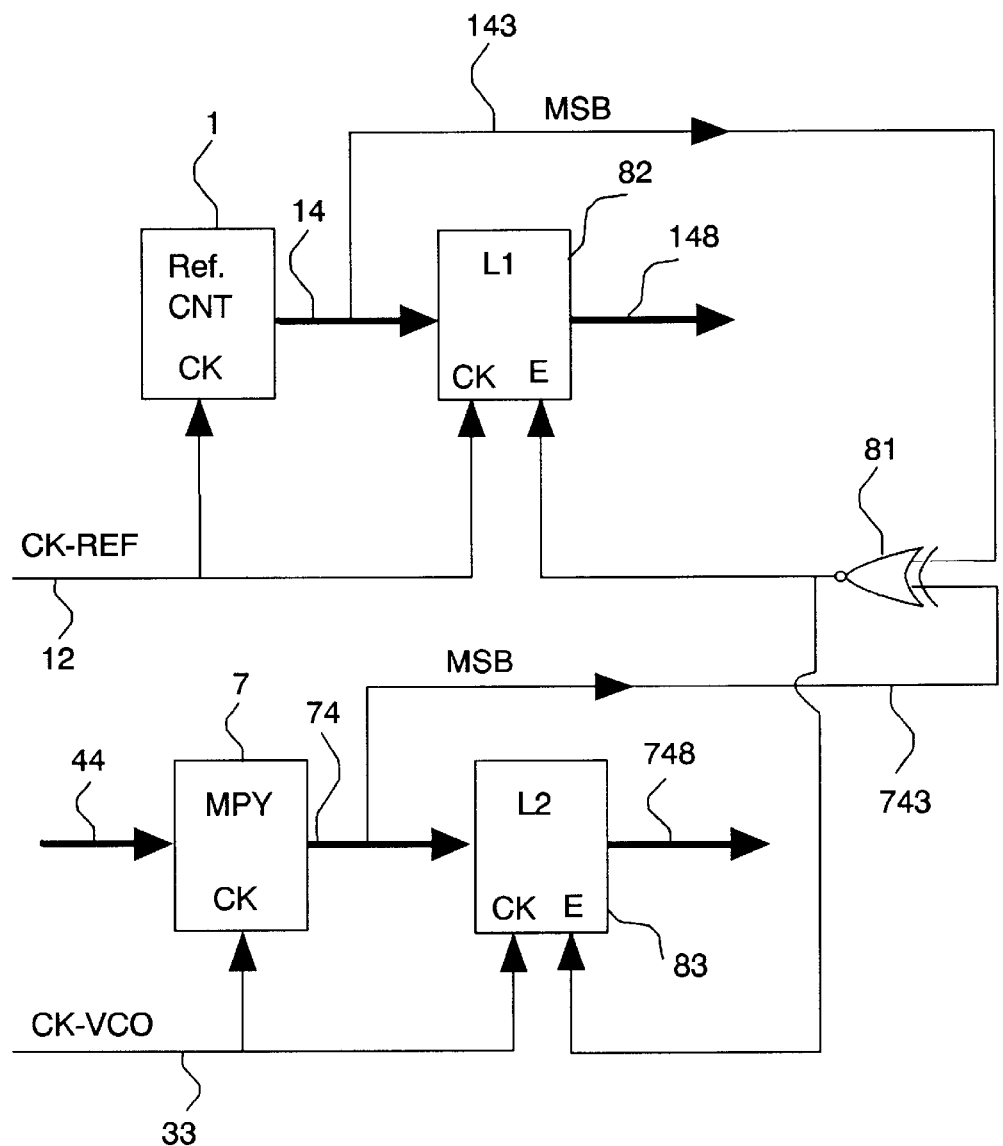
FIG. 5 details means to prevent counters overflow

FIG. 5 illustrates one embodiment of means to prevent counters overflow. It is effective and will not have problems of a critical race, since it includes only asynchronous elements (that is, no clock is required) so it is not sensitive to a state where one or the other MSB 143 or 743 changes first, or where the MSBs change simultaneously—in any case it will function OK.

A possible disadvantage is that it will also block the bus during part of the time when it is OK, that is when one MSB rises to a "1" level and before the other MSB rises as well. More complex logic may be used as known in the art to distinguish between the rising MSB occurrence (no correction is required) and the falling MSB occurrence (correction is required).

The overflow means is connected to a PLL like that illustrated in FIG. 2 and including reference counter 1 with its clock input 12, reference counter output 14, normalized VCO counter bus 74 out of scaling means 7 (here a digital multiplier used to normalize the VCO counter output 44 bus) and the VCO clock 33 is the output signal generated in the voltage controlled oscillator (not shown).

The overflow detector/corrector means include the XOR gate 81 which has an inverter attached to its output (indicated as a small circle there) and digital data latch pair including reference bus latch 82 and VCO bus latch 83. Latches 82 and 83 may be implemented as part of the digital phase detector 62 (see FIG. 2), with XOR gate 81 used as an embodiment of the overflow detector 8 there.

The overflow subsystem operates in one of two states, as follows:

1. In the "No overflow" state, the MSB 143 and 743 in buses 14 and 74 respectively are both "o" or "1". The XOR gate 81 detects this state and its output assumes a "1" level, to activate the Enable (E) input of latches 82 and 83. This input enables the clock input to each latch, so that the latches are effectively transparent to data—the data on bus 14 is transferred to controlled reference bus 148 and the data on bus 74—to controlled VCO bus 748.

The data on buses 148 and 748 are used to compute the phase difference, for example using the phase detector 62 in FIG. 2 or any other means.

2. In the "Overflow" state, the MSB 143 and 743 in buses 14 and 74 respectively are different, that is one in the logic "O" state and the other in "1" state. The XOR gate 81 detects this state and its output assumes a "0" level, thus deactivating the clock input to latches 82 and 83. The buses 148 and 748 are frozen into the last OK state and remain frozen (not changing) so long as the MSB of buses 14 and 74 are different.

The buses 148 and 748 are kept in the last OK state since FIG. 5 discloses a pipeline structure, with output 148 of latch 82 being updated with one clock delay after the output 14 of reference counter 1. Similarly, output 748 of latch 83 is updated with one clock delay after output 74 of multiplier 7.

Thus, although buses 14 and 74 have values in the overflow region (MSB are different), buses 148 and 748 hold values of one clock ago, that is values having the same value of MSB (no overflow).

The above embodiment has a possible disadvantage that in the "frozen" or "Overflow" state 2 the output of buses 148 and 748 does not indicate the actual phase in the loop but the last OK values. This may be of marginal importance since these values are close to the actual values and the "Overflow" state occurs for just a small part of the time period Tref.

In another embodiment (not shown) the overflow effect may be completely corrected by the addition or subtraction of the overflow value, as the case may be. The result is that the controlled buses 148 and 748 change continuously and are within the allowed range to result in a correct phase difference. This embodiment includes means for detecting which bus returned to its in value: if bus 14 did overflow, then the difference is too low (underflow) and a specific correcting value (the value of the jump) is added to the difference; if bus 74 did overflow, then the difference is too high, and the same specific value is subtracted from the difference.

In any case, the above correction (either addition or subtraction) is performed only in the overflow zone, that is from the moment one bus overflows and until the other overflows as well. After the second bus overflows, the overflow correction is stopped.

In any case, since the counters 1 and 4 perform a simple monotonous up or down count, the MSB and/or TC (terminal count output) completely define the state of the counters and can be used to detect the overflow time period.

In still another embodiment (not shown) the phase difference itself is monitored and is continuously compared with a threshold, for example half the full range expected. Actually a threshold pair values is used, having a maximum (positive value) and minimum (negative value). If the difference exceeds the threshold, correcting means are activated to prevent the overflow value from influencing the phase locked loop.

Preferably, the phase correction consists in the addition or subtraction of a value corresponding to 360 degrees of phase, to completely correct for the overflow. This value corresponds to a jump from the maximal to the minimal value in the bus.

In another embodiment (not shown), the influence of overflow is canceled at the analog signal level out of DAC 63, with the inclusion of a sample/hold or track/hold circuit. In the "No overflow" region the circuit transfers the phase difference signal to the VCO. In the "Overflow" region the signal is in the "hold" state, to preserve the last value of the phase difference prior to overflow.

The sample/hold or track/hold may be implemented as part of DAC 63.

To summarize: means to detect an overflow state were described, together with means to prevent an error in the phase error signal because of that overflow. A simple error prevention means may be implemented, which may have the disadvantage that in the overflow region a frozen value of error is used instead of the real time, actual value. Another disadvantage is that the phase error may be also frozen in the non-overflow region.

A more elaborate logic may completely correct the overflow effect and only when this is required. A person skilled in the art may implement a complete correction of the overflow, after the cause of the overflow in the new PLL was identified and methods for its correction were detailed in the present disclosure.

In yet another embodiment using a common adder 79 (see FIG. 18), the likelihood of an overflow is very remote, that is a PLL may be implemented without any overflow-prone circuits at all. The reason is that this embodiment computes the difference between the digital buses, without any physical implementation of the buses themselves. Thus, "virtual" buses that advance continuously ad infinitum, without overflow, can be assumed. The phase difference is kept within a controlled range by the closed loop, and its chance of overflow is remote. If out of lock, overflow may be permitted since the output cannot be used anyway at that time.

1.4 Digital bus normalization means

The above embodiment, detailed with reference to FIG. 2, illustrates a normalization method and device using a digital multiplier 7 used to correct the VCO bus 44.

In another embodiment (not shown) a multiplier may be used to normalize the reference bus 14 so as to bring it to a range equal to that of bus 44. Other embodiments may include digital dividers or adders to perform the normalization function, as well as any implementation in digital hardware and/or software, as it may become apparent to a person versed in the art upon reading the present disclosure. A microcomputer, microcontroller, DSP or other digital means may be used.

Buses 14, 74 should include at least two bits each for a 90 degree phase increment in each. Higher precision can be achieved by averaging. For better performance, clock 12 should have as high a frequency as possible, although that requires more stages and bits in counter 1.

This achieves a higher precision of the angle in bus 14, minimizing the rounding error because of the limited size of bus 14. Similarly, the maximum number of bits should be used in bus 74 to achieve better performance.

Scaling up or down is performed in scaling means 7, implemented as a binary multiplier as known in the art. Such a multiplier has two input busses to receive bus 14 and bus 74, and an output bus to issue the result of the multiplication. In a preferred embodiment, a signed multiplier is used, which can multiply positive as well as negative numbers. Thus, using a negative coefficient 723, a regular binary adder can be used in lieu of subtractor 62, to achieve the same mathematical function.

In another implementation, an unsigned multiplier is used, in conjunction with a binary subtractor or an adder with means (not shown) to compute the negative of bus 74 using 2's complements. A Binary Coded Decimal BCD multiplier can be used, together with a BCD bus 42 and BCD counter 4. This, however, does not make optimal use of the available bits and logic circuits.

Usually only part of the output bus is used, from the MSB. For example, for 16 bit counters 1 and 4 and a 16 bit correction coefficient 723, a 32 bit result is available at the multiplier output. Of these about 16 most significant would be used in bus 74, with the rest truncated (ignored) or rounded as known in the art.

A modulo counter may be implemented in two ways, that is a counter operating from value 0 to a maximum value M, or from a preset value N to an "all ones" or 1111 . . . 11 value. The above signal processing/normalization relates to the former case, where the bus 14 or 74 represents the actual count of the counter. In the latter case, direct bus correction and subtraction may be a bit more complicated, and may require a subtraction of the preset value N prior to multiplication or division with the correction coefficient.

Figure 17:
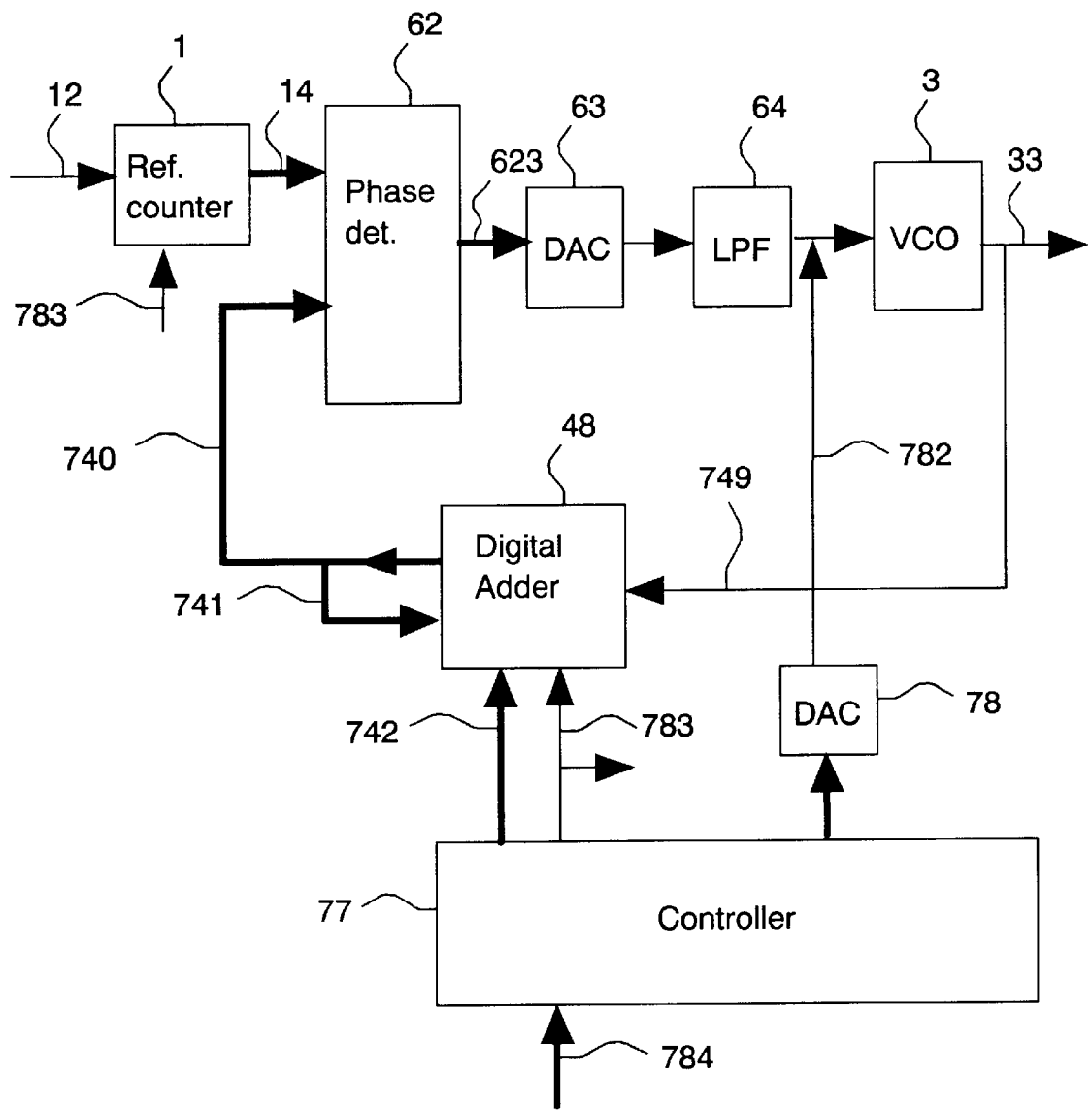
FIG. 17 details a PLL with adder to replace the VCO counter

In another embodiment, a digital adder 48 may be used for bus normalization, see FIG. 17.

Where two DACs 145, 7455 are used (see FIG. 7), an analog normalization may be performed, for example by controlling the reference voltage to the DACs.

When using a phase detector operating in the complex plane, as detailed in FIG. 20, no normalization is necessary before the phase detector. The output may be normalized, if so desired, as detailed below.

1.5 Structure of the phase measurement means

Using two buses representative of two signals, a phase difference measurement may be performed at a fast rate, that may be much faster than the frequency of the input signals. This may be used to decrease the phase measurement error and/or to achieve a fast response system.

Prior art systems measure phase by a multiplication and integration process, where two signals are multiplied and the product is integrated over at least one period of the input signals, to extract the phase difference. The instantaneous value of the product is meaningless. The phase measurement rate cannot be higher than the input frequency.

In the new system, however, the two signals may be sampled and a phase difference may be computed from that single sample. Phase measurement rates in the megahertz or gigahertz range may be achieved, even though the input signals may be in the kilohertz range.

For novel embodiments using averaging (i.e. in a high bit processing or a common DAC), the averaging time may be much shorter than the time period of the input signal, to achieve a fast phase measurement rate.

Various embodiments of the present invention will become apparent to a person skilled in the art, for example the following structures:

A. Structure 1- digital bus processing using a digital subtraction means, see FIG. 2 as detailed above. Various digital processing means, operating on the two buses, may be used to that purpose.

B. Structure 2- one-bit processing, a high bit from digital bus 14 is compared with a high bit of bus 74 at the same frequency, see FIG. 6 below. A high bit means a bit at a higher frequency than the MSB that is used in prior art PLLs.

C. Structure 3- analog processing or subtraction of analog signals derived from bus 14 and bus 74 using a DAC, as detailed below, see FIG. 7. Various analog means may be used for that purpose.

D. Structure 4- signal processing in the complex plane, see FIG. 20

In all the above structures, the infinite resolution of the phase difference signal may be achieved, as detailed above.

Figure 6:
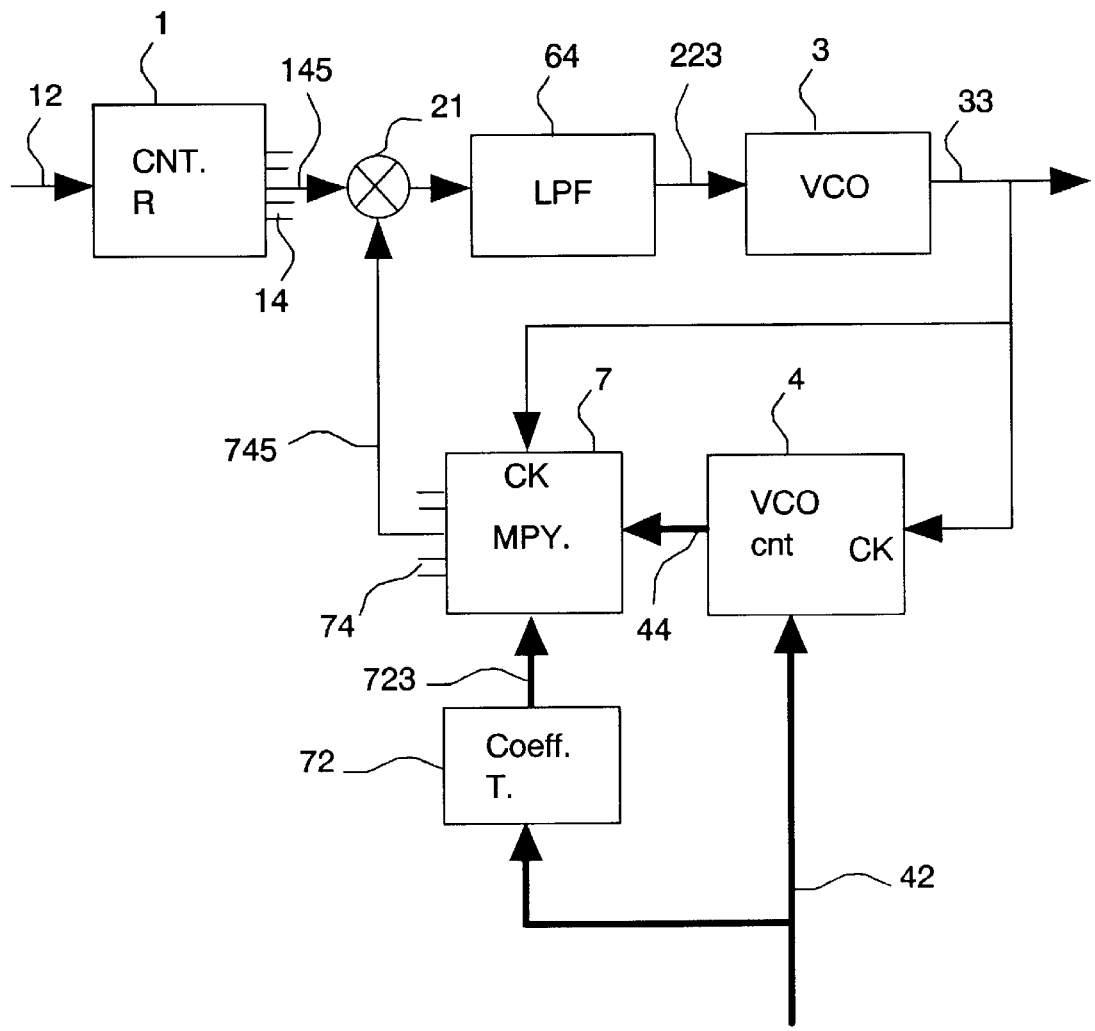
FIG. 6 details a one-bit comparison PLL, using a high bit in both buses

An embodiment of "Structure 2" is illustrated in FIG. 6, which is based on the fact that bus normalization results in lower bits of the buses 14, 74 having the same frequency respectively. Thus, for example, the MSB in both buses is at frequency Fref; the second bit from MSB is at frequency 2*Fref in both buses; the third bit is at 4*Fref, the fourth bit at 8*Fref etc.

A simple PLL structure may be implemented similar to that in prior art as illustrated in FIG. 1, but using a lower bit of the counters 1, 4 instead of the MSB. This could not be done in prior art PLLs since the lower bits were at different frequencies, since the counters counted at a different rate to a different final value. In the present invention, however, the normalized bus 74 counts to the same value as bus 14 and at the same rate, when the PLL is locked. Thus, a lower bit in both counters may be used.

For example, assuming that the second bit from MSB is used in bus 14 (signal 145) and in bus 74 (signal 745). Signals 145 and 745 both are at frequency 2*Fref, so an improved performance of the PLL is achieved, although the rest of the circuit is as in prior art: Signals 145 and 745 are compared in a one-bit phase comparator 21, which may be a mixer or a digital gate or an analog multiplier for example.

The resulting signal includes the phase difference information as well as harmonics. The harmonics are removed in low pass filter 64, and the resulting control signal to VCO 223 is applied to voltage controlled oscillator 3 (VCO).

This is similar to a regular PLL and has a simple, lower cost structure than the embodiments illustrated above. However, the performance is better than usual PLLs, as follows:

a. The reference frequency is double, 2*Fref. Therefore a low pass filter 22 with higher cutoff frequency may be used, to achieve a faster response time of the loop. The response time may be twice as fast as before.

b. The higher reference frequency reduces phase noise by 6 dB. It is known that in a PLL the phase noise of the reference is increased in the loop by 20 log (Fout/Fref) dB. If the Fref is increased 2 times, then the above ratio is decreased 2 times, and the phase noise at the output is reduced by 20 log(2)=6 dB (decibels).

Instead of the second bit from MSB, a still lower bit may be used. Then the response time is still faster, and the phase noise is lower.

For example, the fifth bit from MSB may be used from both buses 14, 74 to form the signals 145 and 745 respectively. These signals are at a frequency 16*Fref, thus a 16 times increase in response speed is expected (the loop will settle to a new frequency in 1/16 the time it took before). Moreover, the phase noise at the output is decreased by 20 log(16)=24 dB Still lower (and faster) bits may be used in both buses 14, 74 to further increase the performance of the PLL.

Method for Achieving a Higher Performance PLL

A method for increasing the performance of a regular PLL may include the following steps:

1. use a first counter and a second counter to each count cycles of a reference clock and a VCO, respectively;
2. normalize the output bus of one of the counters, for example by multiplying with a coefficient proportional to the other counter modulo and inversely proportional to the normalized counter modulo. In another embodiment, both counter buses may be normalized to some other value;
3. use one bit of both buses for phase measurement, that is the output bus of one counter and the normalized bus of the other counter, while taking corresponding bits having the same frequency when the loop is locked and using a lower bit than the MSB, at a higher frequency; and
4. close a phase lock loop as in a regular PLL, wherein the phase detector uses for reference signal and VCO signal the bits taken as in step (3) above.

For improved performance, the additional following steps are taken in the above method, or to implement the system as detailed in FIG. 6:

A. The reference counter 1 counts to a binary value, that is a power of 2. The counter may count to 255 (modulo 256) or to 2047 (modulo 2048) etc.

This is important so that the lower bits at higher frequency are symmetrical and without a phase jump at the end of the count, that is at the end of time period Tref=1/Fref. Otherwise, some bits may not count to a full half period at the end of the period, or the waveform is not symmetric. This results in harmonics in that signal, which may have a bad influence on phase noise when that bit is taken as reference for the PLL.

For a pure binary counter, each bit is a square wave including a base frequency K*Fref and its odd harmonics 3*K*Fref, 5*K*Fref etc. These harmonics can be easily removed in the LPF. If the wave is not symmetric or there is an unfinished half cycle each time Tref, then lower harmonics are present in the waveform, that is Fref and its harmonics. These may be more difficult to filter out in the LPF.

Thus it is better to implement the counter 1 as a binary counter. The clock input 12 from a crystal oscillator should be at a specific frequency which will result in the desired Fref after division in the binary counter 1, for the required frequency step size at output 33.

B. The modulo count of VCO counter 4 should be larger than the modulo count of counter 1. This ensures that there will be no missing values in bus 74, but the bus will generally assume successive values from 0 to the final count (V-1). This ensures that bus 74 will pass through all the binary values as in bus 14, and at the same rate. Thus lower bits on bus 74 will be generally symmetric with frequencies as in bus 14. This requirement may not be mandatory, since anyway bus 74 advances similarly to bus 14.

C. Signal 745 is part of the bus 74 which is synchronous with clock 33, that is the VCO output, whereas signal 145 is synchronous with reference clock 12. Since phase detector 21 is asynchronous, this implements a structure with continuous, infinite resolution values of signal 223 which controls the VCO 3, as detailed above.

D. A prescaler (not shown) may be used between output 33 and the input of counter 4. This may be required if output 33 is at a high frequency for example 900 MHz and the counter 4 is to operate at lower frequency, for example 20 MHz. In this example, a counter/divider by 45 may be used.

When a prescaler is used, the reference frequency should be lowered by the same ratio, if the original frequency steps at output 33 are to be achieved. This can be done in counter 1, or the frequency of reference 12 be lowered by the same ratio. The second option is preferred, since it keeps counter 1 binary as required from considerations in item (A) above.

For still higher output frequency, downconverter means may be used (not shown) including oscillator and mixer means, with an optional prescaler.

Figure 7:
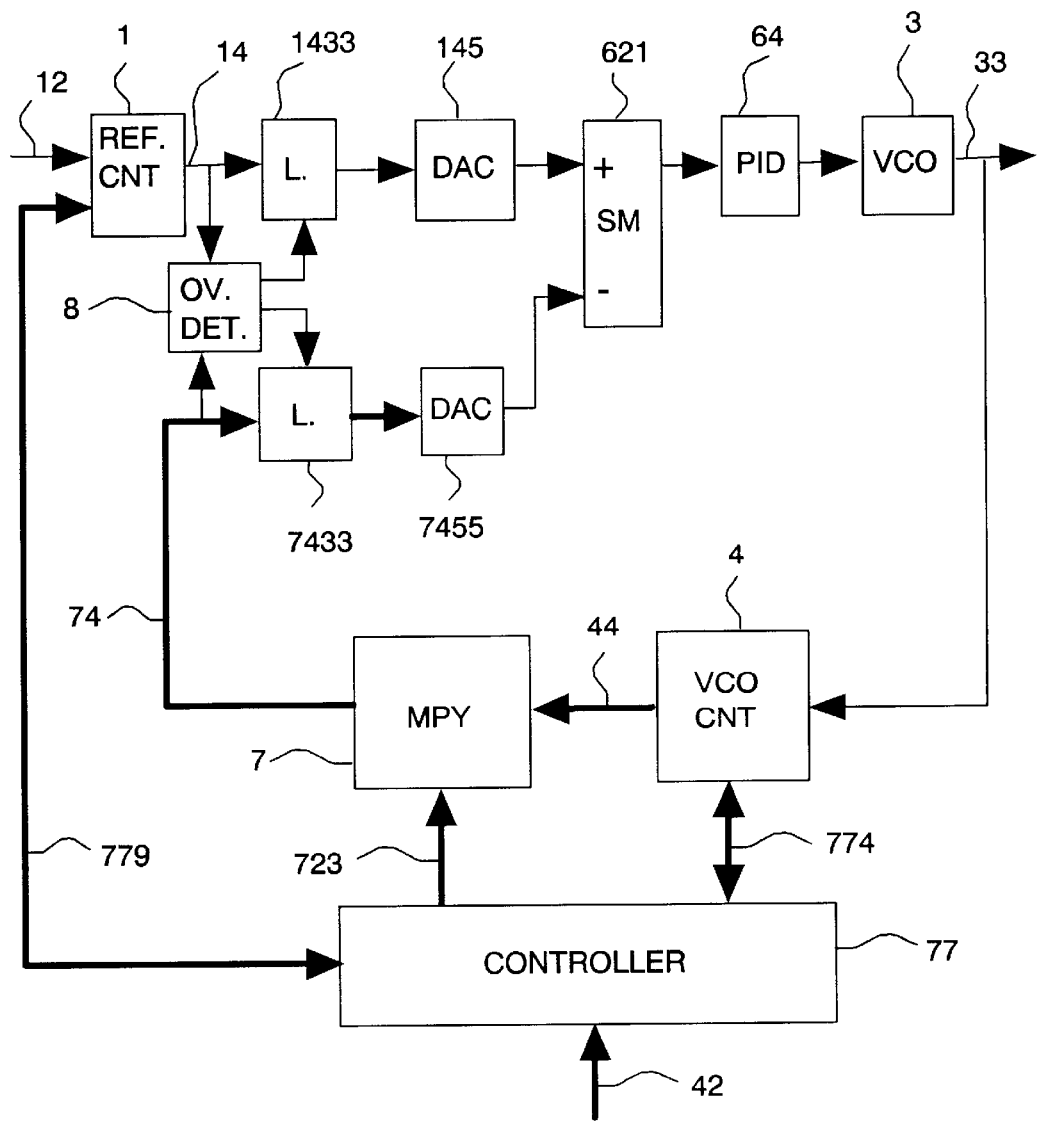
FIG. 7 illustrates a phase comparison embodiment using a DAC

An embodiment of "Structure 3" is illustrated in FIG. 7, which includes an analog processing or subtraction of analog signals derived from bus 14 and bus 74 using DACs 145 and 7455 respectively.

The infinite resolution of the phase difference signal may be achieved as detailed above, since there are the two synchronous blocks (reference and VCO) and the asynchronous analog signals subtraction means 621.

The other components of the PLL are similar to those in FIG. 2. The reference block includes a reference counter 1 with its clock input 12 and reference counter output 14 bus, latch 1433 (part of the overflow correction means), all synchronized to clock 12. The reference bus is applied to the DAC 145, to be converted into an analog signal. The VCO block includes the VCO counter 4 with its VCO counter output 44 bus, scaling means 7, normalized VCO counter bus 74 and latch 7433. All these parts are synchronized to the VCO clock, that is output signal 33.

A DAC 7455 converts the signals on bus 74 to an analog signal representative thereof.

A phase detector 621 may be implemented as an analog subtractor, which subtracts the VCO signal from the reference signal, both in analog form. It is followed by filter 64. Filter 64 may include a low pass filter or a PID (proportional+integral+differential control unit). The resulting phase error signal is applied to the voltage controlled oscillator 3 (VCO), to close the PLL loop. The VCO 3 generates the output signal 33.

The overflow detector 8 detects an overflow between counters 1 and 4l It can correct the overflow for example by stopping (freezing) latch 7433 and 1433, to remain in the last correct state (prior to overflow) until the next correct difference (no overflow) time period.

In a preferred embodiment, both DACs 145, 7455 have a common input reference source, so there is no error because of difference in reference between the two DACs. Furthermore, a dual DAC (two DAC units manufactured in one monolithic piece of semiconductor) may be advantageously used to further decrease errors in the loop.

In another implementation (not shown), the error from a DAC may be eliminated by using a single DAC, with its input connected alternately to the reference bus 14 and the corrected VCO bus 74. Bus 74 should be complemented before its application to the DAC, to achieve a subtraction effect at the analog output of the DAC. That is, the average output value of the DAC is Vo=(Vref−Vvco)/2, where Vo=output of VCO, average Vref=output voltage of DAC when DAC input is connected to reference bus 14, where Vvco=output voltage of DAC, when DAC input is connected to corrected VCO bus 74

The minus sign of Vvco results from the digital negation or complement (not shown) performed on bus 74 prior to its coupling to the DAC. The DAC with the LPF will perform an averaging of the input signals.

A disadvantage of the above method is that the phase loop may be slower, since a low pass filter with a lower cutoff frequency Fc has to be used, where Fc is lower than the frequency Fm of the multiplexer at the DAC input which alternatively connects bus 14 and bus 74 (complemented) to the DAC. In lieu of complementing bus 74, a VCO counter 4 that counts down may be used to achieve the same effect. The advantage of using just one DAC (multiplexed) is that the DAC error is eliminated or is greatly reduced, since the same DAC is used both for reference and VCO buses. Moreover, this reduces the cost of the PLL. A ramp scaling may be done in one of the DACs without the multiplier 7. This, however, requires a high precision DAC to prevent errors.

A novel feature in FIG. 7 includes the controller 77 which is used to set up the modulo count of counter 4 and the normalization coefficient 723 for multiplier 7, responsive to a desired frequency command received on bus 42. A possible implementation of controller 77 includes a (not shown) digital signal processor DSP like the Analog Devices Inc. ADSP2100 family. Controller 77 may store a frequency hopping sequence, to be automatically activated on the PLL. Controller 77 may be used to achieve a frequency jump without losing phase lock, as detailed below. Another application includes a precise FM modulator, as detailed below. Controller 77 may bring the output frequency to any instantaneous desired value responsive to a data input that frequency modulates the PLL.

Thus, various embodiments of a system for computing a phase difference between a first signal and a second signal were detailed, including:

A. Two channels, each converts an input signal to a digital bus to generate a first and second digital buses. Conversion may be performed either directly on the first and second signals, or indirectly on signals related to the first and second signals. A direct conversion may be performed with an analog to digital converter ADC. An indirect conversion may be performed with a modulo N counter dividing a signal at a frequency N*Fs, where Fs is the frequency of either the first or the second signal.

A digital bus contains at least two bits that form together a binary word, where each bit has a different value that is defined by its relative location in the digital word. For example, with two bits the binary values of the bus are 00, 01, 10, 11 with the corresponding decimal values 0, 1, 2, and 3. Other bus implementations are possible, for example a BCD bus as known in the art.

B. Phase difference computation using arithmetic/logic/analog computing means that operate on the two digital buses, on at least two bits of each digital bus. An instantaneous value of phase is computed, that is the phase difference value for that instant in time.

C. (optional) Analog averaging (LPF) to decrease the quantization error in the phase difference.

Possible Implementations of Element (A)

Conversion of the input signal to bus may be implemented with a ADC, memory means, counting and/or arithmetic operations like addition, subtraction or multiplication or a combination thereof.

For analog inputs, the two components (I,Q) of the signal are converted to digital in the ADC. If only one component is available (I), then the other component (Q) may be computed using a 90 degrees time delay on (I) Where (b) uses analog means, it is possible to implement the bus normalization in the analog means, like controlling the reference voltage of a DAC.

The conversion uses fixed parameters, that is the value of parameters is not required to change to perform the phase measurement. Thus, multiplication or addition or subtraction uses each a fixed parameter. However, parameters may be changed from outside of the loop, if a change in frequency is desired for example.

This structure differs from fractional counter PLL, where the modulo count is changed periodically all the time, as part of the phase measurement process, with undesirable results—harmonics, spurious.

Possible Implementations of Element (B)

A digital or analog phase error computation may be performed. If the two buses are at a different scale from each other, normalization means may be used to bring the buses to the same range.

For two normalized digital buses, a digital adder or subtractor means may be used to compute the phase difference. These means may be implemented in software, hardware or a combination thereof, for example with DSP. For signals represented in a complex form (with I/Q or real/imaginary components) a digital phase difference computation using complex numbers may be performed. In yet another embodiment, phase difference measurement may be implemented using just one bit of the digital/normalized buses.

Memory means may be used to implement time delay, for example, to generate a quadrature signal for an input signal.

Difference from prior art phase detectors:
in prior art devices, the output contains large undesired signals, in addition to the desired phase difference signal. These undesired signals have to be filtered out, thus posing constrains on the detector structure. In the new detector, there is a large phase difference signal, with lower quantization error signal
in prior art devices, the phase error was the result of integration over time, with the integration time at least equal to the period of Fref. For a 30 kHz signal, only after 33 microseconds there was a new phase reading. In the new device, each measurement is a phase difference instantaneous value. Measurement at rates much higher than Fref can be performed, to measure the phase with great precision and speed.

2. A PLL Using the Novel Phase Error Measuring Unit

Following is a description of a PLL using the novel phase detector and additional features.

2.1 Fast frequency jump without loss of PLL lock

Although this feature is now detailed with reference to FIG. 7, it is to be understood that controller 77 may also be connected to counters 1 and 4 in other embodiments, like those in FIGS. 2 or 6, to achieve a similar effect.

It is known in the art that a PLL which is phase-locked at one frequency will take a long time to lock to another frequency, one of the reasons being that, when a PLL needs to switch to another frequency, the phase lock is broken. In this state, the PLL ceases to act as a linear system and a nonlinear process occurs where the PLL moves in a somewhat random and erratic way toward the new desired frequency.

After extensive research, and using an innovative point of view, a new understanding was gained of the process that caused PLLs in the art to break phase lock when spurred to change frequency. One reason is that, as the VCO counter is set to a new frequency, the reference and VCO counters are no longer in phase but become at a random phase difference therebetween. Another reason is that these counters are at a 90 degrees phase difference with respect to each other, and that phase is represented by a different number for each frequency as the modulo count is changed. Thus, it would be difficult to control the values in the counters, to speed up the lock-on process. Another reason is the slow response of the loop, caused by the slow phase detector and the narrow bandwidth of the LPF in prior art PLLs (see FIG. 1).

As the VCO counter 4 is set to a new modulo count, whereas the VCO 3 is still at the last frequency, the signal 443 out of counter 4 suddenly jumps to a new frequency, that differs from the reference frequency Fref. This frequency difference should appear at the output of the phase detector 21. The LPF 22, however, may block it since the LPF has a cutoff frequency lower than Fref.

Thus, the loop may not correct the phase error during a change in the frequency of the PLL, this resulting in the PLL breaking lock.

A new structure, see FIG. 7, was devised to prevent these effects. A PLL that remains phase-locked during a frequency hop is achieved, which can hop faster to a new frequency. The elements of the new structure are:

1. When the PLL is to hop to a new frequency, a controller 77 is used to set both counters 1 and 4 to be at the same phase, that is to create a zero initial phase error between the counters. One embodiment of this Element (1) of the invention is to reset counters 1 and 4 using control lines 779 and 774 respectively.

For coherent FH, controller 77 may read the state of counter 1 without changing it, through bus 779, and then may set counter 4 to a value corresponding to the same phase so that the phase error out of subtractor 621 is zero or minimal.

The initial value for counter 4 should take into account the value in counter 1 and the modulo count of each counter. Optionally the time delay to set the VCO counter may also be taken into account, to set the VCO counter to the expected value of the reference.

This may be easier to implement using an adder 48 (see FIG. 17) to replace the counter 4 and normalization means 7 in FIG. 7. Using adder 48 the value on bus 740 will not change during a change in frequency, so there is no need to read the value of counter 1 and to perform the above detailed setting of the counter 4 value.

2. When the PLL is to jump to a new frequency, controller 77 is used to set the VCO 3 to an initial frequency which is as close as possible to the desired new frequency. That is done in open loop, that is prior to any measurements of the VCO in the new frequency setting. Controller 77 may store an algorithm or formula for computing the required control voltage to VCO 3 to set it at a desired frequency.

Controller 77 in FIG. 7 may add to the initial value in counter 4 a parameter corresponding to that initial value; this parameter will pass through the phase detector and the LPF 64 to the VCO 3, to set it to a desired value.

This may be easier to implement using a DAC 78 dedicated to the purpose of initial value setting (see FIG. 17). Controller 77 can write any value to the DAC 78, that affects the VCO 3 in a short time (the initial value does not have to pass through a low pass filter). The control voltage to VCO 3 is responsive to both the loop error voltage out of LPF 64 and signal 782 that sets the VCO to an initial value for each desired frequency.

The setting of an initial value to the VCO when jumping to a new frequency acts as a feedforward path, to help the PLL to lock at a new frequency.

In a preferred embodiment, controller 77 holds a table with a plurality of control values for the VCO, each corresponding to a desired frequency. A still more precise initial value can be computed using interpolation between the stored values or by updating the table in real time as detailed below.

3. A fast enough phase measurement unit is to be used to measure the phase difference between counters 1 and 4. As good as the initial setting for the VCO (as performed in Element (2) above) may be, there are expected to be errors or components drift which may result in the VCO being set to a frequency DeltaF apart from the final desired value. The result is that, immediately after the VCO counter 4 is set to a new modulo count and before the VCO frequency starts to change, the output signal 44 will have a frequency with a repetition frequency different than Fref. The normalized bus 74 will have a frequency deviation as well.

A "fast enough" phase measurement unit should be capable of reliably and unambiguously measuring the phase difference between signals out of counters 1 and 4 at the maximum expected frequency difference between the buses 14 and 44, either at the initial moment after a frequency hop or any moment later. The phase measurement rate should be at least twice the maximum expected frequency error.

Either an analog or digital embodiment is possible, using more than the MSB of the counters, as detailed elsewhere in the present disclosure with reference to FIGS. 2, 6 or 7 for example.

4. The low pass filter (or PID) 64 should have a cutoff frequency Fc high enough to pass any expected error frequency to the VCO 3. That is, the low pass filter 64 should be fast enough to transfer phase errors to VCO 3 even in the worst case (for the maximal frequency error) as detailed in Element (3) above. The response characteristics of filter 64, together with the phase measurement unit and the rest of the components in the loop, should be so as to allow for stable closure of the phase loop, according to stability criteria for control systems as known in the art.

A PLL having the structure with Elements 1–4 as detailed above is capable to correct any frequency errors in the loop as the loop is set to a new frequency. The reference counter 1 and VCO counter 4 will start in phase, and any subsequent phase error because of a frequency error will be corrected in the loop while the loop stays phase locked. For example, assuming the PLL is required to operate in a 25 MHz range in the 800 MHz cellular wireless, the maximum expected error in the initial setting of the VCO may be of 1 MHz.

The phase detector, low pass filter and the rest of the PLL components should be capable of operating at a rate of 2 MHz or higher (divided by the modulo count of counter 4) to be able to correct the loop and keep it locked despite that frequency error.

The net result is that counters 1 and 4 start in phase and remain in phase, that is the loop remains phase locked during a change in the PLL frequency. This is achieved with a fast loop that basically can prevent the counters from going out of sync from each other.

Various embodiments of Element (2) above are possible. Element (2) teaches that the control voltage to VCO 3 is the sum of three signals:

a. An initial value for the VCO 3, corresponding to the desired output frequency of output signal 33;

b. The reference signal, representing the instantaneous value of bus 14;

c. The negative of the VCO signal, representing the instantaneous value of bus 44 after normalization to the range of bus 14.

A negative value is used for summation since the VCO bus value is to be subtracted in the loop.

One embodiment for Element (2) is that multiplier 7 further includes a digital adder therein, to add an initial value for the VCO to the output of the multiplier itself. The initial value may be applied over bus 723 from controller 77. In another embodiment, the initial value is added in an adder following reference counter 1, where that value may be transferred through bus 779 in FIG. 7.

In still another embodiment (see FIG. 17), a separate bus out of controller 77 may be used for the initial value of VCO 3, with a separate DAC 78 whose output may be added to the analog voltage out of the LPF.

In another embodiment, a common integrated circuit IC may implement the various functions of the bus generation and phase measurement. This circuit may also include means for setting the initial value to the VCO, by adding a fixed value to one of the components therein or using an adder to add a desired value to one of the buses.

Figure 8:
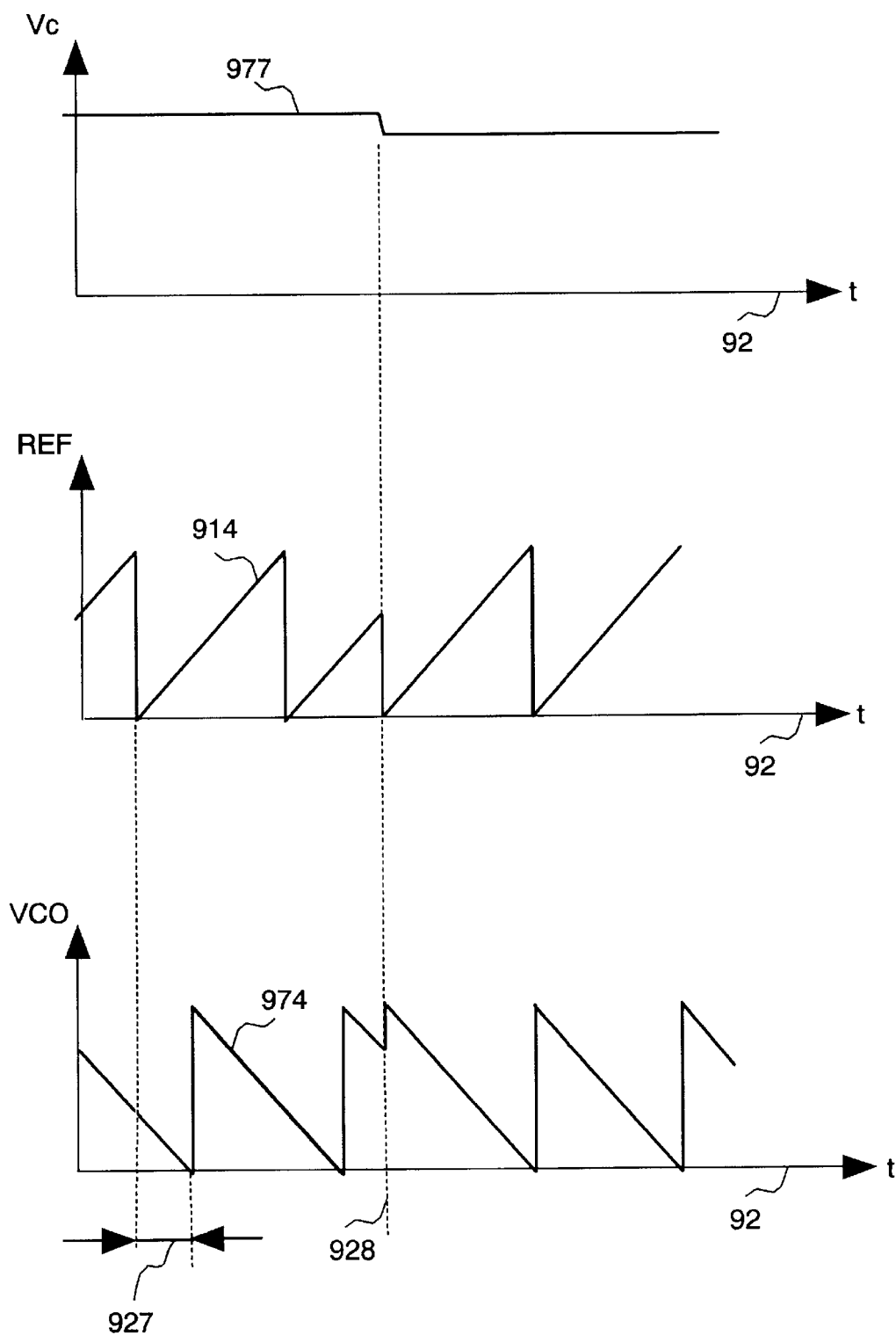
FIG. 8 details the control signals for fast frequency hopping

FIG. 8 illustrates the signals in a PLL including the Elements 1–4 as detailed above, for a PLL which hops frequency without losing phase lock. The three graphs in FIG. 8 illustrate the three signals in the PLL for the same time period versus time 92, the signals including:

a. The initial value 977 for the VCO 3, corresponding to the desired output frequency of output signal 33 (this is the signal 782 in FIG. 17);

b. The reference signal 914, representing the instantaneous value of bus 14;

c. The VCO-related signal 974, representing the negative or complementary value of the instantaneous value of bus 44 after normalization.

The signals as detailed correspond to a jump in frequency at time 928. Prior to the frequency jump, the initial VCO setting 977 is kept at a constant value corresponding to the information in controller 77 relating to the required VCO control voltage for that frequency. The closed loop corrects that value to precisely set the VCO to the required frequency, this being indicated in the example with the time delay 927 between reference 914 and VCO counter signal 974. If an integrator is used in the loop, the time difference 927 will disappear in the steady state.

At time 928, the initial voltage 977 to VCO is changed by controller 77 to the required value for a new frequency setting. The signals 914 and 974 are set to their initial values, that correspond to a zero phase error.

For reference signal 914 this is the first or zero, value. Since the complement 974 of the VCO counter is added to the other signals, the initial value for signal 974 is its highest value.

The sum of all three signals 977, 914 and 974 is basically constant, this being the precise signal to VCO to keep it at the desired frequency. The above sum will change as the loop is closed, to correct for phase or frequency errors in the loop.

2.2 Low phase noise with lower cost components

In prior art PLLs, a high cost VCO having a low phase noise should be used if a low phase noise PLL is required. These PLLs have a low pass filter with a low cutoff frequency Fc (in the range of 1 kHz).

Since PLL phase noise includes reference phase noise below Fc and VCO phase noise above Fc, the VCO phase noise even at low frequencies influences the PLL phase noise.

According to the present invention, a low phase noise PLL can be achieved even when using a low cost VCO that has higher low-frequency phase noise, by using a low pass filter with higher Fc. Thus, VCO phase noise below Fc will not influence the output phase noise. A higher Fc may be used when the PLL includes the fast phase difference measurement unit as detailed in the present disclosure.

2.3 Dynamic correction of VCO table

A controller 77 storing the characteristics of the VCO was detailed above, that is controller 77 includes a table with values of control voltage corresponding to a plurality of frequency values. Even if precise values are stored initially, it is expected that VCO characteristics may change because of drift with time, temperature or other factors. According to the present invention, controller 77 may measure the actual characteristics of the VCO during the PLL operation and update the VCO characteristics in real time, so that subsequent VCO settings will be closer to the final value and the frequency settling time will be faster.

FIG. 9A and 9B illustrate a method to correct the table with VCO information in the controller 77. FIG. 9A details correction of VCO characteristic table following a measurement 971 close to the upper end of the frequency range.

Controller 77 holds a table with values of Control voltage 961 to VCO versus frequency axis 962. Curve 963 indicates the characteristic table prior to update, and curve 964—the characteristic table after update. As illustrated, controller 77 performs a mathematical transform equivalent to the rotation of curve 963 about an axis near the low frequency end, so that new curve 964 will pass through the measured point 971. This is a good correction of the VCO based on available information. The new curve 964 will serve for VCO initial settings in subsequent frequency hops, until newer updates of the VCO characteristics are available.

In case that a measurement of VCO at a low end point 972 is performed, then curve 963 is rotated about an axis near the high end, in a method similar to that detailed above.

FIG. 9B details the correction of VCO characteristic table following a measurement 974 near the middle of the frequency range.

In this case, a good update method may include shifting the VCO curve 963 so as to pass through the point 974, with curve 964 indicating the updated VCO table. The control voltage to the VCO may include the voltage out of the DAC (loop error) plus the initial setting value from controller 77.

Furthermore, a channel may be implemented (not shown) to read the actual value of the input to VCO to controller 77. The digital value of the phase error (input to loop DAC) may be used instead. This value may be used in controller 77 to update the table with the characteristics of VCO 3.

2.4 Several VCOs for staggered operation

Figure 10:
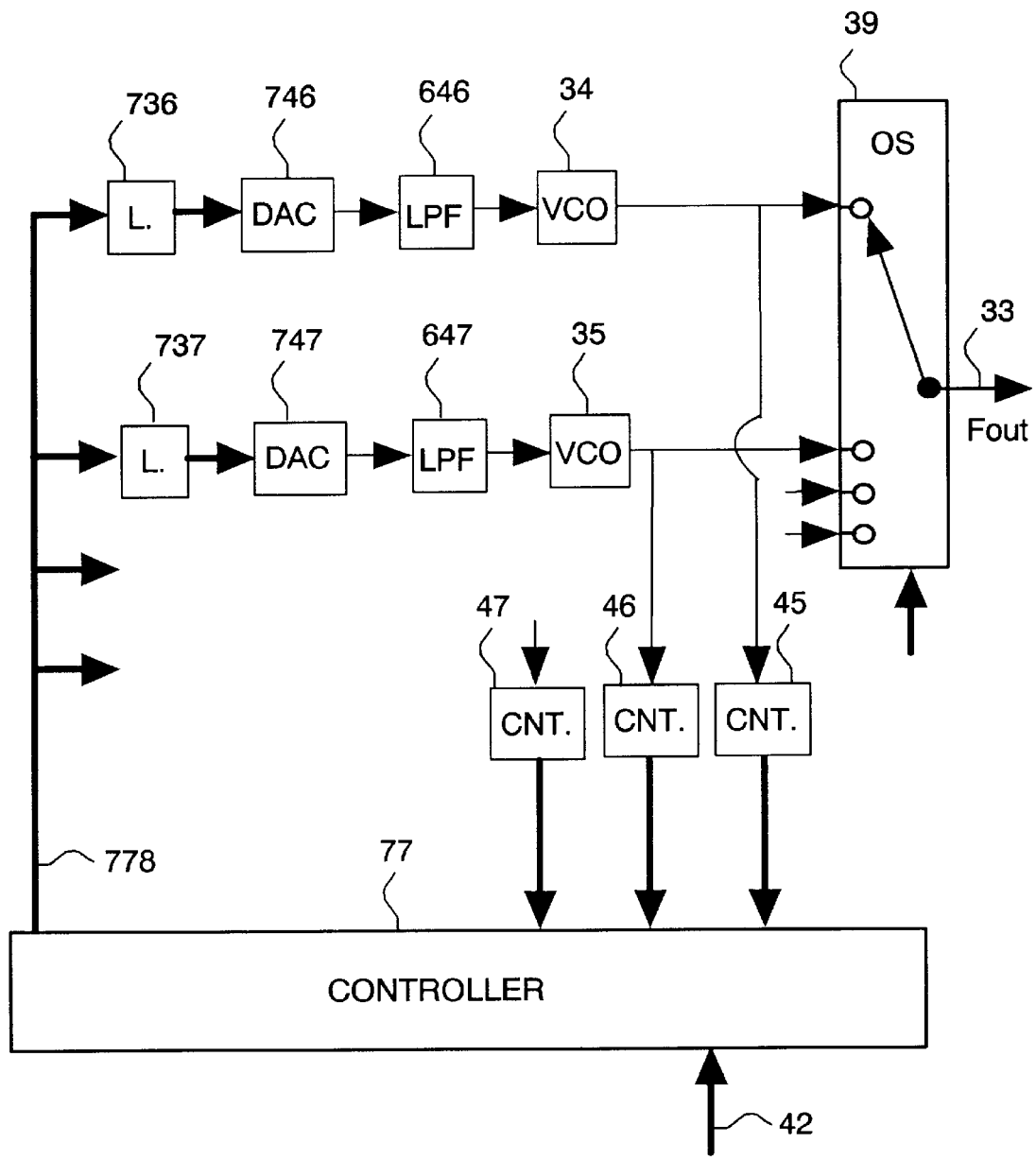
FIG. 10 details the structure of a synthesizer with several VCOs in a staggered mode of operation.

FIG. 10 illustrates a simple synthesizer structure using a plurality of VCOs 34, 35 etc., to achieve faster frequency hopping than that possible with just one VCO. Each VCO has its own loop components, for example VCOs 34 and 35 having LPF 646 and 647 and counters 45 and 46, respectively. A common controller 77 may be used to close several VCO loops, with the controller sequentially reading the values in counters 45, 46, 47 etc., computing the VCO control to be applied to each unit and applying that control through a bus 778 to a corresponding latch 736, 737 etc.

Latches 736, 737 keep the control voltage to be applied to each VCO between updates by the controller 77.

In another embodiment (not shown), each of the loops like that including components 736, 746, 34 and 45 is replaced with a structure as that detailed in FIG. 2 or 6 or 7. In these structures, controller 77 does not take part in each loop, but only sets the parameters for each frequency of operation. A more complex, higher performance structure may be achieved. In any case, the staggered synthesizer includes that PLL structure together with a controller 77 and an output selector 39.

Selector 39 is an RF switch, preferably a solid state device, capable of connecting the output of any VCO 34, 35 etc. to the output 33.

Figure 11:
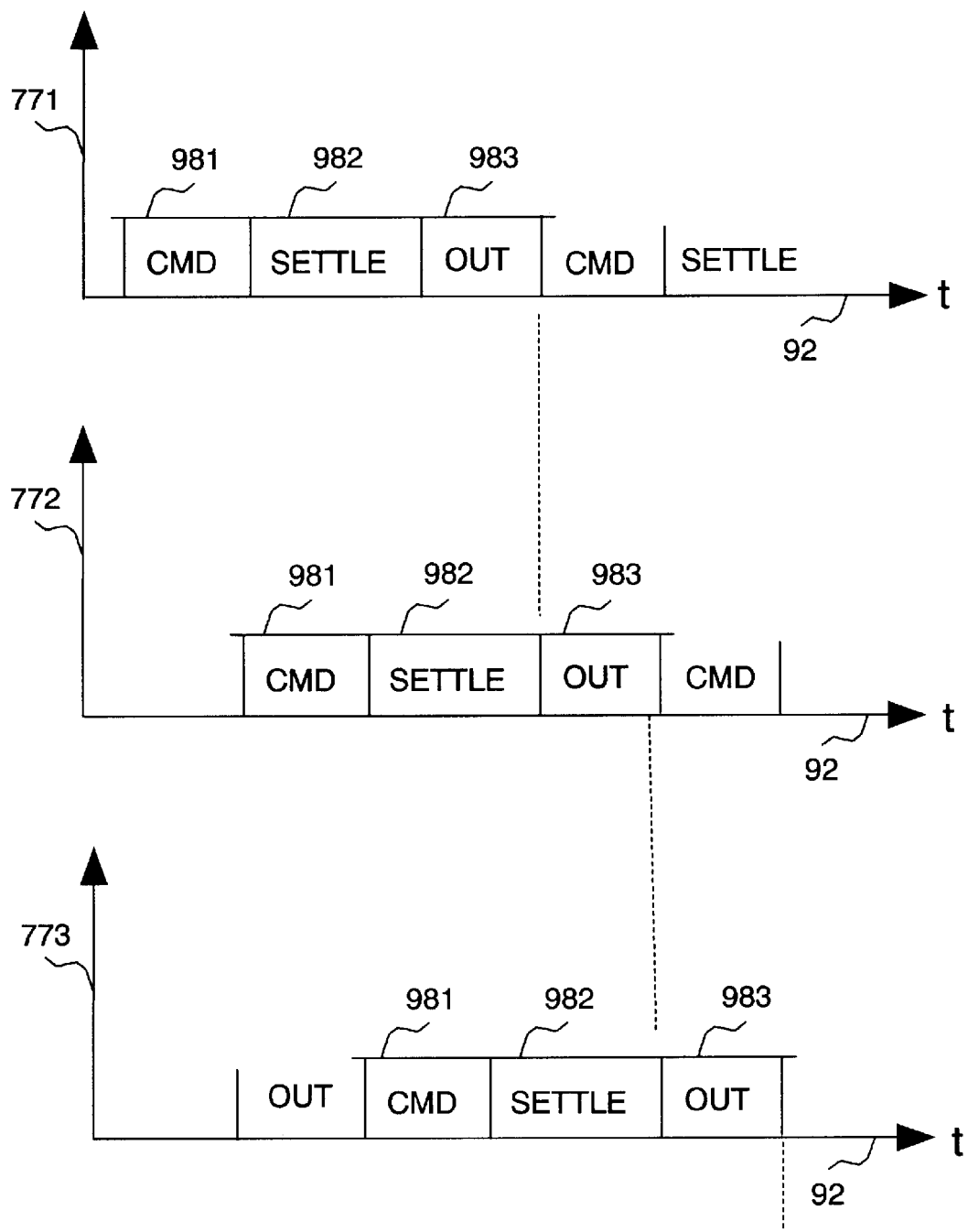
FIG. 11 details the relative timing for several VCOs in a staggered mode of operation.

The operation of the synthesizer in FIG. 10 will now be detailed with reference to FIG. 11, which details the signals in the synthesizer and their relative timing.

The horizontal axis 92 represents time in all three graphs. The three graphs describe processes that take place concurrently, at the same time. These include the states diagram 771 for first VCO 34 (see FIG. 10), the states diagram 772 for second VCO 35 and the states diagram 773 for a third VCO (not shown).

Each VCO loop undergoes three stages sequentially and continuously, as follows: A first stage 981 is a command to set VCO to a new frequency Fi; second stage 982 is to close loop with such parameters so as to bring VCO to the desired frequency Fi. There is a time transient, as the frequency of the VCO draws nearer and nearer to the desired value. During a third stage 983, the VCO is phase-locked at frequency Fi and its output is connected to the output of the synthesizer, to become the output signal 33.

The time-consuming stage is second stage 982, since it takes a time T2 for the phase-locked loop to bring the VCO to the desired frequency. The first stage 981 is short, it requires a short time T1 to set up the parameters for the loop to lock at a new frequency. This stage may take about 100 nanoseconds to 1 microsecond, according to the implementation. The duration T3 of the third stage 983 is s et according to system requirements—each application requires that the synthesizer operate at a given frequency Fi for a time period Tf. This is the frequency hopping rate.

Each VCO loop undergoes the same stages 981, 982, 983 and back to 981, 982 etc., all the time. There is a time difference between the loops, which is equal to the duration T3 of the third stage. Thus, while the first VCO is driving the output 33, the second VCO is completing the settling time and its output will be coupled to output 33 after a time period T3. At the same time, a third VCO may be in the initial stage of settling to a new frequency, and a fourth VCO may be in the first stage, with parameters for a new frequency being prepared.

The novel approach is that each VCO is activated to a new frequency after a T3 time delay from the previous one, so each VCO will be ready to be connected to the common output after a time T3 from the previous VCO. This is precisely what is required in order that the system as a whole will switch to a new frequency each time interval T3.

For example, let us assume that a frequency hopping rate of 500 kHz is required, that is T3=2 microseconds. Let us also assume that the settling time of each VCO loop is T2=18 microseconds, and that the first stage time T1 is negligible. In this case, nine VCO units in nine phase-locked loops are required, each VCO driving the common output 33 for a time period of 2 microseconds. Each VCO is driven to a new frequency after a 2 microseconds delay from the previous VCO. If a frequency hopping rate of 1 MHz were required, 18 VCO units would be required, together with a controller fast enough to drive all these VCOs. Alternately, several controllers may be used.

In a general case, the number of VCOs would be Nvco=(T1+T2+T3+Tx)/T3, where Tx denotes additional time periods required to switch from one frequency to the next.

A common controller 77 may drive all the VCO loops on a time-sharing basis. That is, the controller 77 allocates a time slice to compute the control equation for each of the VCOs and to close the loop therefor.

Thus, the staggered VCO structure may be advantageously used to achieve a fast frequency hopping rate, much faster than that achievable with a single VCO. As the number of VCOs and related components is increased, the achievable synthesizer hopping rate is higher. As a minimum, two VCO loops are used, so that one is settling to a new frequency while the other is connected to the output.

2.5 Close PLL loop with zero phase error

According to the present invention, a PLL loop is closed with zero phase error, using an integrator (or PID) 64 in the loop. This is applicable to any of the structures illustrated in FIGS. 2, 6, 7, 10, 13, 17 to 19 and 21 to 25.

This zero phase error is important to coherent frequency hopping COFH as detailed below. To achieve coherent frequency hopping COFH, it is required that the phase at each frequency be controlled. In one embodiment, each chosen frequency is phase coherent with the reference. If phase coherency is achieved, then a better performance FH will result. Otherwise, signals at various frequencies will add at a random phase, to achieve a lower performance.

PLL systems in the art usually do not include an integrator in the loop, since this would slow down the PLL which is already very slow, in the millisecond range. A FH PLL with such a slow response would be impractical in any case, since a faster hopping rate is required in wireless.

Using the fast phase detector as disclosed in the present invention may allow the use of an integrator in the loop while keeping the PLL fast enough for practical uses.

In prior art PLLs without an integrator in the loop, for each desired frequency the loop will lock at a different phase between reference and VCO, this phase corresponding to the voltage to VCO required to keep the VCO at that frequency. In the new PLL with an integrator 64, an initial phase error will develop which will change the output of the integrator to be at the required value to set the VCO at the desired frequency. As the VCO nears the required frequency, the phase error nears zero. The operation of the PLL is in accordance with laws governing closed loop control systems with an integrator in the loop.

Thus, a PLL with zero phase error in the locked state is achieved. In another embodiment, a predefined phase error is achieved when the loop is locked. The value of the phase error is not important as long as it is a known value which may be replicated in another PLL.

3. A Wireless Communication System

A wireless communication system using the zero phase error together with other novel PLL features may achieve superior performance.

3.1 A coherent FH wireless system

The importance of the zero phase error will become apparent when one considers the possibility of coherently adding signals at different frequencies. A FH system changes the transmitted frequency each time interval Th, according to a predefined sequence. In the receiver, a synthesizer changes its frequency according to the same sequence, so a zero or fixed intermidiate frequence (IF) received frequency is achieved. A disadvantage of presently used FH systems is that signals at different frequencies, from different time intervals Th, add noncoherently. It is known that coherent addition of signals results in better system performance than noncoherent addition. Better performance includes better signal to noise ratio and better interference rejection.

Taking an innovative approach, a method and system were devised to allow coherent (in phase) summation of signals transmitted at different frequencies, as detailed below.

Figure 12:
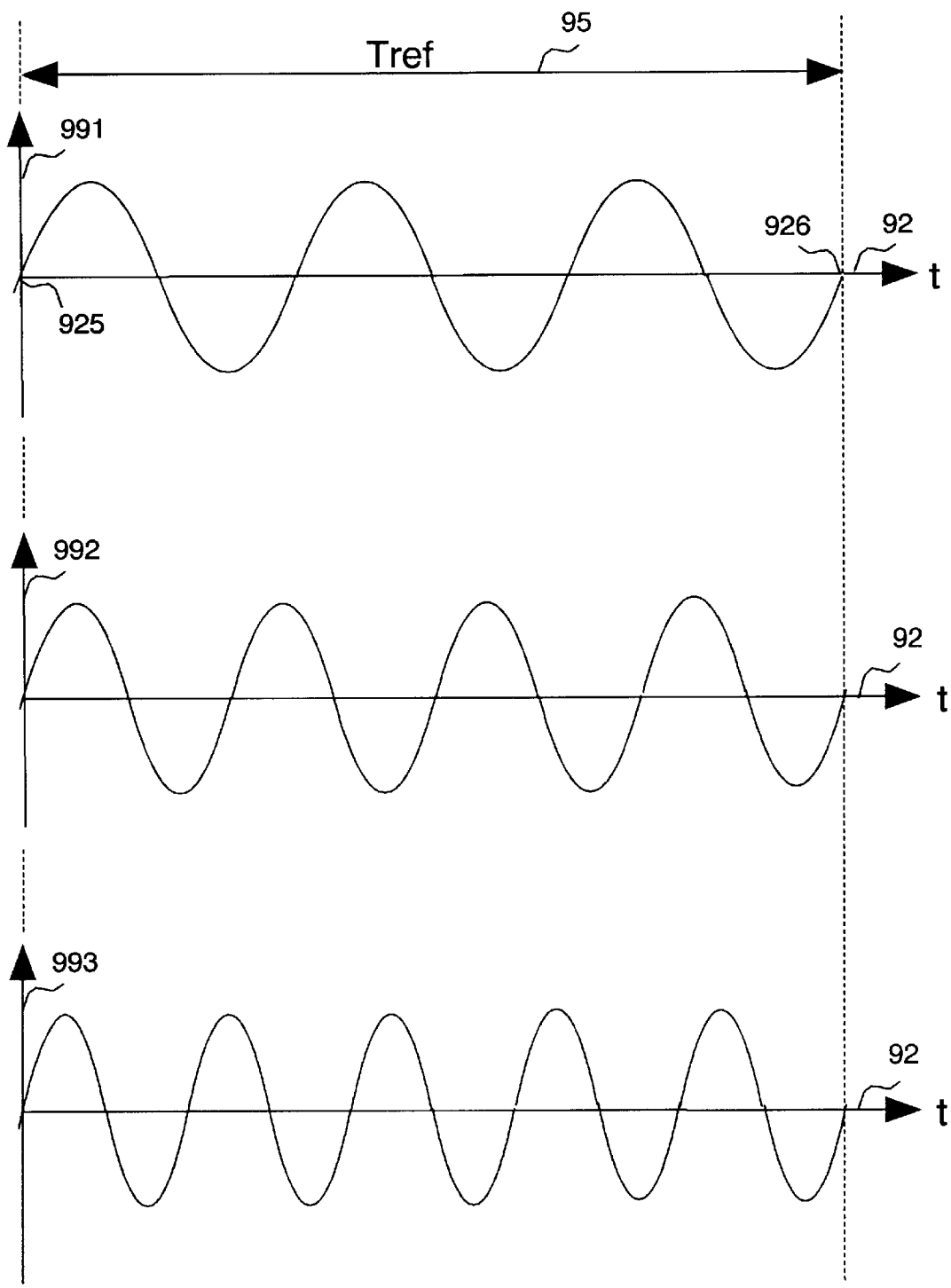
FIG. 12 illustrates the coherency of a plurality of signals each at a different frequency.

FIG. 12 illustrates the coherency property of a plurality of signals, each at a different frequency. The horizontal axis 92 represents time in all three graphs. The graphs describe processes that take place concurrently, at the same time. The signals 991, 992 and 993 have a frequency F1, F2 and F3 respectively, where each frequency is a multiple of the reference Fref. In other words, each time interval 95 equal to Tref=1/Fref includes an integer number of cycles of the signals 991, 992 and 993, illustrated as 3, 4 and 5 cycles respectively.

This is a result of the basic operation of a PLL.

In the embodiment as illustrated, all the signals are in phase at time points 925, 926 etc., which are Tref apart. These signals correspond to a PLL with zero phase error in the steady state as detailed above. In another embodiment (not shown) each signal may have a specific, predefined phase at the time points 925, 926 etc.

What is important that the phase have a specific, known value at specific points in time which are equally spaced a specific time interval therebetween.

This allows coherent frequency hopping between a transmitter and a receiver, where both units hop in frequency in synchronization, and after mixing the resulting signal has a fixed intermidiate frequency (IF) and a fixed phase. That is, the IF signals from several transmitted frequencies will have the same phase and can thus be added coherently.

By contrast, in existing frequency hopping systems the phase in each frequency is at random with respect to that in the other frequencies, so that only a noncoherent addition of the signals can be performed.

All the possible frequencies generated in the PLL, like signals 991, 992 and 992, are multiple of a subharmonic frequency Fref corresponding to Tref according to Fref=1/Tref Of course coherent addition of signals is much preferred over noncoherent addition, since coherent integration achieves better performance.

Figure 13:
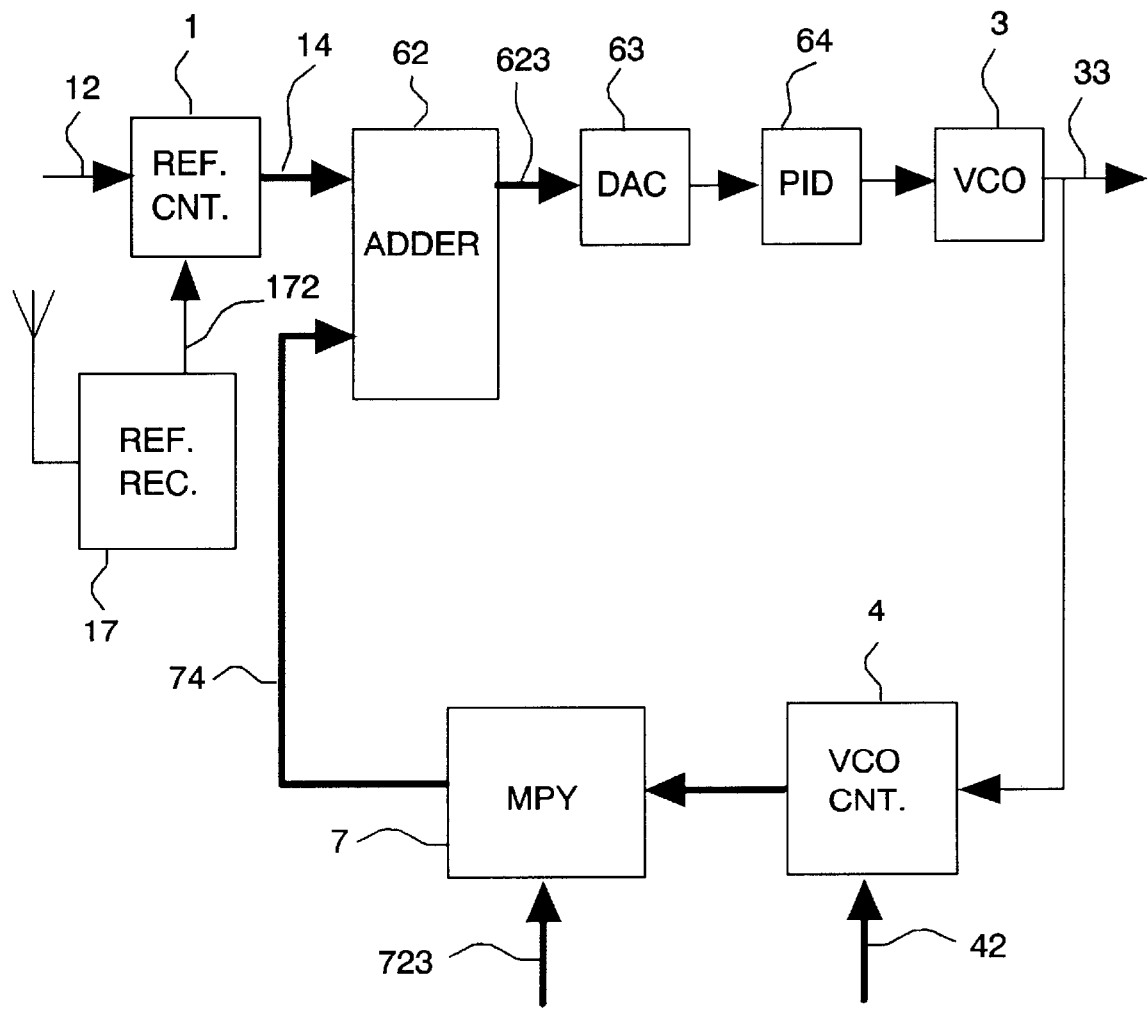
FIG. 13 details a PLL for coherent FH, for a coherent FH/CDMA cellular system.

FIG. 13 details a PLL for coherent FH, for a coherent FH/CDMA cellular system. It describes a structure to achieve a PLL which is synchronized in timing with another PLL. For coherent FH, it is not enough that one PLL have zero (or some predefined value) phase error. Rather, it is required that two such PLLs be used, one for transmission and the other for reception, where the Tref intervals of both PLLs are synchronized and occur in phase.

This allows a PLL in a wireless receiver to be synchronized with respect to the Tref time interval 95 with a PLL in a transmitter. The structure is similar to that detailed above with reference to FIG. 2, including reference counter 1 with its clock input 12 and reference counter output bus 14, a digital phase detector 62, a normalized VCO counter bus 74, phase difference bus 623, DAC 63, low pass filter or PID 64, VCO 3 with its output signal 33.

The structure further includes a VCO counter 4, set frequency bus 42, scaling means 7, normalized VCO counter bus 74 and scaling coefficient bus 723. Alternately, another of the PLL structures detailed in FIGS. 6, 7 or 10 may be used.

A novel feature in the PLL in FIG. 13 is the reference signal receiver 17, used to receive a signal indicative of the phase of Tref in a transmitter PLL (not shown). Receiver 17 generates a reference sync signal 172 responsive to the received Fref signal, with signal 172 being applied to the local reference counter 1 to synchronize it to the reference counter in the transmitter. For example, receiver 17 may receive a pulse at the start of each cycle of Tref in the transmitter and generate a pulse used as a reset input to counter 1. Counter 1 in the local PLL then starts a new cycle each time the corresponding reference counter in the transmitter starts a new cycle. Thus the reference intervals Tref in the receiver PLL are synchronized with the Tref intervals in the transmitter PLL. In another embodiment, counter 1 is synchronized at longer intervals, not each Tref.

In another embodiment, there is no receiver 17, but a specific frequency or a pattern of frequencies in the receive channel 12 are used to transmit the synchronization signal for Tref. Further synchronization circuits, illustrated in FIGS. 23 to 25 for example, may be used to synchronize the PLL to the period of Tref.

Assuming the transmitter and receiver perform a synchronous FH protocol, the above structure will ensure that the various frequency samples will be added in phase, as follows: In the transmitter, each time interval Th (hop interval) the loop will operate at some frequency Fj. During the same interval, the receiver loop will be at the same frequency Fj or at a frequency at a fixed spacing thereof, like Fj+Fif. In any case, the signals in receiver and transmitter will be in phase, since they both started with phase zero at some time 925 (FIG. 12), and the time intervals 95 or Tref at the transmitter and receiver are synchronized. Therefore, the video or IF samples of various time intervals Th will add in phase, even though each time Th a different frequency is transmitted.

In a possible embodiment of a wireless system (not shown), receiver 17 is adapted to only receive a narrowband signal indicative of the timing of Tref in the transmitter, like a CW signal with a simple modulation with the Fref signal, or an interrupted CW signal which is 100% modulated with Fref. A simple PLL may be used to extract the signal at Fref.

A threshold element like a comparator may be used to create a logic pulse each time interval Tref, which may be connected to the Reset or Parallel Load input of the reference counter 1. This ensures that counter 1 starts with a specific timing relative to the received Fref signal.

Figure 14:
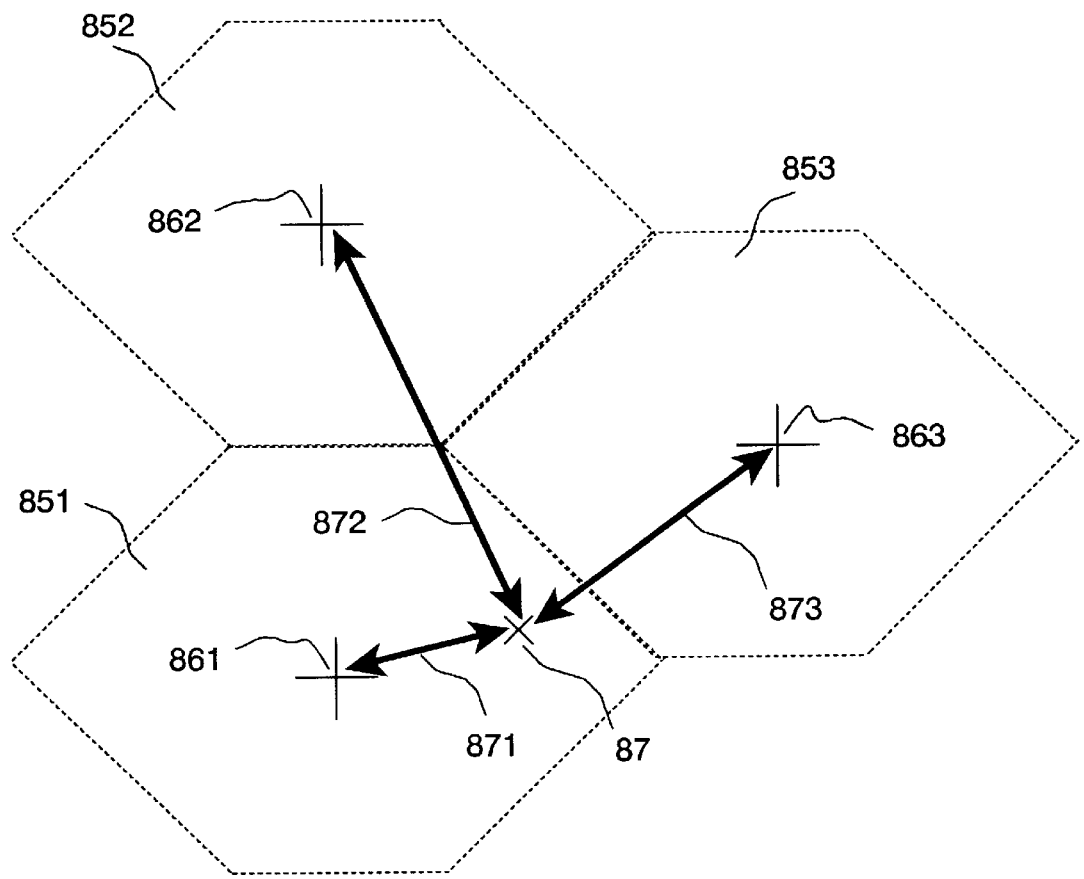
FIG. 14 illustrates a coherent FH/CDMA cellular system.

The coherent FH is further detailed with reference to FIG. 14, which illustrates a coherent FH/CDMA cellular system.

Wireless cells 851, 852, 853 include each a base station 861, 862, 863 respectively. A mobile wireless transceiver 87 is located in cell 851, having transceiver distances 871, 872 and 873 from base stations 861, 862 and 863 respectively.

According to the present embodiment, each base station operates on a wideband data/information channel which is FH-coded for example, and a narrowband reference signal, where the Fref reference is transmitted. Adjacent base stations like 861, 862, 863 may share the same information channel but each transmits a different, distinguishable reference signal, for example using a reference channel at a different frequency.

Until now, channel coding was uni-dimensional: in PN-CDMA a plurality of transceivers share the same carrier frequency, only each uses a different phase modulation code for that carrier. In FH-CDMA a plurality of transceivers all use the same set of discrete frequencies, only each uses a different frequency at any given moment (actually the frequencies are different most of the time, since some collisions cannot be avoided). According to the new invention, the coding is bi-dimensional: The coding process controls both the frequency and the phase in each code bit in a coherent FH scheme. Thus, even when two transceivers collide into using the same frequency, the interference will be reduced since the other's signal will have a random phase whereas the desired signal will have the optimal phase for coherent integration.

The operation of the coherent FH will now be detailed with reference to FIG. 14 as follows: Assuming that transceiver 87 is assigned to cell 851, it will tune its reference receiver to the channel with the reference signal for base station 861.

The reference signal arrives at unit 87 with a time delay according to the distance 871 to base station 861, and the information signals arrive to unit 87 with the same time delay. Thus, once unit 87 is synchronized with respect to Tref interval, the various frequencies received from base station 861 will have a phase precisely related to that interval Tref, and will be added in phase (coherently) in the receiver there.

Even though the distance 871 to base 861 may change as the mobile user moves in the area, the time delay for the reference signal and the information channel received will be the same, so that the received reference Fref and the frequency hopping remain precisely synchronized. The distance 872 to another base station 862, however, may take any value and there will be a random time delay difference between the received timing of information frame Fref from base 862 and base 861.

In the description relating to FIG. 13 above, the requirement that the time intervals 95 or Tref at the transmitter and receiver are synchronized refers to a situation where the Tref interval 95 in the receiver starts at a moment when an indication of the start of the corresponding Tref interval 95 in the transmitter is received in the receiver. There is a time delay stemming from the time of waves propagation between transmitter and receiver, but this is of no consequence since it is the same delay for reference and frequency hopping signals.

An example will illustrate how sensitive the phase is to distance: Assuming a frequency range of 869 to 894 MHz, that is a range of 25 MHz as used in AMPS or the IS-54 standard, one may ask what is the time delay which will cause a 360 degrees phase shift between frequencies at the two ends of the above range. For a 25 MHz range, a time delay of $1/25$ MHz=40 nanosecond will cause that phase shift. For waves propagating at the velocity of light, this corresponds to a change in distance of 12 meter.

Thus, if in some location of unit 87 it will receive signals in phase from base 862, then as the distance 872 changes by 6 meters the signals at the end of the spectral range will not be in phase anymore, but will be in antiphase, and the frequencies in between will assume various phases.

At a displacement of 12 meters the signals at extreme frequencies will again be in phase, but the signals in between will be in antiphase or at various phase differences. Only for specific locations the signals from bases 862 and 863 will add coherently; for all other locations, these signals will not add in phase, so the interference from the other cells is reduced.

For signals received from the desired base station 861, however, there is the same delay for the reference signal and the frequency hopping data channel, that is the delay corresponding to the distance 871. Thus, the frequency hopping signals will be added in phase (coherently) even though the distance 871 may change at will.

Thus, interference from adjacent cells is reduced even though all the cells use the same frequency Tref and a zero phase for each frequency in the FH code set. These variables may be changed, however, to further reduce interference between users in a cellular system. For example, each cell may add a predefined phase difference PHi to each frequency Fi according to a predefined phase coding sequence. Since each cell is usually surrounded by other six cells, seven such phase codes are enough to prevent code collision between adjacent cells. A mobile device 87 in a cell 851 is set to add a phase sequence PHi corresponding to that of base 861 it is communicating with.

In this scheme, receiving several frequency chips Fi in phase (coherently) is extremely improbable, since it was already explained that even for zero phase frequency hops there will be just a small part of the possible locations for unit 87 that it will receive different frequencies Fi in phase from other bases; now, with the different phase coding, even in those locations the phase of the different frequency components will differ and will not add coherently.

In a practical implementation, there may arise a time difference between the reference channel (see FIG. 13) and the information channel, because of the different bandwidth or processing in the two channels. A person skilled in the art will know, however, how to compensate for these delays after being presented with the design guidelines in the present disclosure.

Throughout the present disclosure, the DACs 63, 145 and 7455 are preferably asynchronous, their output changing when its input changes, after some time delay but without a clock. For example, the DAC-08 or DAC-10 manufactured by Analog Devices Inc. may be used.

The frequency at output 33 is only determined by clock 12 and the modulo count of counters 1 and 4. The number of bits compared in buses 14 and 74 will not influence that frequency, but only the settling time and the phase noise.

Novel Phase Detector for Various Uses

Figure 15:
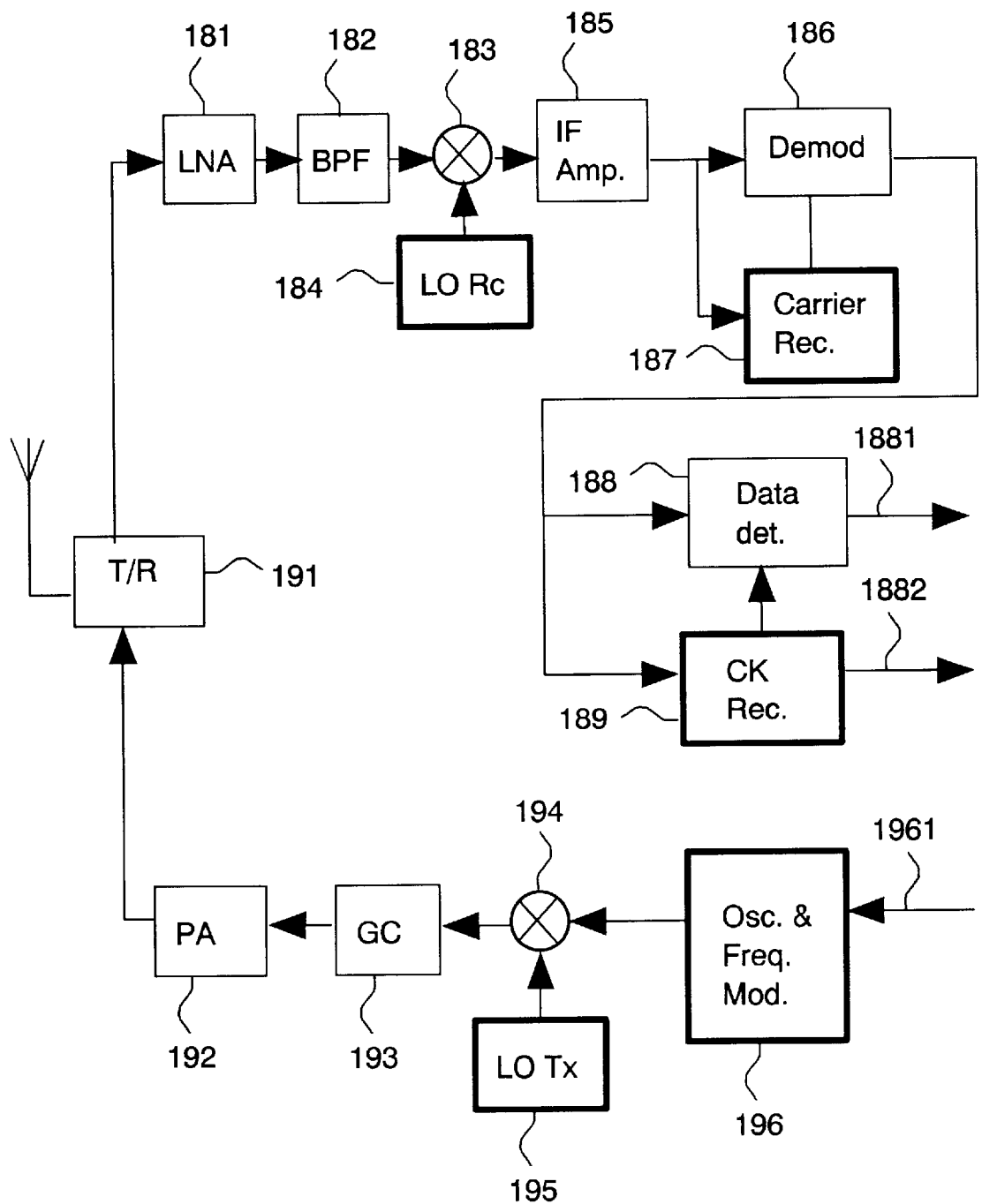
FIG. 15 details a block diagram of transmitter/receiver with new PLLs.

The present invention discloses the uses of a novel phase detector and a new PLL in various applications in communications and wireless. Examples of these applications are illustrated in FIG. 15, which details the structure of a typical wireless transceiver, with the improved blocks in thick lines. The transmit and receive channels are connected to the antenna through a transmit/receive T/R switch 191. The receive channel includes a low noise amplifier LNA 181, a band pass filter BPF 182 and a mixer 183 to generate an IF signal with the local oscillator LO (receive) 184. An improved LO 184 can be implemented with the PLL or synthesizer as detailed with reference to FIGS. 2, 6, 7, 10, 13, 17, 18 or 22. The new PLL achieves lower phase noise and fast frequency hopping to improve the receiver performance.

The received signal is amplified in IF amplifier 185 and is then detected in demodulator 186. For efficient (coherent) detection, a reference is required. This reference is generated in the carrier recovery unit 187. Carrier recovery is difficult in presently suppressed carrier systems, where there is no carrier at all. Mutual interference between users in cellular makes the task all the more difficult. An improved unit 187 can be implemented with a modified PLL as disclosed with reference to FIGS. 23, 24 and 25. As a clean reference signal is required for demodulation, one can appreciate the contribution of the improved carrier recovery unit on the overall performance of the receiver.

In prior art embodiments, a PLL directly tracks a modulated signal. This may achieve a good performance with a simple circuit implementation. There is a problem, however, that PLLs at present are slow and cannot track efficiently fast changing input signals. A novel PLL, using a digital phase detector with computations in the complex domain, can better track such fast changing signals. The new PLL is detailed in FIGS. 21 and 22, with the novel phase detector being detailed in FIG. 20.

The baseband signal out of demodulator 186 (FIG. 15) usually contains the data and clock in one common line, for efficient transmission. These are usually separated in a data detector 188 and a clock recovery unit 189, to generate the data out 1881 and clock out 1882 signals respectively. An improved clock recovery unit 189 can be implemented with a modified PLL as disclosed with reference to FIGS. 23, 24 and 25. A well synchronized clock is paramount for reliable data extraction with a low BER.

In the transmit channel, a transmit oscillator/modulator 196 generates an RF signal with the desired modulation according to a data input (to transmit) 1961. FM is widely used in cellular, like GSM and DECT. A high performance FM modulator is detailed with reference to FIG. 19.

The transmit signal is converted to the transmit frequency in the up converter 194, by mixing with the LO (transmit) 195. An improved LO 195 can be implemented with the PLL or synthesizer as detailed with reference to FIGS. 2, 6, 7, 10, 13, 17, 18 or 22. The new PLL achieves lower phase noise and fast frequency hopping to improve the transmitter performance.

In other implementations of cellular, like in DECT, one common LO is used in transmit and receive. The PLL is required to switch fast its frequency between transmit and receive, a difficult to implement task in presently used PLLs.

The transmitted signal is further processed in the gain control unit 193 and is amplified in power amplifier 192 prior to transmission.

FIG. 17 details a PLL with an adder 48 that replaces the VCO counter 4 and normalizing means 7 illustrated in FIG. 2 A reference counter 1 counts the clock input 12 cycles to generate a reference counter bus 14. A digital phase detector 62 may include an asynchronous digital subtractor, for example the TTL component 7483, that is a 4-bit full adder using only digital gates like and, or nor—there are no clocked elements, no input clock. Rather, as there is no input clock, the output changes in response to any change in input, after a specific time delay.

One should remember that the VCO value should be subtracted, whereas the component 7483 is an adder. A subtraction is easily implemented digitally, for example with means in unit 62 to subtract the value on input 740 (like a 2's complement inverter), or with the addition of a negative value (this requires that the value on bus 740 be negative).

The value of phase difference bus 623 equals bus 14 minus bus 740. The value on bus 623 is converted to analog in DAC 63 and is then applied through low pass filter 64 (or PID) to a VCO 3, to close the PLL. The VCO 3 generates the output signal 33.

The normalized VCO bus 740 is generated in the digital adder 48, that replaces the counter 4 and normalizing means 7 in FIGS. 2 and 7. A first input 741 to the adder is derived from normalized bus 740. A second input 742 to the adder, the increment value delta_V to add each clock 749, sets the frequency of the PLL. The clock input 749 activates the adder 48 to update its output 740 by adding increment 742 to the current value of output bus 740. Clock 749 equals the VCO output 33, or is derived from it, for example using a frequency division with a prescaler (not shown).

Thus, the output of adder 48 will increase by a fixed value for each cycle of clock 749. This is similar to the function of counter 4 and normalizing means 7 in FIG. 2 where, for each cycle of clock 33, counter 4 increments by one and the value of bus 74 increases by a fixed amount as determined by the multiplication coefficient 723. The frequency in the present circuit is set by the value delta_V 742, in a fashion similar to the effect of the coefficient 723 in FIG. 2 as detailed above.

The controller 77 sets the value of delta_V and the initial value to VCO 782 through a DAC 78, responsive to a frequency control command 784 input. The control voltage to the VCO 3 is a value responsive to the voltage output of LPF 64 and the voltage 782 out of DAC 78. A voltage summing circuit or a current summing circuit may be implemented, or a combination thereof.

The setting of the initial value 782 is optional; without this channel, the closed loop will eventually develop a correction voltage to VCO 3 to bring it to a new frequency as desired. However, the DAC 78 can speed up the settling to a new frequency, it acting as a sort of feedforward channel: By immediately setting the VCO to a new value, the settling time of the loop is decreased—the loop only needs to correct for the error in that initial setting. Note that the response time of the loop is limited by the LPF 64, whereas the effect of a change in signal 782 can be much faster, since there is no low pass filter, and a sub-microsecond response time of the VCO may be achieved.

Note: A circuit for initial setting of the VCO as detailed above may be advantageously used in the various PLLs detailed in the present disclosure.

A reset buses signal 783 is preferably used to reset the counter 1 and the adder 48 output buses to their initial value, that corresponds to a perfect phase lock (no phase error), when switching to a new frequency. The signal is generated in controller 77. This further increases the speed of hopping to a new frequency.

Note: A circuit with means to reset the counters and/or adders and/or other bus forming means when switching to a new frequency may be advantageously used in the various PLLs detailed in the present disclosure.

Advantages

The above detailed system can change the frequency while remaining locked, since there are no discontinuities in the phase difference—the value on bus 740 does not jump when the frequency is changed.

The change in the value of the increment 742 to add will take effect gradually, during future cycles of the clock 749.

A fast frequency change can be implemented, that can be used in fast PLLs to track an input signal or to implement a fast frequency modulation.

A digital adder may be lower cost to implement than a multiplier.

Overflow detector means (not shown) may be added to correct the effects of overflow, as detailed elsewhere in the present disclosure.

Figure 18:
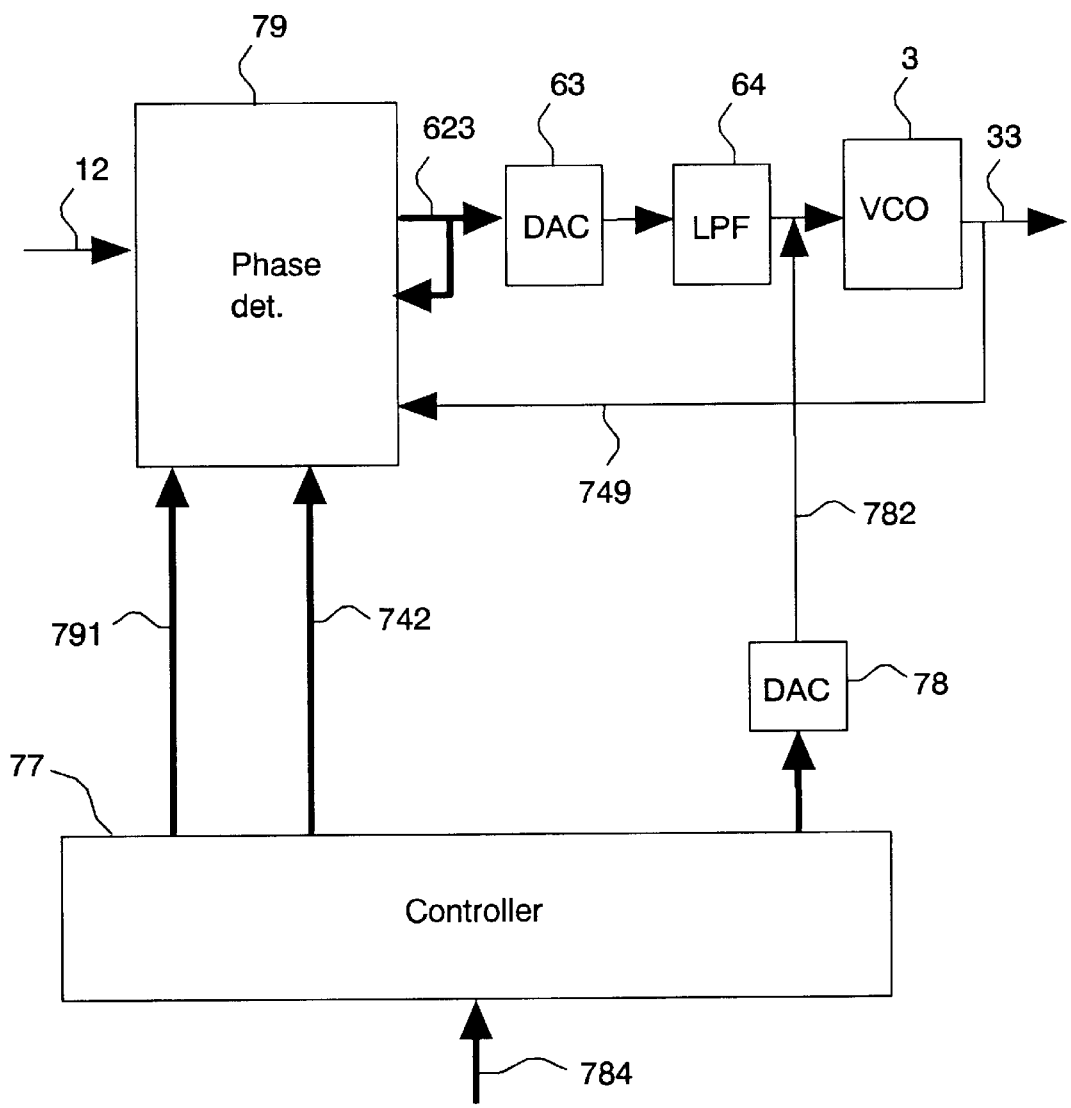
FIG. 18 details a PLL with adder to replace both counters

FIG. 18 details a PLL with a common adder 79 to replace the two counters 1 and 4, the normalization means 7 and the digital phase detector 62 in FIG. 2. The overall effect of the above components in FIG. 2 is to increase by one the value of bus 623 for each clock 12, and to decrease by a certain amount (as set by bus 723) the value of bus 623 for each clock 33.

The common adder 79 achieves a similar effect in one unit, since in this implementation the value of bus 623 will increase by a fixed value delta_R 791 for each cycle of clock 12. Similarly, the value of bus 623 will increase by a fixed value delta_V 742 for each cycle of clock 749.

Whereas the description refers to one cycle of a clock it should be understood that, throughout the present disclosure, a circuit may be made to be responsive to a complete cycle of the clock, a leading or trailing edge of a clock or any combination thereof. A DSP may be used, that has inputs programmable to respond to a level or an edge of an input signal, and to choose the desired edge (leading or trailing edge). Otherwise, the function may be implemented in hardware or software.

The frequency of VCO 3 in the present circuit is set by the values of delta_R 791 and delta_V 742, in a fashion similar to the effect of the coefficient 723 in FIG. 2 as detailed above.

A fast circuit implementation of the above is preferred, to respond fast to clocks 12 and 749 at its input.

The adder 79 may be implemented with various means, for example a dedicated hardware circuit with several TTL adders like the 74F283 and additional logic components, or a DSP controlled with a program that tests two input lines 12 and 749 and adds one of the two values 791 or 742 respectively when a change or an edge in one of these lines is detected.

The DSP may also respond to a simultaneous change in both lines, by adding the sum of the values in buses 791 and 742. For a DSP implementation, the values in buses 791 and 742 may be stored in registers therein, for faster response. In that case, there is no need to actually implement the buses 791 and 742 in hardware. Rather, a simple channel may be used to transfer the desired values from controller 77 to the DSP when a new frequency is required.

A DAC 63 converts the value on bus 623 to an analog signal that is passed to VCO 3 through LPF 64. The VCO 3 generates the output signal 33 The clock signals 12 and 749 may activate the adder 79 on the leading or trailing edge or both.

A controller 77 determines the frequency at the output 33 by setting the values of delta_V, delta_R and the initial value to VCO 782 through DAC 78, all responsive to a frequency control command 784 input.

Advantages

The circuit can switch frequency while remaining locked, since the phase difference 623 does not jump, but only the addition coefficients (deltas) change.

Overflow detector means may not be required, since the alternate additions of positive/negative values tend to keep the bus 623 within the required limits (this is the phase difference itself, that varies about zero or a predefined value).

A simpler circuit may be implemented, since one computer means 79 may perform all the required computations.

Figure 19:
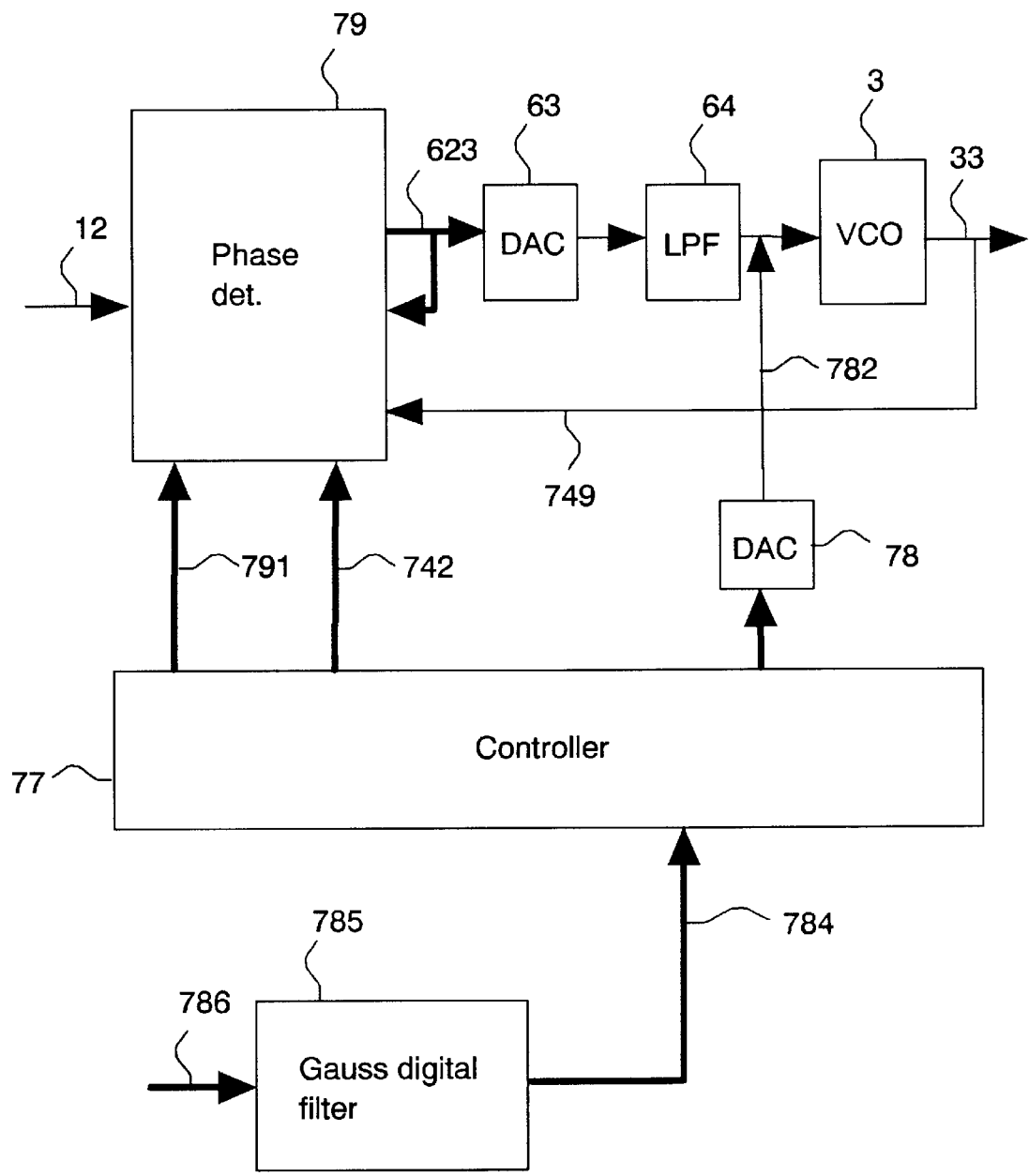
FIG. 19 illustrates a frequency modulator using the novel PLL

FIG. 19 details a novel PLL used as a frequency modulator FM. FM is used in various wireless standards, like GSM and DECT. To achieve a better utilization of the frequency spectrum, there is no sudden change in frequency. Rather, a gradual frequency transition is implemented, using a premodulation Gaussian filtered digital FM system. The resulting modulation is the Gaussian Filtered FSK or GFSK.

At present, it is difficult to implement a modulator for GFSK with precise control of the frequency: If an open loop circuit is used to control a VCO, then there may be a drift in the VCO frequency. A precise PLL is difficult to use, because of the slow response of the PLL.

The novel PLL, however, can be used as a frequency modulator where the instantaneous frequency is precisely controlled, and the frequency changes according to an input modulating signal. In the circuit as illustrated, the closed loop ensures that the frequency at the output 33 closely follows the input signal 784. In the example as illustrated, the actual input 786 undergoes filtering in the Gaussian filter 785 to achieve a Gauss modulating spectrum at input 784. Other signal processing may be performed as well.

The actual frequency modulation is performed with controller 77 changing the parameter 742 or 791 or both to phase detector 79. Since the output frequency is responsive to these parameters, any change in one of them will affect that frequency, as detailed in FIG. 18. Unit 79 may use an adder, so that a command to change the frequency on inputs 791 and/or 742 will not result in a phase jump in bus 623. Rather, these parameters will affect the subsequent rate of change in bus 623. This will keep the phase loop locked while the frequency changes to the desired value. The frequency at output 33 depends on the parameters 791 and 742, as well as the input clock 12. Usually, clock 12 is generated in a low phase noise, stable crystal reference.

In the illustrated embodiment, the PLL includes a digital device like a common adder 79 to implement the normalization means and the phase detector. As detailed above, the value at bus 623 is responsive to the clock signals 12 and 749, as well as the corresponding addition parameters to the adder, a first increment delta_R 791 and a second increment delta_V 742 respectively.

The DAC 63 converts the phase difference to an analog signal, to be filtered in LPF 64 and applied to the VCO 3. The output 33 of the VCO is applied to the phase detector 79 to close the loop.

Although the modulator was illustrated with a specific embodiment of the novel PLL, it is to be understood that other of the PLLs detailed in the present disclosure may be used instead.

Throughout the present disclosure, it is to be understood that the digital signal processing may be implemented in hardware or in software or a combination thereof. Either a general-purpose computer hardware can be used, or a special-purpose hardware or DSP. Either separate units may be used for each function, or a common unit may be used on a time-share basis. Moreover, wherever several processes are detailed, like the filter 785 and the phase detector 79, it is to be understood that these operations may be combined together to increase the efficiency of the implementation.

Advantages

Examples of advantages of the above circuit include the following:

A. A fast frequency modulator may be implemented, that precisely follows the input modulating signal. A precise GFSK may be implemented. A precise frequency control at all times is achieved since, although the output frequency follows the modulating signal, the frequency is precisely controlled in a closed loop at all times.

B. The PLL modulator in FIG. 19 achieves a gradual frequency or phase transition, as is possible in a PLL with the new phase detector, to generate the transmit modulated signal. A similar PLL circuit in the receiver will be capable of tracking the modulated signal. This may achieve a direct demodulation, without the need for a separate unit to recover the carrier signal.

C. An improved modulation may be achieved, with lower phase noise. Faster modulation may be achieved as well.

D. The VCO 3 may operate at the desired transmit frequency of a transceiver, to achieve better modulation at a lower cost. The cost may be lowered since the upconverter, the filters and the transmit LO of prior art transmitters may be eliminated altogether, with the modulating signals operating directly on a VCO at the transmit frequency.

E. A lower power consumption is achieved, as a result of the simpler structure, and the avoidance of the harmonics, transient response limitations and nonlinearities of the eliminated components.

F. The circuit in FIG. 19 can be adapted for phase modulation, by adding the modulating signal in the adder/ phase detector unit 79. The VCO 3 will generate a phase shift to balance the phase shift entered by the modulation circuit.

G. A combined phase/magnitude or frequency/magnitude modulation can be implemented as well, with the addition of a (not shown) amplitude modulator, like a mixer or attenuator in the path of signal 33.

A Novel Phase Detector

FIG. 20 details a novel phase detector that measures the phase difference between two signals V1 and V2. The two input signals are represented in digital form, in a complex format. Thus, a first signal V1 has a real part (I) 700 and an imaginary (quadrature) part (Q) 701. Thus, signal V1 is actually represented with two digital buses 700 and 701.

Similarly, a second signal V2 has a real part (I) 702 and an imaginary (quadrature) part (Q) 703, represented as two digital buses.

The present invention discloses a system and method for computing the phase difference between two signals using signal processing on digital buses representative of these signals. To illustrate the innovative novel approach, an embodiment illustrating the computation of the phase difference with processing in the complex domain will now be detailed.

It is known that:

A) a sinusoidal signal may be represented by a rotating phasor in a complex plane, with the projection of the phasor on the real axis representing the instantaneous value of the voltage. The phasor may be represented, for a specific instant in time, as M<Z>, that is a phasor of magnitude M and phase Z to the real axis, or as having a value V=A+jB where A is the real component, B is the imaginary component, and j is the unit imaginary phasor, j=√(−1) or j=SQR(−1). Thus, j is the unit imaginary component, represented as the square root of (−1).

B) The two forms are equivalent, that is A=M*cos(Z) and B=M*sin(Z). Here, A is the real component and B is the imaginary. The above are known as the polar and Cartesian representations of a phasor.

C) Two phasors, representing two different signals V1 and V2, may be multiplied either in the polar or the Cartesian form.

In polar form, assuming: V1=M1<Z1>, V2=M<Z2> then the multiplication result is:

$$V1*V2 = M1*M2<Z1+Z2>$$

That is, the resulting phasor has a magnitude that equals the multiplied values of the two phasors, and a phase that is the sum of the individual phase angles of each phasor.

In a Cartesian form, assuming V1=A+jB, V2=C+jD then the multiplication result is:

$$V1*V2 = (A+jB)*(C+jD) = (AC-BD) + j(AD+BC)$$

The resulting phasor has a real and an imaginary part.

D) Of course, a multiplication in the polar form results in a phasor that is identical to that resulting from a multiplication in Cartesian form.

According to the present invention, a novel phasor processing is performed to measure the phase difference between two signals:

$$V1 = M1 \langle wt+Z \rangle \text{ and } V2 = M2 \langle wt \rangle$$

where

V1, V2 —two phasors representing the two signals M1, M2 —the magnitude (or absolute value) of the two phasors w—the angular velocity of each phasor [rad/sec] t—time Z—the phase difference between the phasors, to be measured The signals V1, V2 do not have to be at the same frequency. A difference in frequency is expressed here as a phase difference Z that varies in time. This is the equivalent to V1=M1<w*Z1*t+Z2>, for example. The product wt is the instantaneous phase [radians] that increases continuously to generate the sinusoidal voltage on the real axis.

In this embodiment, the angular velocity of one of the phasors is reversed in phasor direction reversal means 792. Thus, phasor V2 in this example has a reversed direction of w, so that the phasor V2 rotates in the other, negative, direction in a complex plane. A possible means for reversing the direction of w is to invert the value of the imaginary component (Q) 703 of V2. This may be implemented by a computation of the 2's complement of the signal 703. This signal processing results in a phasor with components (C) 704 and (D) 705 in the complex domain.

The phasors now are $$V1 = M1 \langle wt+Z \rangle \text{ and } V2 = M2 \langle -wt \rangle$$

then the multiplication result is:

$$V1*V2 = M1*M2 \langle Z \rangle$$

The novel result is that, now, the alternating component (wt) is eliminated from the resulting phasor, and only the phase difference component (Z) will remain.

Thus, by multiplying two phasors in the complex plane, with the direction of one of them reversed, the result is indicative of the phase difference between the signals.

In the illustrated embodiment, the multiplication is actually performed in the Cartesian form, that is $$V1*V2 = (A+jB)*(C+jD) = (AC-BD) + j(AD+BC)$$

V2 is the signal at the output of unit 792

The two multipliers 793, together with the adder 795, perform the computation (AC−BD) to generate a signal 706 representative of the real component of the result, that is signal 706 = M1*M2*cos(Z) = AC−BD The two multipliers 794, together with the adder 796, perform the computation (AD+BC) to generate a signal 707 representative of the imaginary component of the result, that is signal 707 = M1*M2*sin(Z) = AD+BC Each one of the signals 706 or 707 may be used as the output of the phase detector, to close a PLL circuit.

There are various advantages to this structure, for example:

A) The phase difference result can be computed at a fast speed, that is higher than the frequency of the input signals V1, V2. A very fast phase measurement rate may be achieved.

B) The result signal 706 or 707 contains only the phase difference (Z), without other harmonics at a frequency related to w. Whereas presently used phase detectors generate various harmonics that have to be filtered out, the present phase detector generates only the desired phase difference. There remains a quantization error, that may be reduced at will or may be filtered out.

C) The phase difference takes into account both components of the input signal, that is the I and Q components, whereas presently used PLLs can only use one of these components. Using both components of the input signal, an improvement in signal to noise ratio SNR may be achieved.

D) The phase difference computation may be implemented in digital form, to achieve a stable circuit with predictable performance. This may be useful, for example, in carrier recovery systems to be detailed below. A digital circuit may be implemented in VLSI as a monolithic IC, at a low cost and taking only a small space.

E) Using large scale integration, an integrated circuit can implement all the desired functions in one IC, including the phase detector, the phase reversal unit and the results normalization unit with its normalization factor computation unit 797.

It will be recognized that this is just one embodiment of means for computing the phase difference between two signals, each represented as a digital bus. Various other embodiments of the invention are possible.

For example, the phase direction reversal unit 792 may be dispensed with, and its function being implemented with changes in the multipliers 793, 794 and/or the adders 795, 796 and/or other digital means therein.

The phase detector may operate on an analog signal V1, as detailed with reference to FIG. 21 below.

The phase detector may operate on a signal where only one component is available (for example the real component 110), as detailed with reference to FIG. 22.

Although a digital embodiment was illustrated, an analog embodiment may also be implemented, or a combined analog/digital circuit.

The circuit detailed above generates the signals 706 and 707, that are proportional to sin(Z) and cos(Z) respectively; each of these signals may be used as the phase error signal in a PLL, to replace the analog phase detector now in use, so as to achieve a higher performance PLL.

A possible disadvantage of this circuit is that the loop gain is dependent on the magnitude of the input signals M1 and M2. Thus, a change in the amplitude of one signal may change the response time of the PLL. A normalization circuit may be used to correct for this effect. The circuit in FIG. 20 includes a unit 797 and multipliers 798 and 799. The normalization factor computation unit 797 computes a multiplication factor IDZ that equals $$IDZ = 1/\mathrm{sqrt}(Zr*Zr + Zi*Zi)$$

Where Zr and Zi are the real and imaginary components of the result, that is the signals 706 and 707 respectively.

That is, the multiplication factor is the reciprocal of the magnitude (absolute value) of the phasor representing the phase error, whose real and imaginary components are the signals 706 and 707 respectively. When the signal 706 is multiplied with the factor IDZ in a multiplier 798, the resulting signal 708 equals cos(Z), that is the normalized signal 708 directly gives the phase difference Z between the signals V1 and V2.

Similarly, the signal 707 may be multiplied with the factor IDZ in a multiplier 799, the resulting signal 709 equals sin(Z), that directly gives the phase difference Z between the signals V1 and V2.

Thus, each of the normalized signals 708 or 709 may be used to indicate the phase difference between the signals V1 and V2 ; otherwise, both signals may be used to indicate the phase within a full 360 degree range. Moreover, each of the normalized signals 708 or 709 may be used to close a PLL. This results in a performance that is independent of, or less susceptible to, the amplitude of V1 and V2.

Other embodiments of the normalization means are possible, for example computing the magnitude of the phase difference from signals 706 and 707 and using divider means rather than the multipliers 798 and 799 to normalize the signals 706 and 707. The normalization may be applied to an earlier phase of the signal processing.

The order of the processing may be changed, and/or the processing may use other arithmetic operations in the complex domain on the input buses representing the signals V1 and V2, without departing from the spirit and scope of the present invention.

For example, another embodiment for the above structure uses trigonometric equations, like $$\sin(A+B)=\sin A * \cos B + \cos A * \sin B$$

The sin and cos functions are equivalent to the above real and imaginary components in the complex plane, and this analysis results in identical or similar embodiments, using multipliers and adders for example. Various embodiments may be implemented for sin(A+B), sin(A−B), cos(A+B), cos(A−B) etc.

The present invention teaches that it is possible to compute the instantaneous value of the phase difference between two signals by forming a digital bus from each of these signals and by performing arithmetic operations on these buses.

The phasor direction reversal unit 792 may not be required, if one of the input signals V1 or V2 already has a reversed direction of rotation. Such is, for example, the reference signal 1152, 1153 in FIG. 21.

The phase detector in FIG. 20 may be used to detect complex modulated signals, to include a multiphase modulation together with amplitude modulation. Outputs 706 and 707, or 708 and 709, indicate the phase, and the output of unit 797 indicates the amplitude of the received signal. If one input V1 is the received signal, and the other input V2 is a reference locked to that input, the circuit in FIG. 20 will detect any combination of phase and amplitude modulation.

Pure Frequency Translation

The system detailed in FIG. 20 may be used to generate the sum frequency (F1+F2) or the difference (F1−F2) of two input signals at F1, F2 It differs from an ordinary mixer in that only the desired sum or difference is generated, without other harmonics (except at the computing rate and its harmonics). The quantization error still occurs.

To generate a difference frequency (F1−F2), a phasor direction reversal is used on one input as detailed above. The output will not contain the input frequencies F1 and F2 or other harmonics.

To generate a sum frequency (F1+F2), a phasor direction reversal is not used on either input. The output will not contain the input frequencies F1 and F2 or other harmonics.

Mixers are used in prior art to add or subtract frequencies of signals. A problem with a mixer is that it generates both the sum and the difference frequencies. Moreover, since it is not an ideal multiplier but has an exponential characteristic, many more harmonics are generated at frequencies M*F1+−N*F2. Complex filtering may be required to attenuate the undesired frequencies. Where several mixers are used, the problem is further aggravated.

This problem is solved with the circuit detailed in FIG. 20, that only generates a signal at the desired sum or difference frequency. The maximal output frequency is determined from the speed of the components in the circuit and the fact that it should perform several computations for each output cycle. For example, to output a signal at 900 MHz with 10 samples per cycle, computations at a rate of 9 GHz are required. Novel logic components like SiGe may achieve that rate. Parallel and/or pipeline logic may be used as well.

An important advantage of the frequency translator in FIG. 20 is that it generates both components (I, Q) of the frequency sum or difference. These components may be used in subsequent stages to translate to another frequency and so on, all without additional time delays or phase shifters.

For example, one frequency translator may be used to double an input frequency, by applying the same signal V1 to both inputs of the unit. The result with two buses (I,Q) may be applied to a second stage frequency translator to double the frequency again, and so on so as to form a frequency doubling chain.

Another advantage of the frequency translator is that it is wideband. In prior art, filters were required to separate just the desired harmonic from a multitude of frequencies generated in a mixer. These filters limit the bandwidth of the prior art circuits. In the novel circuit here, no filters are required since just one frequency is generated. As long as both components (I,Q) of each signal are present, the circuit will operate OK. The bandwidth of the phase shifter that generates the quadrature signal may be a limit.

In another embodiment, the signal processing in FIG. 20 may be implemented with analog elements on analog signals. This may facilitate operation at still higher frequencies.

New Frequency Translation Component

A new component is disclosed that can replace the ubiquitous mixer or multiplier. The new component only outputs the desired sum or difference frequency, without other harmonics. A preferred embodiment of this component includes the multipliers 793 and the adder 795 of FIG. 20, in digital form. Optionally the phasor reversal unit 792 may be included as well. If only one component 700, 702 of the input signal is available, then a phase shifter/time delay means may be included to generate the other, or quadrature, component of the signal.

Alternately, an analog embodiment may be implemented, using analog multipliers and adders.

A frequency doubler component may be implemented with the above structure, only there is just one input V1 that is connected to both inputs of the device.

Digital Bus Formation

A digital bus may be formed in various ways, for example:

A. Use a signal that has N times the desired frequency F and divide it by N, taking the parallel output of the dividing means. FIG. 2 illustrates this approach, with a VCO 3 at N times the reference frequency and a dividing by N counter 4.

B. Use a signal that has N times the desired frequency F and create a parallel bus by adding a fixed amount to the bus, to achieve in effect a bus with a time period corresponding to the desired frequency F. FIG. 17 illustrates this approach, with adder 48 adding a constant 742 to the bus 740 for each clock 749 at a multiple of the desired frequency.

C. Use a virtual bus, that does not exist physically but is understood to exist and to change a specific amount 742 for each clock 749 at a multiple of the desired frequency. The output bus 623 changes as if there were a bus that changed by that amount. Actually there is only the clock 749 indicating that such a change in the bus should take place. See disclosure with reference to FIG. 18.

D. Use an ADC to transform an analog signal to a digital bus, as illustrated in FIG. 21.

E. Use a signal that has N times the desired frequency F and divide it by N; use the parallel output of the counter to access a table with sine/cos values, see FIG. 21.

Figure 21:
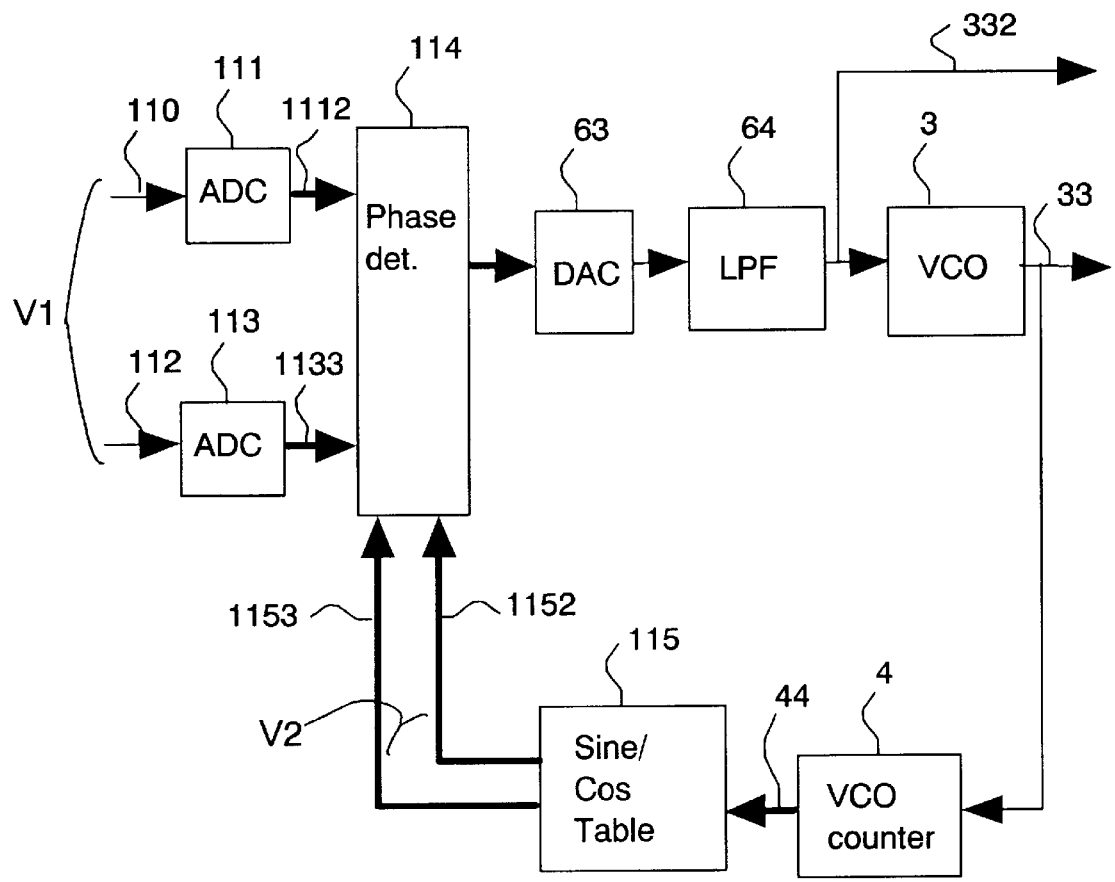
FIG. 21 details a PLL for receiver, with complex signal processing

FIG. 21 details a PLL usable as a modem or receiver, with complex (R,I) signal processing using the phase detector detailed in FIG. 20.

A novel feature in this PLL is that it operates on complex signals, whereas PLLs in the art only operate on real signals. The new PLL has at the input of the phase detector 114 two signals V1 and V2, with each of these signals having a real and an imaginary component.

Another novel feature is that the phase detector 114 operates on sinusoidal voltages to compute a phase difference. The phase detector 62 in PLLs detailed above (for example FIG. 2) operate on signals indicative of the phase, that increase linearly with time (see FIGS. 3A–3C). Such a sawtooth signal cannot be directly compared with a real life, sinusoidal input voltage. The novel PLL detailed in FIG. 21 can operate on sinusoidal inputs, while performing a plurality of phase measurements during each cycle of that sinusoid.

The input signal V1 includes a real component (Q) 110 and a quadrature (imaginary) component (I) 112. The two components of the signal are transformed in ADCs 111 and 113 to digital real component 1112 and digital quadrature component 1133 respectively. These digital components are processed in the complex digital phase detector 114 to generate the digital phase difference bus. The phase detector 114 may have a structure and operation as detailed in FIG. 20, where the inputs were V1 and V2 and the output either one of the signals 706, 707, 708 or 709.

The reference bus V2 (FIG. 21) for the phase detector 114 may be generated as follows: The VCO 3 operates at a frequency N times the frequency of the input signal V1 (110 and 112). Counter 4 divides the VCO output 33 by N, to generate the bus 44. A look-up table 115 includes a sine table, that outputs a bus 1152. For inputs 0 to (N-1) on bus 44, unit 115 outputs digital words corresponding to a complete cycle of a sine wave on bus 1152. A second table in unit 115 outputs, at the same time, words from a cosine table on bus 1153. For inputs 0 to (N-1) on bus 44, unit 115 outputs digital words corresponding to a complete cycle of a cosine wave on bus 1153.

Thus, counter 4 with unit 115 generate a complex bus with a real component bus 1152 and an imaginary component bus 1153. This bus forms the reference bus to unit 114, to allow the phase difference measurement. Preferably, the phasor bus generated in unit 115 has a reversed direction of rotation. This may be easily accomplished, since the table in unit 115 can generate a sine and cosine signals with any relative polarity therebetween, to represent a phasor rotating in any desired direction.

In this case, there is no need for a phasor direction reversal unit in phase detector 114.

The phase lock loop is closed by applying the phase difference (phase error) out of unit 114 to DAC 63, then to LPF 64 and VCO 3.

The output 33 tracks the input signal 110 and 112, however it is at a multiple of that input frequency. The bus 44, 1152 or 1153 may be used as the PLL output at the input frequency.

The PLL illustrated in FIG. 21 can track an input signal of a variable frequency (for example with FM modulation, or with fast phase deviations because of waves propagation). The output 332 is indicative of the changes in the frequency/phase of the input signal, and may be used as a detected signal (baseband).

Although only one output bus of the phase detector 114 is used (either the real or imaginary component), the phase is derived from both components 110, 112 of the input signal, to achieve a better signal to noise ratio. The PLL will be able to better track a signal in noise.

It is possible to use two loops, to control two VCOs, each with one of the outputs of unit 114, to generate two signals at quadrature phase.

Figure 22:
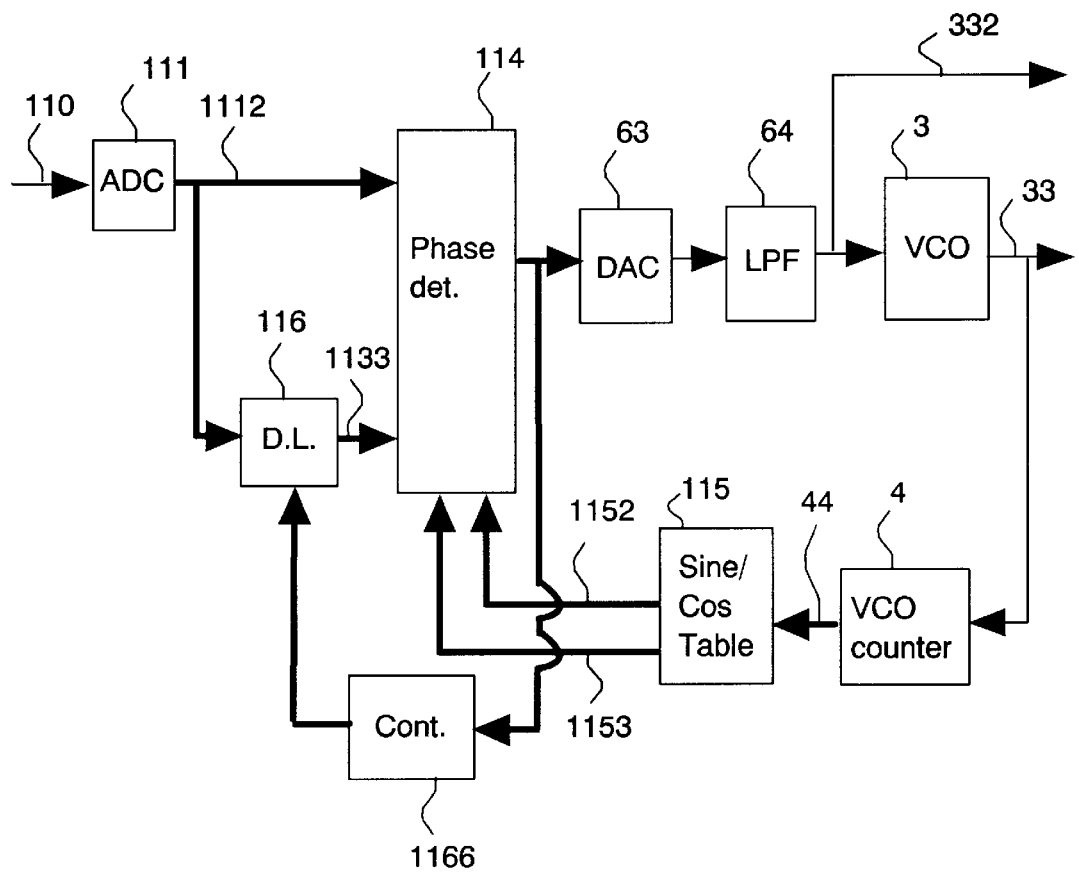
FIG. 22 details another embodiment of PLL for receiver

FIG. 22 details a PLL usable for a receiver or a modem, where there is only a real input signal 110 available. This is the case in a modem connected to a phone line, for example. In this case, the signal 110 may be converted to a digital bus 1112 (real component) in ADC 111. The other, quadrature component 1133 is formed with the delay line means 116 that delay the signal by 90 degrees.

The signals are processed in a complex digital phase detector 114, using reference signals 1152 and 1153 generated in a complex VCO signals generator 115.

The phase difference out of unit 114 is transferred to DAC 63, then to LPF 64 and the VCO 3 to close the loop. The loop generates the output signal 33 and the data/clock baseband out 332.

The VCO counter 4 generates the bus 44 used in the sine/cos table 115 to generate the reference signals 1152 and 1153.

The delay line unit 116 implements a time delay that corresponds to a 90 degrees of phase shift of the input signal 110. A possible problem is that, for various values of input frequency, a different time delay is required in unit 116 to achieve the desired phase shift. A possible solution is the use of a controller 1166 that measures the phase difference out of unit 114 that is indicative of the frequency, and changes the time delay in unit 116 accordingly. Various means may be implemented for measuring the actual input frequency and for changing the time delay in unit 116 accordingly.

In another embodiment, other means may be used to measure the actual, instantaneous frequency of VCO 3, for example analog means to measure the input voltage to the VCO or discriminator means to measure the frequency at output 33.

If the frequency of the input signal 110 is fixed or there is just a small amount of change in frequency, then controller 1166 may be eliminated and unit 116 be set to a fixed time delay.

A Low Phase Noise Frequency Synthesizer

A problem in prior art synthesizers is the selection of the reference frequency Fref. A high frequency is required in order to decrease the multiplication factor N=Fout/Fref. It is known that the phase noise at the output 33 is 20log(N) higher (in dB) than the phase noise of the reference.

On the other hand, a higher frequency crystal oscillator reference may have higher close-in phase noise (at frequencies close to the carrier). Therefore, a low frequency reference is recommended, in the 1 to 10 MHz range for example.

The novel PLL structure detailed in FIG. 22 can be used in a synthesizer that achieves both a low frequency reference and a low multiplication factor N.

In this structure, a low frequency oscillator (not shown) generates the sinusoidal signal 110 that is input to the PLL. Usually, crystal oscillators with a sine output have better phase noise performance than those with a square wave output. IF a square wave oscillator is used, a low pass- or a band pass filter will pass only a sine wave 110.

Now, the PLL can measure the phase difference between VCO 3 and the reference signal 110 at a rate higher than the reference frequency. This differs from PLLs in the art, that can only measure the phase difference at the rate of Fref or lower. If NT phase measurements are performed in one cycle of the reference signal 110, then the multiplication factor N will be $$N = Fout/(Fref * NT)$$

For example, if the output frequency of signal 33 is 900 MHz and that of the reference signal 110 is 10 MHz, with 10 phase measurements per cycle of the reference, the multiplication factor N will be $$N = 900/(10*10) = 9$$

Thus, a 20 dB improvement in phase noise is achieved in this example, with respect to a synthesizer that performs just one measurement per cycle. A still lower frequency reference may be used, with much more measurements per reference cycle, to achieve a still lower phase noise.

Therefore, the structure in FIG. 22 may be advantageously used to achieve a frequency synthesizer having improved phase noise, while using a lower frequency reference.

Figure 23:
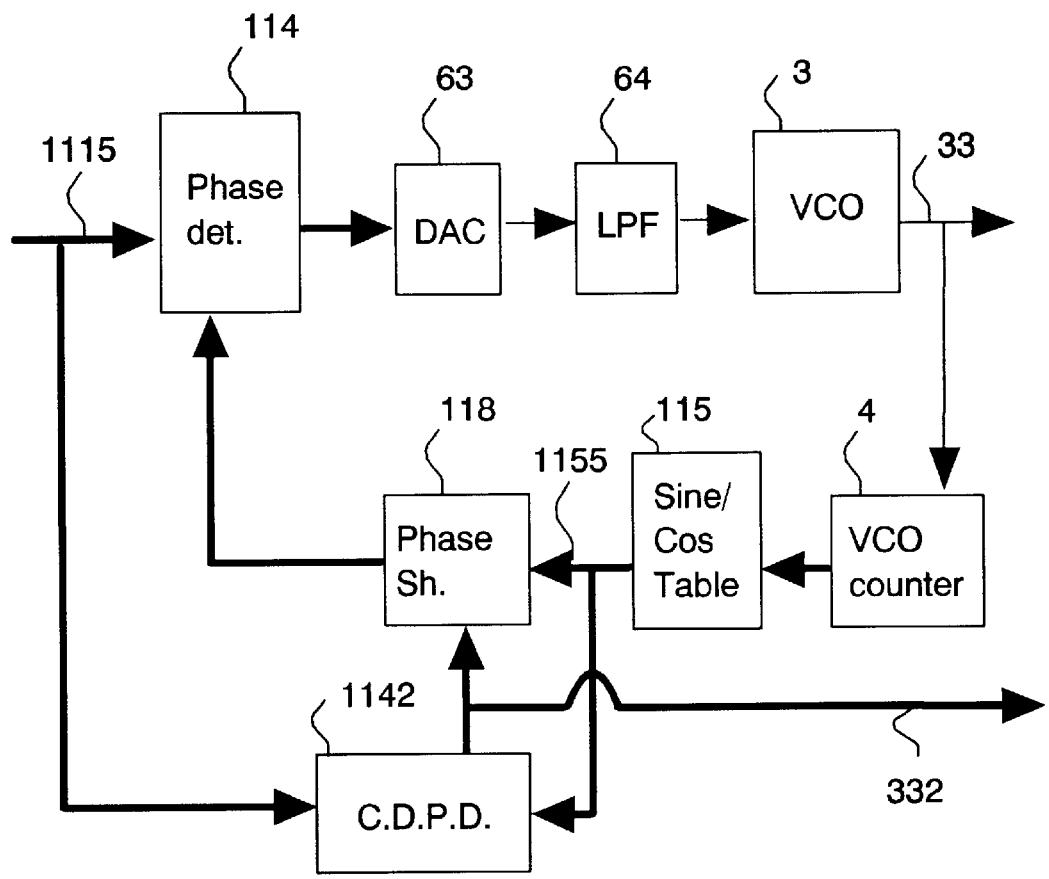
FIG. 23 illustrates a carrier recovery loop (Type 1)

FIG. 23 illustrates an improved carrier recovery loop with digital phase detectors (here indicated as Type 1). The circuit may be used for carrier recovery in suppressed carrier transmissions, like BPSK or QPSK for example. The circuit assumes an input signal in digital complex form 1115, including a real component and a quadrature component, that may be formed as detailed in FIGS. 21 and 22.

A complex digital phase detector 114 measures the phase difference between the input signal 1115 and the reference signal 1155 generated in a complex VCO signals generator 115. Since the input signal 1115 is suppressed carrier having a suitable phase modulation, the loop cannot be directly closed with the phase difference measured as in a regular loop. A phase shifter means 118 changes the phase of the reference 1155 to correspond to phase changes in the input signal 1115, to generate a phase error bus with the effects of the phase modulation removed (to achieve an unmodulated CW signal).

This phase error bus may now be used to close the PLL loop, it being applied to the DAC 63, thence to LPF 64 and VCO 3. Output 33 is the recovered carrier signal.

As in FIG. 22, a VCO counter 4 with a sine/cos table unit 115 generate the complex reference signal 1155 in digital form, that comprises two buses (the real and imaginary components).

A complex digital phase detector 1142 (CDPD) measures the instantaneous phase of the input signal. Its inputs are the input signal 1115 and the complex reference signal 1155. The output of the unit 1142 is used to control unit 118, to shift the phase of the reference signal 1155 prior to the phase comparison in unit 114 as detailed above. Phase detector 1142 may detect biphase signals or multiphase modulation. It will control the phase shifter 118 to perform the required phase change to remove that modulation, be it a 180 degrees shift, a 90 degrees shift or any other value.

Unit 118 may be implemented with arithmetic components to perform computations in the complex to achieve the desired phase shift.

In another embodiment, two sin/cos tables are implemented (not shown): the table 115 is used with unit 1142 to measure the phase modulation in the input signal 1115. A second sin/cos table, also derives its output from the output bus of counter 4, however a constant is added to that bus according to the output of unit 1142; that constant is indicative of the measured phase shift in the input signal, and is used to generate in the second table a shifted version of signal 1155.

That shifted version has the same phase modulation as the input signal 1115, so that the phase detector 114 will only detect the phase difference between two unmodulated carriers. This allows to close the loop to keep the VCO 3 at the recovered carrier frequency. In effect, the second sin/cos table with the adder that adds a constant to the bus from counter 4, together implement the function of the phase shifter 118 in FIG. 23.

Functionally, there is a similarity between this circuit and the Costas loop used in prior art for carrier recovery. The Costas uses two loops, a first loop to measure the phase difference between an input signal and a VCO signal, and a second loop to phase-track the input signal, with the phase measured in the first loop being used to correct the error in the second loop so as to allow it to lock as a regular PLL. The similarity, however, ends here, for example:

A. Whereas Costas uses two mixers or multipliers to measure the phase difference in the two loops, the present invention uses digital phase detectors 114 and 1142 to measure the phase difference.

B. Whereas Costas uses analog signals with only the real component of the input signal, the present invention uses digital buses that represent the signal in complex form (real, imaginary) to achieve improved performance.

C. Whereas Costas has a slow phase measurement and requires LPF to remove undesired harmonics, the present invention uses digital processing to compute the instantaneous phase that has no harmonics and that may be applied immediately, without a LPF.

D. Costas structure with two loops is only usable for a biphase modulated signal BPSK. For QPSK or other multiphase modulations, a much more complicated structure is required, with more loops, more multipliers and filters etc. The novel structure may be used for any multiphase modulation, since unit 1142 outputs a bus with the measured phase difference, to allow any of a plurality of phase shift values to be applied to the reference signal (bus).

E. Whereas Costas outputs the recovered carrier, the novel structure outputs the recovered carrier as output 33 and the modulated phase value on output 332. This applies for biphase or multiphase modulation.

Since the phase modulation is measured anyway, it may be output as well, to save the separate demodulator that is used in prior art receivers.

Figure 24:
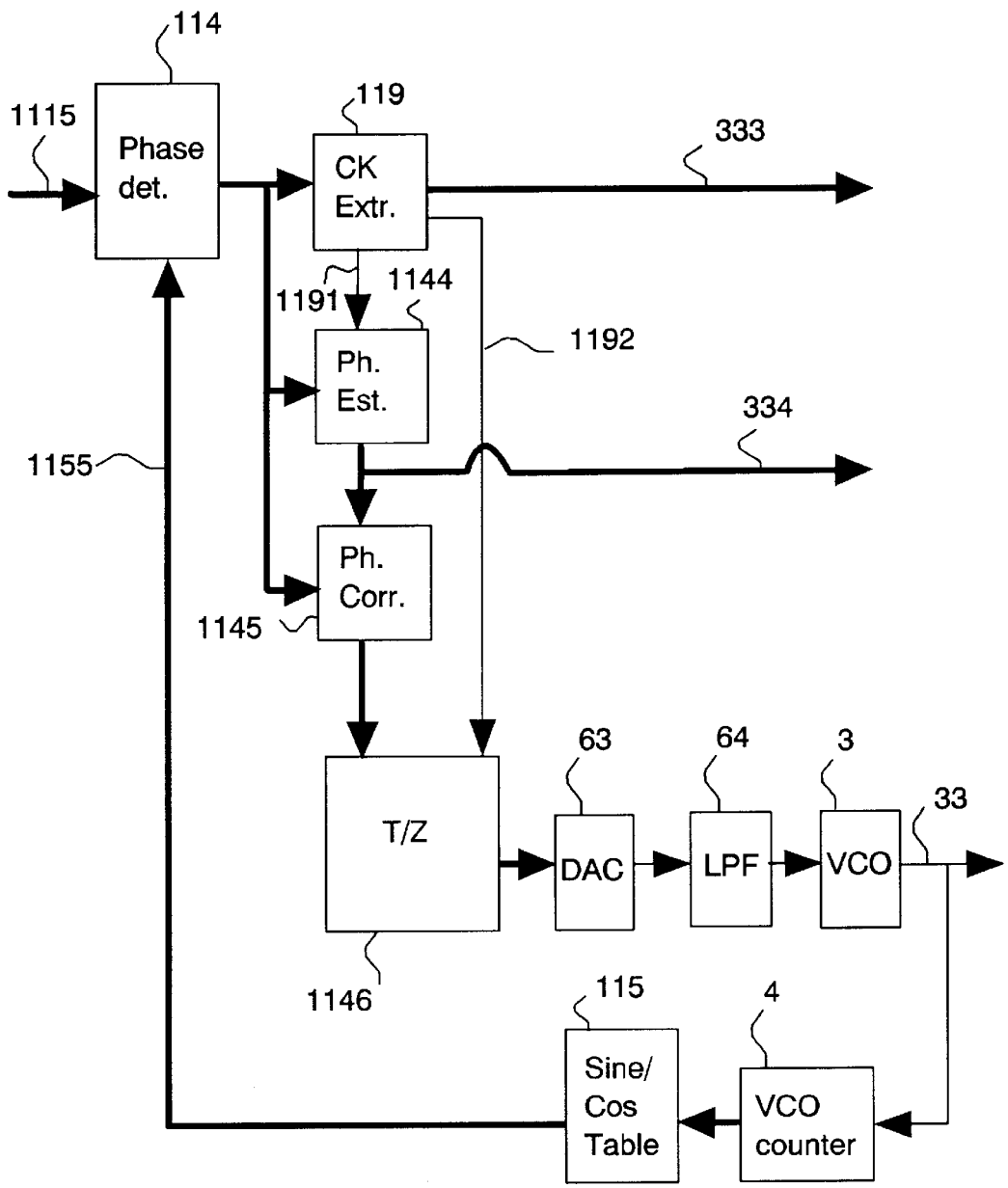
FIG. 24 illustrates a carrier recovery loop (Type 2)

FIG. 24 details an improved carrier recovery loop (Type 2). It may be used in suppressed carrier modulation of an input signal in digital complex form 1115. Signal 1115 includes a real component and a quadrature component bus as detailed above. A complex digital phase detector 114 measures the phase difference between signal 1115 and a VCO phasor in digital complex form 1155, including a real component and a quadrature component as well. Unit 114 may be implemented as detailed with respect to FIG. 20

First the timing of the phase modulation is extracted using clock extractor 119. Unit 119 may be based on detected phase changes, that must occur each interval TPH or a multiple thereof. The time period TPH for the transmission of each sample or phase value is known in each system, only its phase in the receiver is not known. Thus, unit 119 detects the precise timing of the clock that govern the phase changes.

This may be simple to implement, even prior to phase lock-on: assuming that the frequency of the VCO 3 is slightly different than that in locked state, the output of unit 114 will include a zero or slowly changing signal (during each sample), with a step change each time period TPH (this is the transition to another sample). Using these steep transitions, it is possible to find the precise timing of the clock. The recovered clock is output as signal 333, to be used for subsequent signal processing.

The recovered clock governs the operation of the whole circuit, as follows: During a first part of the clock period, an enable signal 1191 is applied to phase estimation unit 1144, to measure the phase of the input signal 1115 for that clock period. During a second part of the clock period, an enable signal 1192 will allow closure of the phase lock loop that tracks the carrier of the received signal.

For each clock period of the modulated received signal 1115, unit 119 will thus alternately activate, first the phase estimation unit 1144 and second the phase lock loop including the DAC 63, LPF 64 and VCO 3.

During the first part of the clock period, the phase of the input signal for that period will be measured in unit 1144. Unit 1144 will then output the value of that phase to phase correction unit 1145, to remove the effect of the modulation. During the second part of the clock period, the track/zero T/Z unit 1146 will pass the phase error measured in unit 114 to the DAC 63, to close the phase lock loop.

During that second part of the clock period, the phase error from unit 114 is corrected in unit 1145 to remove the effect of the phase modulation in the transmitter, so that the phase lock loop will lock on an unmodulated signal.

A track/zero unit is used to allow for several measurements of the phase error during the second part of the clock 333. If a track/hold unit were used, the last measurement would have been given too large a weight in the averaging in LPF 64. In a T/Z unit, all the active measurements are given an equal weight, these being averaged with a zero value during the hold, or first part of the clock 333.

Unit 119 may generate two signals, for each clock interval: an early gate T1 1191 for phase estimation, and a late gate T2 1192 for carrier phase lock, using a corrected value of the phase error from unit 114.

The phase estimation unit 1144 may use phase error samples or a running window average with weights to estimate the phase for each clock interval. Its output is the estimated phase relative to a CW carrier, or the phase difference relative to the previous clock interval. This is the output 334, indicative of the phase modulation in the input signal 1115.

The phase corrector unit 1145 receives a phase error from the phase detector 114, and will correct it according to the modulation detected in phase estimation unit 1144, to return to that of unmodulated CW. If biphase—it will reverse the phase if necessary. If multiphase modulation—it will implement an inverse phase shift, to cancel that of the modulated signal.

The VCO counter 4 and the complex VCO signals generator 115 will generate the VCO phasor in digital complex form 1155, as detailed in FIG. 23.

The phase detectors 114 and 1144 may use the complex phase detector detailed in FIG. 20. The clock extractor 119 may be implemented with a PLL set for the clock frequency, and having a zero or a very small phase error (including an integrator or a high gain amplifier in the loop).

The phase correction unit 1145 may be implemented with arithmetic operations in the complex plane. Alternately, a phase correction unit may be placed in the feedback path, after the counter 4.

The output 33 is the recovered carrier.

Moreover, the novel circuit outputs the demodulated signal (phase value of received signal) on output 334. This applies for biphase or multiphase modulation. This saves the need for a separate demodulator that is used in prior art receivers.

The circuit also outputs the recovered clock on output 333. This saves the need for a special-purpose, clock recovery circuit that is used in prior art receivers. This circuit is required to synchronize the timing of reading each bit in the received, demodulated baseband signal.

Figure 25:
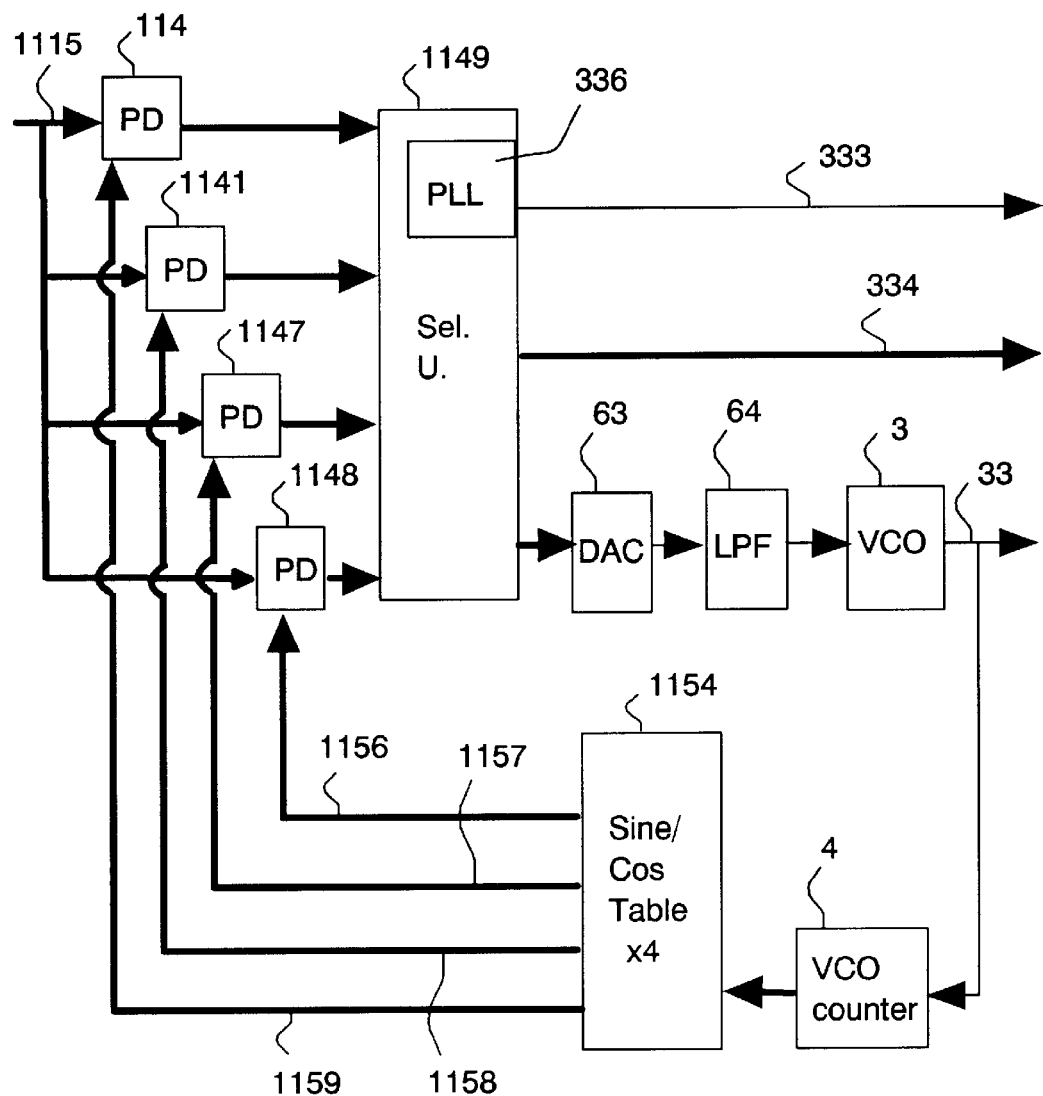
FIG. 25 illustrates a carrier recovery loop (Type 3)

FIG. 25 details another embodiment of an improved carrier recovery loop (Type 3). It may be used in suppressed carrier modulation of an input signal in digital complex form 1115. Signal 1115 includes a real component and a quadrature component. A complex digital phase detector is used for each possible phase of the input signal 1115. Thus, four phase detectors 114, 1141, 1147 and 1148 are used for a quadriphase modulated QPSM input signal. Two detectors would be used for a biphase signal, etc.

Each phase detector is supplied a different phase of the reference signal. In this example, counter 4 activates a sine/cos table 1154 with four separate outputs 1156, 1157, 1158 and 1159. Each output is a complex bus with two component buses. Moreover, there is a 90 degree phase shift between these outputs. Thus VCO first phasor in digital complex form 1156, includes a real component and a quadrature component, at a 0 degrees phase.

The second phasor 1157, is at a 90 degrees phase, the third phasor 1158 has a 180 degrees phase and the phasor 1159 has a 270 degrees phase.

For an M-phase modulation, there will be M outputs that are at equal angular difference therebetween over a full circle.

The basic assumption here is that the smallest phase error is the right value to close the loop. The phase lock loop includes the DAC 63, LPF 64 and VCO 3. Preferably, the loop will include an integrator, for example in the LPF 64, to implement a zero-phase-error loop. While locked, the phase error input to DAC 63 should be zero or close to zero.

For any given instant, the selector unit 1149 will compare the phase errors out of all the phase detectors PD 114, 1141, 1147 and 1148 and will choose the smallest valve output to be output to DAC 63.

The circuit generates the recovered carrier out 33 as well as the clock out 333 and the demodulated data out 334. The data 334 is indicated in the selection of unit 1149 of one of the PDs. For example, the output will be 00 if PD 114 was selected, 01 if PD 1141 was selected, etc.

Thus, the novel circuit saves the need for a separate demodulator that is used in prior art receivers. It also saves the need for a special-purpose, clock recovery circuit that is used in prior art receivers. A higher performance is thus achieved, together with savings in hardware that achieve a lower cost and lower power consumption for the wireless system.

Preferably, unit 1149 will not change its selection of a PD at any time, but only when a change in phase is expected, that is at multiples of a clock period TPH. One reason is that a narrow pulse interference may disrupt the operation of unit 1149. Another reason is that a decision in unit 1149 may take into account several measurements in each PD. For example, during one clock period, unit 1149 may compute the average over hundreds or thousands of samples of each PD output. At the end of each clock interval, these averages may be compared to achieve a reliable decision. The chosen average may then be applied as the phase error to the DAC 63, for the duration of the next clock period.

To implement the above processing, the precise timing of the clock may be extracted, for example with a PLL 336 in unit 1149. PLL 336 may receive a trigger or pulse each time the unit 1149 switches to another PD, for example. Otherwise the PLL 336 may lock to the signal output from one of the phase detectors. The decision of unit 1149 may be then timed to the period of the clock thus extracted.

In a practical implementation, there may be partial results that are common to the various phase detectors 114, 1141, 1147 and 1148. These values may be computed just once, for a more effective computation. All the phase detectors may be implemented in one arithmetic unit, in either software or hardware, or a combination of both. The above considerations apply for the various embodiments throughout the present disclosure, for example with reference to FIGS. 20 to 24.

In another implementation of unit 1149, the chosen value is not zero, but another chosen value. Once a detector was chosen as the right one, unit 1149 will later chose the detector that now has the value most similar to that of the previously chosen one.

Figure 26:
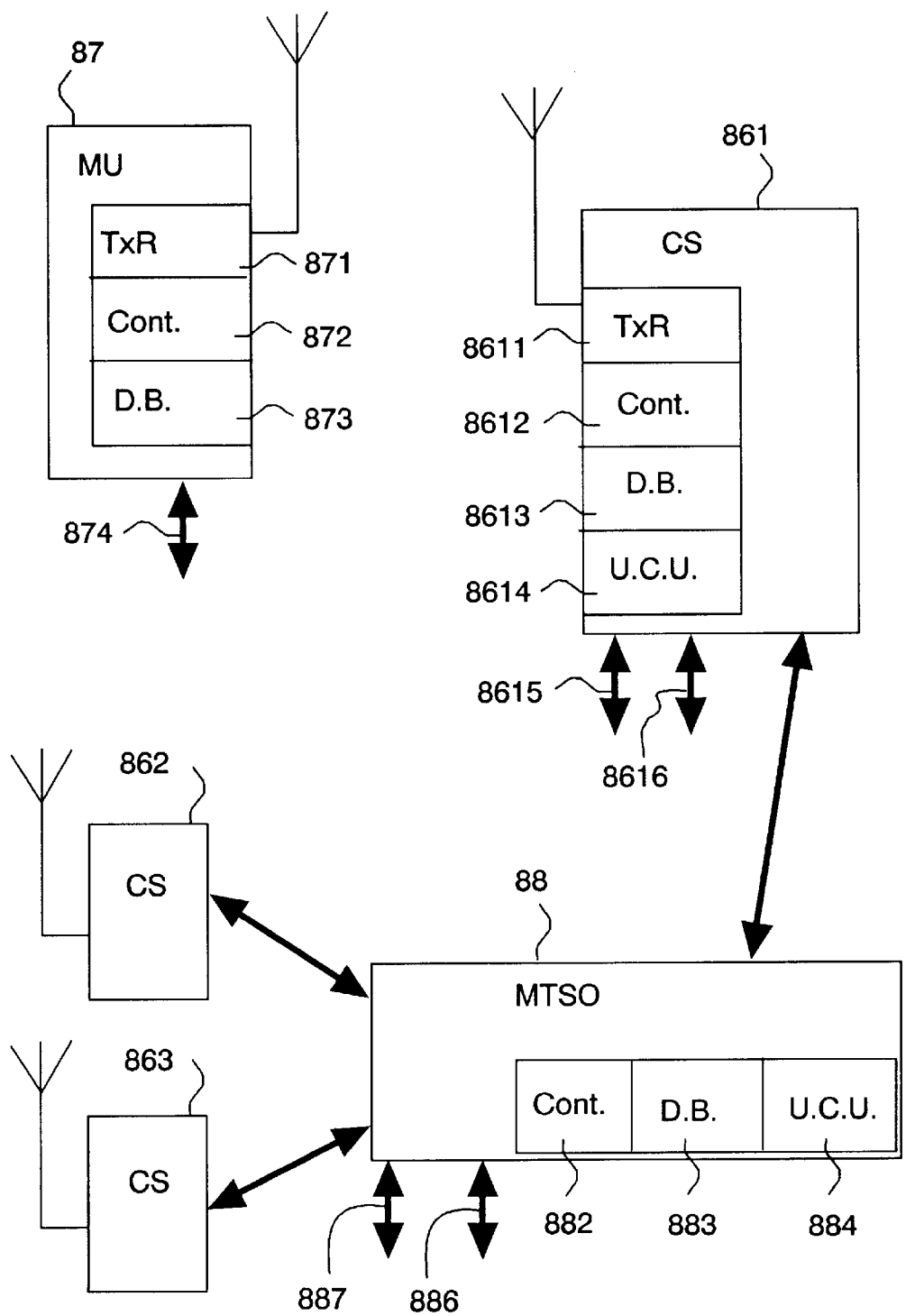
FIG. 26 details a cellular base stations with enhanced services to user

At the system level, FIG. 26 details a cellular system with enhanced services to users. The user has a mobile wireless transceiver 87 (mobile telephone unit) that includes a transmitter/receiver TxR 871 and an interface to user 874. The user enters information desired in a database unit 873, that may include for example questions relating to traffic conditions in the area, recommended hotels or restaurants, requests for guidance or other information the user may desire to present to the system. The information is entered, displayed, edited and/or transmitted under the coordination of a controller 872.

The fixed system includes the base stations 861, 862, 863 (cell sites). A cell site 861 may include a transmitter/receiver TxR 8611, a controller 8612 and a database unit 8613 containing advice and/or advertising information, with rules as to when to present each. The rules may be presented using, for example, artificial intelligence structure.

A user characterization unit 8614, contains user-related information for each user now in that cell. The information may include data received from the user's database 873 as well as information derived from the cellular system: the present location of the user, their movement (past location in adjacent cells, measured Doppler indicative of radial movement and received power indicative of distance from a cell site).

The controller 8612 uses the information on each user and the information in the database to provide the user with relevant advice and/or to present him/her with focused advertising, that is advertising relevant for that location/cell. The focused advertising may take additional factors into account, for example the time of the inquiry (or the time a user enters a cell), the date, special days like holidays etc.

An interface to operator 8615 may be used for manual interventions as necessary. An Internet link 8616 may be used to provide additional services as desired. The Internet services are adapted to suit the known location of the user. A local Internet link 8616 may reduce the amount of traffic with the MTSO 88.

A mobile telephone switching office 88 (MTSO) includes a controller 882, a database unit 883 including advice and/or advertising information, with rules as to when to present each, for example, artificial intelligence structure. A user characterization unit 884 may replace or complement the UCU 8614 in the cell sites, to contain user-related information for each user now in the group of controlled cells. An Internet link 886 may be used to supply additional services. A link to telephone network 887 is used to access the network.

The above system may provide emergency services like medical help if needed, and using the known location of the caller from the cellular system. The system may connect a user to a third party that is geographically close to him/her, again integrating the information processing with the location information available.

It will be recognized that the foregoing is but one example of an apparatus and method within the scope of the present invention and that various modifications will occur to those skilled in the art upon reading the disclosure set forth hereinbefore.

What is claimed is:

1. A system for measuring a phase difference between two input signals, comprising computer means performing computations in the complex domain and operating on two complex signals indicative of the two input signals respectively to compute the phase difference.

2. The system according to claim 1, wherein each of the complex signals includes a real and an imaginary component to represent a phasor indicative of one of the two input signals.

3. The system according to claim 2, further including means for generating at least one of the two complex signals from analog or single-bit digital signals that form at least one of the two input signals.

4. The system according to claim 1, wherein the computer means includes means for reversing the direction of one of the phasors corresponding to one of the two complex signals to generate a modified phasor, and means for multiplying the modified phasors with the other complex signal, and wherein the multiplying means include means for performing a phasors multiplication in the complex domain.

5. The system according to claim 1, wherein at least one of the two complex signals is represented as a bus comprising at least two digital bits.

6. The system according to claim 1, wherein at least one of the two complex signals is represented as a pair of buses, with each bus comprising at least two digital bits.

7. The system according to claim 1, further including analog to digital converter means for generating one of the two complex signals responsive to an analog input signal being applied to an input of the converter means.

8. The system according to claim 1, wherein the computer means generates a signal indicative of the phase difference, as a result of its computing the phase difference.

9. The system according to claim 1, further including a voltage-controlled oscillator (VCO) and digital means that together form a phase-lock loop, wherein a signal indicative of the phase difference that is generated in the phase measurement system is applied to a VCO input to control its frequency, wherein the digital means generate a digital signal responsive to an output of the VCO being applied to its input, and wherein the digital signal is applied as one of the two complex signals to the phase difference measuring system.

10. The system according to claim 9, wherein the digital signal is a complex signal comprising a real bus and a quadrature bus.

11. The system according to claim 9, wherein the digital means further include digital counter means for dividing a frequency of the VCO so as to generate the digital signal output responsive to that division, and wherein the digital signal output has a time period that is a multiple of a VCO time period.

12. A system for measuring a phase difference between a first and second input signals, comprising computer means operating on a first and second input buses indicative of the first and second input signals respectively to generate a signal indicative of the phase difference, and wherein:

A. each input bus comprises at least two digital bits;

B. the two input buses are indicative of the phase of the two input signals respectively, and wherein the computer means perform a subtraction or an addition between these bus values; and C. the two input buses each has a different range of possible values and wherein the computer means further include means for normalizing at least one of the buses so as to bring the two buses to the same range.

13. The system according to claim 12, further including a voltage-controlled oscillator VCO and digital means that together form a phase-lock loop, wherein the signal indicative of the phase difference is applied to a VCO input to control its frequency, wherein the digital means generate a digital signal responsive to an output of the VCO being applied to its input, and wherein the digital signal is applied as the second input bus to the phase difference measuring system.

14. The system according to claim 13, wherein the digital means further include digital counter means for dividing a frequency of the VCO so as to generate the digital signal output responsive to that division, and wherein the digital signal output has a time period that is a multiple of a VCO time period.

15. A system for measuring a phase difference between a first and a second input signals, comprising computer means operating on first and second input buses indicative of the first and second input signals respectively to generate a signal indicative of the phase difference, wherein each input bus comprises at least two digital bits, further including means for generating at least one of the two input buses from analog or single-bit digital signals that form at least one of the two input signals, wherein each of the input buses is synchronized to its corresponding input signal, and wherein the computer means uses asynchronous means to generate the signal indicative of the phase difference.

16. The system according to claim 15, further including a voltage-controlled oscillator VCO and digital means that together form a phase-lock loop, wherein the signal indicative of the phase difference is applied to a VCO input to control its frequency, wherein the digital means generate a digital signal responsive to an output of the VCO being applied to its input, and wherein the digital signal is applied as the second input bus to the phase difference measuring system.

17. A system for measuring a phase difference between two input signals, comprising computer means operating on two input buses indicative of the two input signals respectively to generate a signal indicative of the phase difference, wherein each input bus comprises at least two digital bits, wherein the computer means include means for performing computations in the complex domain and wherein the two input buses includes each a bus pair with a real and an imaginary component.

18. The system according to claim 17, further including a voltage-controlled oscillator VCO and digital means that together form a phase-lock loop, wherein the signal indicative of the phase difference is applied to a VCO input to control its frequency, wherein the digital means generate a digital signal responsive to an output of the VCO being applied to its input, and wherein the digital signal is applied as one of the two input buses to the phase difference measuring system.

19. A phase lock loop (PLL) comprising a VCO and a phase detector, wherein the phase detector comprises means for generating a signal indicative of a phase difference between a PLL input signal and a VCO output, wherein the signal indicative of the phase difference is applied to a VCO input to control its frequency, wherein the phase detector further includes computer means operating on two input buses indicative of the PLL input signal and the VCO output respectively to generate the signal indicative of the phase difference, wherein the phase detector further includes computer means performing computations in the complex domain and operating on its two input buses, wherein each of the input buses is a complex signal, and wherein the phase detector further includes means for computing the signal indicative of the phase difference from only one value of each of its two inputs.

20. A phase lock loop (PLL) comprising a VCO, a phase detector and means for carrier recovery in a suppressed carrier modulated signal, wherein the phase detector comprises means for generating a signal indicative of a phase difference between its first and second input buses, wherein the first input bus is responsive to a PLL input signal and the second bus is responsive to a VCO output, wherein the signal indicative of the phase difference is applied to a VCO input to control its frequency, wherein the phase detector further includes means for computing the signal indicative of the phase difference from only one value of each of its two input buses, and wherein the carrier recovery means comprise means for measuring a phase modulation of the PLL input signal and for correcting the phase of either the first or second input buses so as to cancel or minimize the effect of the phase modulation on the signal indicative of the phase difference.

* * * * *